United States Patent
Asakawa et al.

(10) Patent No.: US 12,007,688 B2
(45) Date of Patent: Jun. 11, 2024

(54) ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND RESIN

(71) Applicant: FUJIFILM Corporation, Tokyo (JP)

(72) Inventors: Daisuke Asakawa, Shizuoka (JP); Akiyoshi Goto, Shizuoka (JP); Masafumi Kojima, Shizuoka (JP); Takashi Kawashima, Shizuoka (JP); Yasufumi Oishi, Shizuoka (JP); Keita Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 734 days.

(21) Appl. No.: 16/953,305

(22) Filed: Nov. 19, 2020

(65) Prior Publication Data
US 2021/0072642 A1 Mar. 11, 2021

Related U.S. Application Data

(63) Continuation of application No. PCT/JP2019/019333, filed on May 15, 2019.

(30) Foreign Application Priority Data

Jul. 6, 2018 (JP) .................. 2018-128916

(51) Int. Cl.
| | | |
|---|---|---|
| G03F 7/039 | (2006.01) | |
| C08F 20/18 | (2006.01) | |
| C08F 26/06 | (2006.01) | |
| G03F 7/038 | (2006.01) | |

(52) U.S. Cl.
CPC .............. *G03F 7/039* (2013.01); *C08F 20/18* (2013.01); *C08F 26/06* (2013.01); *G03F 7/038* (2013.01)

(58) Field of Classification Search
None
See application file for complete search history.

(56) References Cited

U.S. PATENT DOCUMENTS

| | | |
|---|---|---|
| 6,927,011 B2 | 8/2005 | Fujiwara et al. |
| 2008/0248427 A1 | 10/2008 | Thiyagarajan et al. |

| | | | |
|---|---|---|---|
| 2017/0031243 A1* | 2/2017 | Hatakeyama | ......... G03F 7/0046 |
| 2020/0050106 A1 | 2/2020 | Shirakawa et al. | |
| 2020/0393762 A1* | 12/2020 | Ogawa | .............. C08F 220/1806 |

FOREIGN PATENT DOCUMENTS

| | | | | |
|---|---|---|---|---|
| JP | 2003122012 | 4/2003 | | |
| JP | 2017058421 | 3/2017 | | |
| TW | 526389 | 4/2003 | | |
| TW | 201405249 | 2/2014 | | |
| WO | 2013047536 | 4/2013 | | |
| WO | WO-2013047536 A1 * | 4/2013 | ........... | G03F 7/0045 |
| WO | 2014017144 | 1/2014 | | |
| WO | WO-2014017144 A1 * | 1/2014 | ........... | G03F 7/0397 |
| WO | 2015083744 | 6/2015 | | |
| WO | 2018193954 | 10/2018 | | |

OTHER PUBLICATIONS

English Machine Translation for WO2014017144A1 (Year: 2014).*
English Machine Translation of Ikeda (WO2013047536A1) (Year: 2013).*
"International Search Report (Form PCT/ISA/210) of PCT/JP2019/019333," mailed on Jul. 30, 2019, with English translation thereof, pp. 1-4.
"Written Opinion of the International Searching Authority (Form PCT/ISA/237) of PCT/ JP2019/019333," mailed on Jul. 30, 2019, with English translation thereof, pp. 1-8.
Office Action of Korean Counterpart Application, with English translation thereof, issued on Aug. 2, 2022, pp. 1-10.
"Office Action of Taiwan Counterpart Application", issued on Feb. 17, 2023, with partial English translation thereof, p. 1-p. 19.
Office Action of Japan Counterpart Application, with English translation thereof, issued on Nov. 30, 2021, pp. 1-4.

* cited by examiner

*Primary Examiner* — Mark F. Huff
*Assistant Examiner* — Nicholas E Brown
(74) *Attorney, Agent, or Firm* — JCIPRNET

(57) ABSTRACT

An actinic ray-sensitive or radiation-sensitive resin composition includes a resin including a repeating unit represented by Formula (1) and capable of increasing a polarity by an action of an acid.

(1)

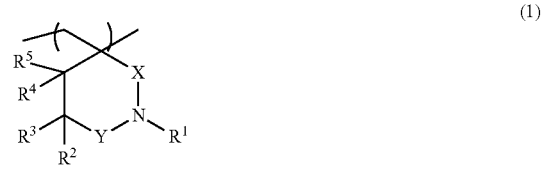

20 Claims, No Drawings

ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND RESIN

CROSS-REFERENCE TO RELATED APPLICATIONS

This application is a Continuation of PCT International Application No. PCT/JP2019/019333 filed on May 15, 2019, which claims priority under 35 U.S.C § 119(a) to Japanese Patent Application No. 2018-128916 filed on Jul. 6, 2018. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, a method for manufacturing an electronic device, and a resin.

2. Description of the Related Art

In processes for manufacturing semiconductor devices such as an integrated circuit (IC) and a large scale integrated circuit (LSI), microfabrication by lithography using a chemically amplified resist composition has been performed in the related art.

For example, a resist composition which includes a resin including a repeating unit derived from a maleimido group and having a polarity that is increased upon decomposition by the action of an acid is disclosed in Examples of WO2014/017144A.

SUMMARY OF THE INVENTION

The present inventors have examined the resist composition described in WO2014/017144A, and thus, they have found that the resist composition does not necessarily have a sufficient exposure latitude (EL).

Therefore, an object of the present invention is to provide an actinic ray-sensitive or radiation-sensitive resin composition having an excellent exposure latitude.

Furthermore, another object of the present invention is to provide a resist film, a pattern forming method, and a method for manufacturing an electronic device, each of which uses the actinic ray-sensitive or radiation-sensitive resin composition.

In addition, still another object of the present invention is to provide a novel resin.

The present inventors have conducted intensive studies to accomplish the objects, and as a result, they have found that the problems can be solved with an actinic ray-sensitive or radiation-sensitive resin composition including a resin having a specific structure, thereby completing the present invention.

That is, the present inventors have found that the problems can be solved by the following configurations.

[1] An actinic ray-sensitive or radiation-sensitive resin composition comprising a resin including a repeating unit represented by General Formula (1) and capable of increasing a polarity by an action of an acid.

[2] The actinic ray-sensitive or radiation-sensitive resin composition as described in [1],
in which the resin is a resin including the repeating unit represented by General Formula (1) and a repeating unit having an acid-decomposable group, or a resin including the repeating unit represented by General Formula (1) where $R^1$ represents a monovalent organic group including an acid-decomposable group.

[3] The actinic ray-sensitive or radiation-sensitive resin composition as described in [1] or [2],
in which X represents —CO—, —SO$_2$—, —SO—, or —CS—, and Y represents a substituted or unsubstituted alkylene group, —CO—, —SO$_2$—, —SO—, or —CS—.

[4] The actinic ray-sensitive or radiation-sensitive resin composition as described in any one of [1] to [3],
in which $R^1$ represents a substituted or unsubstituted hydrocarbon group including a heteroatom.

[5] The actinic ray-sensitive or radiation-sensitive resin composition as described in any one of [1] to [4],
in which $R^1$ represents a substituted or unsubstituted hydrocarbon group which includes a cyclic structure including a heteroatom and may include a heteroatom,
a substituted or unsubstituted hydrocarbon group which includes a proton donating group and may include a heteroatom, or
a substituted or unsubstituted hydrocarbon group which includes a group having a proton donating group protected by a leaving group that leaves by an action of an acid, and may include a heteroatom.

[6] The actinic ray-sensitive or radiation-sensitive resin composition as described in [5],
in which the cyclic structure including a heteroatom represents a substituted or unsubstituted lactone structure, a substituted or unsubstituted sultone structure, or a substituted or unsubstituted cyclic carbonate structure, and the proton donating group represents a sulfonamido group, a carboxyl group, or a hydroxyl group.

[7] The actinic ray-sensitive or radiation-sensitive resin composition as described in [5],
in which the substituted or unsubstituted hydrocarbon group which includes a proton donating group and may include a heteroatom represents a linear or branched, substituted or unsubstituted hydrocarbon group which includes a proton donating group and may include a heteroatom.

[8] The actinic ray-sensitive or radiation-sensitive resin composition as described in any one of [1] to [7],
in which the resin further includes a repeating unit having a polar group.

[9] The actinic ray-sensitive or radiation-sensitive resin composition as described in any one of [1] to [8], further comprising a photoacid generator.

[10] A resist film formed using the actinic ray-sensitive or radiation-sensitive resin composition as described in any one of [1] to [9].

[11] A pattern forming method comprising:
forming a resist film using the actinic ray-sensitive or radiation-sensitive resin composition as described in any one of [1] to [9];
exposing the resist film; and
developing the exposed resist film using a developer.

[12] A method for manufacturing an electronic device, comprising the pattern forming method as described in [11].

[13] A resin including a repeating unit represented by General Formula (1) and capable of increasing a polarity by an action of an acid.

[14] The resin as described in [13],
in which the resin is a resin including the repeating unit represented by General Formula (1) and a repeating unit having an acid-decomposable group, or a resin including the repeating unit represented by General Formula (1) where $R^1$ represents a monovalent organic group including an acid-decomposable group.

[15] The resin as described in [13] or [14],
in which X represents —CO—, —SO$_2$—, —SO—, or —CS—, and Y represents a substituted or unsubstituted alkylene group, —CO—, —SO$_2$—, —SO—, or —CS—.

[16] The resin as described in any one of [13] to [15],
in which $R^1$ represents a substituted or unsubstituted hydrocarbon group including a heteroatom.

[17] The resin as described in any one of [13] to [16],
in which $R^1$ represents a substituted or unsubstituted hydrocarbon group which includes a cyclic structure including a heteroatom and may include a heteroatom,
a substituted or unsubstituted hydrocarbon group which includes a proton donating group and may include a heteroatom, or
a substituted or unsubstituted hydrocarbon group which includes a group having a proton donating group protected by a leaving group that leaves by an action of an acid, and may include a heteroatom.

[18] The resin as described in [17],
in which the cyclic structure including a heteroatom represents a substituted or unsubstituted lactone structure, a substituted or unsubstituted sultone structure, or a substituted or unsubstituted cyclic carbonate structure, and the proton donating group represents a sulfonamido group, a carboxyl group, or a hydroxyl group.

[19] The resin as described in [17],
in which the substituted or unsubstituted hydrocarbon group which includes a proton donating group and may include a heteroatom represents a linear or branched, substituted or unsubstituted hydrocarbon group which includes a proton donating group and may include a heteroatom.

[20] The resin as described in any one of [13] to [19], further comprising a repeating unit having a polar group.

According to the present invention, it is possible to provide an actinic ray-sensitive or radiation-sensitive resin composition having an excellent exposure latitude.

Furthermore, according to the present invention, it is possible to provide a resist film, a pattern forming method, and a method for manufacturing an electronic device, each of which uses the actinic ray-sensitive or radiation-sensitive resin composition.

In addition, according to the present invention, it is possible to provide a novel resin.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle rays such as electron beams and ion beams.

In the present specification, a numerical range expressed using "to" is used in a meaning of a range which includes the preceding and succeeding numerical values of "to" as the lower limit value and the upper limit value, respectively.

In the present specification, (meth)acrylate represents acrylate and methacrylate.

In the present specification, the weight-average molecular weight (Mw), the number-average molecular weight (Mn), and the dispersity (also referred to as a molecular weight distribution) (Mw/Mn) of a resin are each defined as a value converted in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following Substituent Group T, for example.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Actinic Ray-Sensitive or Radiation-Sensitive Resin Composition]

The actinic ray-sensitive or radiation-sensitive resin composition of an embodiment of the present invention (hereinafter also referred to as a "composition of the embodiment of the present invention") includes a resin (hereinafter also referred to as "resin (A)") including a repeating unit represented by General Formula (1) which will be described later and capable of increasing a polarity by the action of an acid.

By adopting the configuration, the composition of the embodiment of the present invention has an excellent exposure latitude (in other words, excellent EL performance).

The mechanism of action is not clear, but is presumed to be as follows.

On a basis that the resin (A) includes a repeating unit represented by General Formula (1) which will be described later, the molecular motion of the main chain is fixed (in other words, the mobility of the molecule in the main chain is low). Due to this, during the exposure of an actinic ray-sensitive or radiation-sensitive resin composition film (hereinafter also referred to as a "resist film") formed using the composition of the embodiment of the present invention, an acid generated from the photoacid generator is difficult to diffuse into the unexposed area, and as a result, it is considered that excellent EL performance is exhibited.

Furthermore, it is confirmed that in a case where $R^1$ in the repeating unit represented by General Formula (1) which will be described later represents a substituted or unsubstituted hydrocarbon group (hereinafter also referred to as a "specific substituent") including a heteroatom, the EL performance is even more excellent.

The mechanism of action is not clear, but is presumed to be as follows.

It is considered that the specific substituent in the resin (A) is excellent in the interaction with an acid generated from the photoacid generator due to the presence of the heteroatom (in other words, the specific substituent in the resin (A) has a function of trapping the acid generated from the photoacid generator), and exists overhanging in a position distant from the main chain. It is considered that due to the structure of the resin (A), the acid generated from the photoacid generator during the exposure of the resist film is more difficult to diffuse in the unexposed area, and as a result, the EL performance is more excellent.

Furthermore, it has been confirmed that the EL performance is further excellent even in a case where the resin (A) contains a repeating unit having a polar group.

Hereinafter, the components included in the composition of the embodiment of the present invention will be described in detail. Furthermore, the composition of the embodiment of the present invention is a so-called resist composition, and may be either a positive tone resist composition or a negative tone resist composition. In addition, the composition of the embodiment of the present invention may be either a resist composition for alkali development or a resist composition for organic solvent development.

The composition of the embodiment of the present invention is typically a chemically amplified resist composition.

[Resins]

<Resin (A)>

The resin (A) is a resin including a repeating unit represented by General Formula (1) which will be described later and capable of increasing a polarity by the action of an acid.

Here, typical examples of the "resin capable of increasing a polarity by the action of an acid" include a resin including a repeating unit (hereinafter also referred to as an "acid-decomposable repeating unit") having a group (hereinafter also referred to as an "acid-decomposable group") having a polarity that is increased upon decomposition by the action of an acid.

As will be described later, the resin (A) may be a resin including the repeating unit represented by General Formula (1) which will be described later and an acid-decomposable repeating unit, and the repeating unit represented by General Formula (1) which will be described later may be the acid-decomposable repeating unit.

The resin (A) is a resin capable of increasing a polarity by the action of an acid, as described above. Therefore, in the pattern forming method of an embodiment of the present invention which will be described later, typically, in a case where an alkali developer is adopted as the developer, a positive tone pattern is suitably formed, and in a case where an organic developer is adopted as the developer, a negative tone pattern is suitably formed.

Hereinafter, the repeating unit represented by General Formula (1) (hereinafter also referred to as a "repeating unit A") included in the resin (A) and other repeating units which may be optionally included will be described in detail.

<<Repeating Unit A (Repeating Unit Represented by General Formula (1))>>

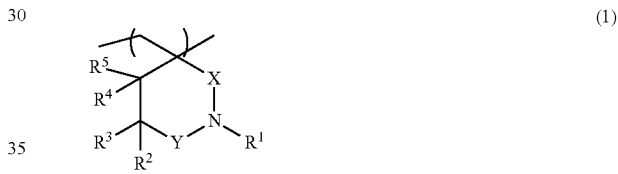

(1)

In General Formula (1), X and Y each independently represent a divalent linking group.

The divalent linking group represented by each of X and Y is not particularly limited, and examples thereof include —CO—, —SO$_2$—, —SO—, —CS—, —O—, —S—, —NR$^4$—, an alkylene group, and a group formed by combination of two or more of these groups. Here, R$^4$ represents a hydrogen atom or an alkyl group (preferably having 1 to 10 carbon atoms).

Incidentally, the alkylene group preferably has 1 to 10 carbon atoms, more preferably has 1 to 6 carbon atoms, still more preferably has 1 to 4 carbon atoms, and particularly preferably has 1 or 2 carbon atoms. Further, the alkylene group may have a substituent. The substituent is not particularly limited, and examples thereof include those exemplified in Substituent Group T.

Above all, from the viewpoint that the EL performance is more excellent, the divalent linking group represented by X is preferably —CO—, —SO$_2$—, —SO—, or —CS—.

Above all, from the viewpoint that the EL performance is more excellent, the divalent linking group represented by Y is preferably an alkylene group, —CO—, —SO$_2$—, —SO—, or —CS—, more preferably an alkylene group having 1 to 4 carbon atoms, —CO—, —SO$_2$—, —SO—, or —CS—, and still more preferably an alkylene group having 1 or 2 carbon atoms, —CO—, —SO$_2$—, —SO—, or —CS—.

Furthermore, the alkylene group may have a substituent. The substituent is not particularly limited, and examples thereof include those exemplified in Substituent Group T.

In General Formula (1), the number of ring members of a ring composed of X, Y, the nitrogen atom specified in the formula, and three carbon atoms (the carbon atoms substituted with $R^2$ and $R^3$, the carbon atoms substituted with $R^4$ and $R^5$ specified in the formula, and the carbon atom bonded to the main chain) is not particularly limited, but is, for example, 6 to 12, preferably 6 to 10, and more preferably 6 to 8.

$R^1$ represents a monovalent organic group.

The monovalent organic group represented by $R^1$ is not particularly limited, examples thereof include the groups exemplified in the above-mentioned Substituent Group T, and among these, from the viewpoint that the EL performance is more excellent, the substituted or unsubstituted hydrocarbon group including a heteroatom is preferable.

The substituted or unsubstituted hydrocarbon group including a heteroatom is not particularly limited, but is preferably a substituted or unsubstituted aliphatic hydrocarbon group including a heteroatom (which may be in any of linear, branched, and cyclic forms).

Examples of the substituted or unsubstituted aliphatic hydrocarbon group including a heteroatom include a substituted or unsubstituted alkyl group having 1 to 30 carbon atoms, including a heteroatom, a substituted or unsubstituted alkenyl group having 2 to 30 carbon atoms, including a heteroatom, and a substituted or unsubstituted alkynyl group having 2 to 30 carbon atoms, including a heteroatom, and among these, the substituted or unsubstituted alkyl group having 1 to 30 carbon atoms, including a heteroatom, is preferable.

The type of the heteroatom is not particularly limited, examples thereof include an oxygen atom, a nitrogen atom, and a sulfur atom, and the heteroatom is preferably included in an aspect of, for example, —$Y^1$—, —$N(R^a)$—, —$C(=Y^2)$—, —$CON(R^b)$—, —$C(=Y^3)Y^4$—, —$SOt$—, —$SO_2N(R^c)$—, or a group formed by combination thereof, —$COOH$, —$SO_3H$, —$CN$, —$NO_2$, —$OH$, or —$SH$.

$Y^1$ to $Y^4$ each independently represent an oxygen atom or a sulfur atom. t represents an integer of 1 to 3.

$R^a$, $R^b$, and $R^c$ each independently represent a hydrogen atom or an alkyl group having 1 to 10 carbon atoms.

Specific examples of the aspect including a heteroatom include an ester group (*—COO—*), a thioester group (*—CSO—*), a sulfonate group (*—$SO_3$—*), a sulfonamido group (*—$N(R^a)$—$SO_2$—*), a carbonate group (*—O—CO—O—*), a thiocarbonate group (*—O—CS—O—*, *—S—CO—O—*, *—S—CS—O—*, or *—S—CS—S—*), a carbamate group (*—$N(R^a)$—COO—*), a thiocarbamate group (*—$N(R^a)$—CSO—*), a sulfoxide group (*—SO—*), a sulfonyl group (*—$SO_2$—*), a ketone group (*—CO—*), a thioketone group (*—CS—*), an imido group (*—CO—$N(R^a)$—CO—*), a thioimido group (*—CS—$N(R^a)$—CS—*), an amido group (*—$N(R^a)$—CO—*), a thioamido group (*—$N(R^a)$—CS—*), a sulfonimido group (*—$SO_2$—$N(R^a)$—$SO_2$—*), an ether group (*—O—*), a thioether group (*—S—*), a carboxyl group (*—COOH), a sulfonic acid group (*—$SO_3H$), a cyano group (*—CN), a nitro group (*—$NO_2$), a hydroxyl group (*—OH), and a mercapto group (*—SH). In addition, * represents a linking position.

Above all, from the viewpoint that the EL performance is more excellent, the substituted or unsubstituted hydrocarbon group including a heteroatom represented by $R^1$, which includes (1) a cyclic structure including a heteroatom, (2) a proton donating group, or (3) a group having a proton donating group protected by a leaving group that leaves by the action of an acid, is preferable. That is, in other words, $R^1$ preferably represents a substituted or unsubstituted hydrocarbon group which includes (1) the cyclic structure including a heteroatom, (2) the proton donating group, or (3) the group having a proton donating group protected by a leaving group that leaves by the action of an acid, and may include a heteroatom.

As the above-mentioned cyclic structure including a heteroatom, a cyclic structure in which at least one atom forming a ring is a heteroatom is preferable, and examples thereof include a lactone structure, a sultone structure, and a cyclic carbonate structure.

In $R^1$, a position at which the cyclic structure including the heteroatom is introduced is not particularly limited, but the cyclic structure is preferably introduced into a terminal part. In addition, the cyclic structure including the heteroatom is derived into a monovalent group by removing one hydrogen atom.

As the lactone structure, a 5- to 7-membered ring lactone structure is preferable, and a 5- to 7-membered ring lactone structure to which another ring structure is fused so as to form a bicyclo structure or spiro structure is more preferable.

As the lactone structure, lactone structures represented by General Formulae (LC1-1) to (LC1-17) are preferable, and among these, the lactone structure represented by General Formula (LC1-1), General Formula (LC1-4), General Formula (LC1-5), General Formula (LC1-6), General Formula (LC1-13), or General Formula (LC1-14) is more preferable.

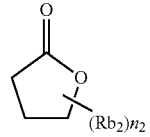

LC1-1

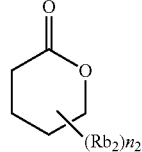

LC1-2

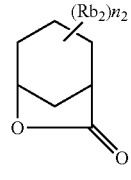

LC1-3

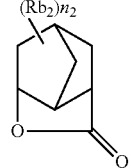

LC1-4

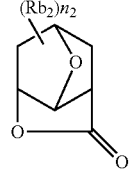

LC1-5

LC1-6 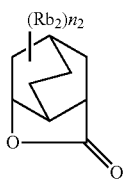

LC1-7 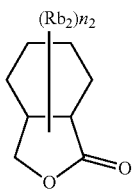

LC1-8 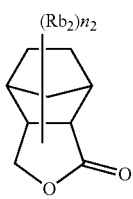

LC1-9 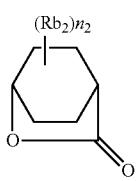

LC1-10 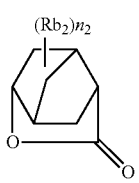

LC1-11 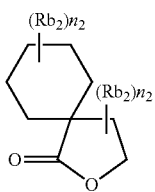

LC1-12 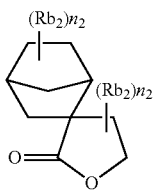

LC1-13 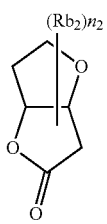

LC1-14 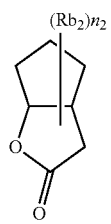

LC1-15 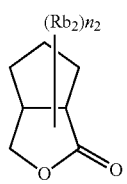

LC1-16 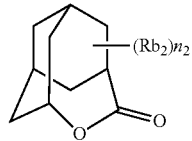

LC1-17 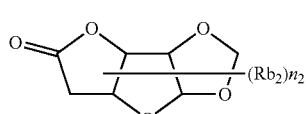

The lactone structure may have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, and a cyano group, an alkyl group having 1 to 4 carbon atoms or the cyano group is preferable, and the cyano group is more preferable. $n_2$ represents an integer of 0 to 4. In a case where $n_2$ is 2 or more, the substituents ($Rb_2$) which are present in a plural number may be the same as or different from each other. In addition, the substituents ($Rb_2$) which are present in a plural number may be bonded to each other to form a ring.

As the sultone structure, a 5- to 7-membered ring sultone structure is preferable, and a 5- to 7-membered ring sultone structure to which another ring structure is fused so as to form a bicyclo structure or spiro structure is more preferable.

As the sultone ring, sultone structures represented by General Formulae (SL1-1) to (SL1-3) are preferable, and among these, the sultone structure represented by (SL1-1) is more preferable.

SL1-1 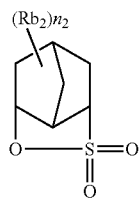

SL1-2 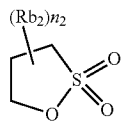

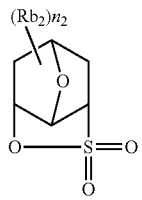

SL1-3

The sultone structure may have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, and a cyano group, an alkyl group having 1 to 4 carbon atoms or the cyano group is preferable, and the cyano group is more preferable. $n_2$ represents an integer of 0 to 4. In a case where $n_2$ is 2 or more, the substituents ($Rb_2$) which are present in a plural number may be the same as or different from each other. In addition, the substituents ($Rb_2$) which are present in a plural number may be bonded to each other to form a ring.

The cyclic carbonate structure is preferably a 5- to 7-membered ring carbonate structure. As the cyclic carbonate structure, another cyclic structure may be fused with the 5- to 7-membered ring carbonate structure so as to form a bicyclo structure or a spiro structure.

As the cyclic carbonate structure, for example, a cyclic carbonate structure represented by General Formula (CX) is preferable.

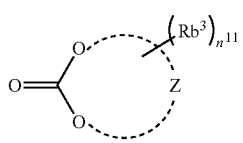

(CX)

In General Formula (CX), Z represents an alkylene group.

The alkylene group represented by Z preferably has 3 to 5 carbon atoms, and more preferably has 3 carbon atoms.

$Rb^3$ represents a substituent. Examples of $Rb^3$ include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, and a cyano group, an alkyl group having 1 to 4 carbon atoms or the cyano group is preferable, and the cyano group is more preferable. $n^{11}$ represents an integer of 0 to 3. In a case where $n^{11}$ is 2 or more, $n^{11}$'s which are present in a plural number may be the same as or different from each other. In addition, the substituents $n^{11}$'s which are present in a plural number may be bonded to each other to form a ring.

Above all, from the viewpoint that the EL performance is more excellent, the above-mentioned (1) substituted or unsubstituted hydrocarbon group which includes a cyclic structure including a heteroatom and may include a heteroatom, is preferably a group represented by General Formula (H1).

$$* -L^{101}-Q^{101}$$ (H1)

In General Formula (H1), $L^{101}$ represents a substituted or unsubstituted alkylene group having 1 to 30 carbon atoms, which may include a heteroatom. $Q^{101}$ represents a lactone structure, a sultone structure, or a cyclic carbonate structure.

The substituted or unsubstituted alkylene group having 1 to 30 carbon atoms, which may have a heteroatom, represented by $L^{01}$ is not particularly limited, but examples thereof include a substituted or unsubstituted alkylene group having 1 to 30 carbon atoms (preferably having 1 to 20 carbon atoms, more preferably having 1 to 15 carbon atoms, still more preferably having 1 to 10 carbon atoms, and particularly preferably 1 to 6 carbon atoms), which may include —O—, —N($R^a$)—, —CO—, —S—, —$SO_2$—, or a group formed by combination thereof. $R^a$ represents a hydrogen atom or an alkyl group having 1 to 10 carbon atoms.

Incidentally, in a case where the alkylene group includes a heteroatom, —$CH_2$— is substituted with the heteroatom.

From the viewpoint that the EL performance is more excellent, the substituted or unsubstituted alkylene group having 1 to 30 carbon atoms, which may include a heteroatom, represented by $L^{101}$, is preferably in a linear or branched form.

The lactone structure, the sultone structure, and the cyclic carbonate structure represented by $Q^{101}$ are as described above.

The proton donating group is not particularly limited, and examples thereof include a group including a hydrogen atom bonded to a heteroatom such as an oxygen atom, a nitrogen atom, and a sulfur atom, and specifically, an acidic group (a group that dissociates in a 2.38%-by-mass aqueous tetramethylammonium hydroxide solution, such as a sulfonamido group, a carboxyl group, a hydroxyl group (as the hydroxyl group, an alcoholic hydroxyl group or a fluorinated alcohol group is preferable; further, the alcoholic hydroxyl group refers to a hydroxyl group bonded to a hydrocarbon group, which is other than a hydroxyl group (phenolic hydroxyl group) directly bonded to an aromatic ring; as the hydroxyl group, an aliphatic alcohol group having an electron-withdrawing group such as a fluorine atom substituted at the a-position (hereinafter also referred to as a "fluorinated alcohol group", such as a hexafluoroisopropanol group) is excluded; and as the alcoholic hydroxyl group, the hydroxyl group having an acid dissociation constant (pKa) from 12 to 20 is preferable), a sulfonic acid group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Above all, from the viewpoint that the EL performance is more excellent, as the above-mentioned proton donating groups, a sulfonamido group (as the sulfonamido group, an alkylsulfonamido group is preferable, and an alkylsulfonamido group represented by *—NH—$SO_2$—$R^x$ ($R^x$ represents an alkyl group having 1 to 10 carbon atoms (which may be in any of linear, branched, and cyclic forms); the alkyl group represented by $R^x$ may have a substituent; examples of the substituent include a halogen atom (for example, a fluorine atom); and the alkyl group represented by $R^x$ preferably has 1 to 6 carbon atoms, and more preferably has 1 to 3 carbon atoms) is more preferable), a carboxyl group, a hydroxyl group (as the hydroxyl group, an alcoholic hydroxyl group or a fluorinated alcohol group (for example, a hexafluoroisopropanol group is preferable), or a sulfonic acid group is preferable, and the sulfonamido group, and the carboxyl group, or the hydroxyl group is more preferable.

As the above-mentioned (2) substituted or unsubstituted hydrocarbon group which includes a proton donating group and may include a heteroatom, above all, a group represented by General Formula (H2) is preferable from the viewpoint that the EL performance is more excellent.

In General Formula (H2), $L^{102}$ represents a substituted or unsubstituted alkylene group having 1 to 30 carbon atoms, which may include a heteroatom. $Q^{102}$ represents a proton donating group.

$L^{102}$ has the same definition as $L^{101}$ in General Formula (H1), and suitable aspects are also the same. Above all, from the viewpoint that the EL performance is more excellent, the substituted or unsubstituted alkylene group having 1 to 30 carbon atoms, which may include a heteroatom, represented by $L^{102}$, is preferably in a linear or branched form.

The proton donating group represented by $Q^{102}$ is as described above.

The above-mentioned group having a proton donating group protected by a leaving group that leaves by the action of an acid is a group in which a hydrogen atom of the above-mentioned proton donating group is substituted with a group that leaves by the action of an acid (leaving group). Incidentally, the proton donating group is as described above.

Examples of the group that leaves by the action of an acid (leaving group) include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group represented by each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an a-pinene group, a tricyclodecanyl group, a tetraclododecyl group, and an androstanyl group. Further, at least one carbon atom in the cycloalkyl group may be substituted with a heteroatom such as an oxygen atom.

As the aryl group represented by each of $R_{36}$ to $R_{39}$, $R_{01}$, and $R_{02}$, an aryl group having 6 to 10 carbon atoms is preferable, and examples thereof include a phenyl group, a naphthyl group, and an anthryl group.

As the aralkyl group represented by each of $R_{36}$ to $R_{39}$, $R_{01}$, and $R_{02}$, an aralkyl group having 7 to 12 carbon atoms is preferable, and examples thereof include a benzyl group, a phenethyl group, and a naphthylmethyl group.

As the alkenyl group represented by each of $R_{36}$ to $R_{39}$, $R_{01}$, and $R_{02}$, an alkenyl group having 2 to 8 carbon atoms is preferable, and examples thereof include a vinyl group, an allyl group, a butenyl group, and a cyclohexenyl group.

The ring formed by the mutual bonding of $R_{36}$ and $R_{37}$ is preferably a (monocyclic or polycyclic) cycloalkyl group. As the cycloalkyl group, a monocyclic cycloalkyl group such as a cyclopentyl group and a cyclohexyl group, and a polycyclic cycloalkyl group such as a norbornyl group, a tetracyclodecanyl group, a tetraclododecanyl group, and an adamantyl group are preferable.

As the group having a proton donating group protected by a leaving group that leaves by the action of an acid, a tertiary alkyl ester group is preferable.

Above all, from the viewpoint that the EL performance is more excellent, the above-mentioned (3) substituted or unsubstituted hydrocarbon group which includes a group having a proton donating group protected by a leaving group that leaves by the action of an acid, and may include a heteroatom is preferably a group represented by General Formula (H3).

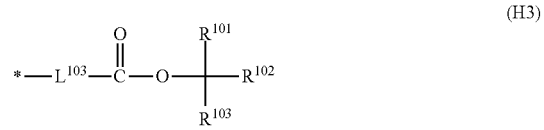

In General Formula (H3), $L^{103}$ represents a substituted or unsubstituted alkylene group having 1 to 30 carbon atoms, which may include a heteroatom.

$L^{103}$ has the same definition as $L^{101}$ in General Formula (H1), and suitable aspects are also the same.

$R^{101}$ to $R^{103}$ each independently represent an alkyl group (which may be in any of linear, branched, and cyclic forms).

It should be noted that in a case where all of $R^{101}$ to $R^{103}$ are linear or branched alkyl groups, it is preferable that at least two of $R^{101}$, $R^{102}$, or $R^{103}$ are methyl groups. Further, two of $R^{101}$ to $R^{103}$ may be bonded to each other to form a cycloalkyl group. The cycloalkyl group may be either a monocycle or a polycycle. In addition, the alkyl group represented by each of $R^{101}$ to $R^{103}$ may further have a substituent (for example, the group exemplified in the above-mentioned Substituent Group T).

As the linear or branched alkyl group represented by each of $R^{101}$ to $R^{103}$, an alkyl group having 1 to 4 carbon atoms, such as a methyl group, an ethyl group, an n-propyl group, an isopropyl group, an n-butyl group, an isobutyl group, and a t-butyl group, is preferable.

As the cyclic alkyl group (cycloalkyl group) represented by each of $R^{101}$ to $R^{103}$, a monocyclic cycloalkyl group such as a cyclopentyl group and a cyclohexyl group, or a polycyclic cycloalkyl group such as a norbornyl group, a tetracyclodecanyl group, a tetraclododecanyl group, and an adamantyl group is preferable.

As the cycloalkyl group formed by the bonding of two of $R^{101}$ to $R^{103}$, a monocyclic cycloalkyl group such as a cyclopentyl group and a cyclohexyl group is preferable, and in addition, a polycyclic cycloalkyl group such as a norbornyl group, a tetracyclodecanyl group, a tetraclododecanyl group, and an adamantyl group is also preferable, and the cyclopentyl group or the cyclohexyl group is more preferable.

In addition, in the cycloalkyl group formed by the bonding of two of $R^{101}$ to $R^{103}$, for example, one of the methylene groups constituting the ring may be substituted with a heteroatom such as an oxygen atom, or a group having a heteroatom, such as a carbonyl group.

In addition, the alkyl group represented by each of $R^{101}$ to $R^{103}$ may further have a substituent (for example, the group exemplified in the above-mentioned Substituent Group T). Examples of the substituent include an alkyl group (for example, an alkyl group having 1 to 4 carbon atoms), a halogen atom, a hydroxyl group, an alkoxy group (for example, an alkoxy group having 1 to 4 carbon atoms), a carboxyl group, and an alkoxycarbonyl group (for example, an alkoxycarbonyl group having 2 to 6 carbon atoms). The substituent preferably has 8 or less carbon atoms.

In General Formula (1), $R^2$ to $R^5$ each independently represent a hydrogen atom or a monovalent organic group.

The monovalent organic group represented by each of $R^2$ to $R^5$ is not particularly limited, but examples thereof include the groups exemplified in the above-mentioned Substituent Group T, and the alkyl group, the aryl group, the aralkyl group, or the alkenyl group is preferable.

The alkyl group represented by each of $R^2$ to $R^5$ is not particularly limited, but is preferably an alkyl group having 1 to 8 carbon atoms (which may be in any of linear, branched, and cyclic forms), and examples of the alkyl group include a methyl group, an ethyl group, a propyl group, an n-butyl group, a sec-butyl group, a hexyl group, and an octyl group. Among those, a linear or branched alkyl group having 1 to 4 carbon atoms is more preferable. Incidentally, the alkyl group represented by each of $R^2$ to $R^5$ may have a substituent. The substituent is not particularly limited, and examples thereof include the groups exemplified in the above-mentioned Substituent Group T.

The aryl group represented by each of $R^2$ to $R^5$ is not particularly limited, but an aryl group having 6 to 10 carbon atoms is preferable. Examples of the aryl group include a phenyl group, a naphthyl group, and an anthryl group, and the phenyl group is preferable. Incidentally, the aryl group represented by each of $R^2$ to $R^5$ may have a substituent. The substituent is not particularly limited, and examples thereof include the groups exemplified in the above-mentioned Substituent Group T.

The aralkyl group represented by each of $R^2$ to $R^5$ is not particularly limited, but for example, the alkyl group in the aralkyl group preferably has 1 to 6 carbon atoms, and more preferably has 1 to 3 carbon atoms. Examples of the aralkyl group include a benzyl group and a phenethyl group. Incidentally, the aralkyl group represented by each of $R^2$ to $R^5$ may have a substituent. The substituent is not particularly limited, and examples thereof include the groups exemplified in the above-mentioned Substituent Group T.

The alkenyl group represented by each of $R^2$ to $R^5$ is not particularly limited, but an alkenyl group having 2 to 8 carbon atoms (which may be in any of linear, branched, and cyclic forms) is preferable, and a linear or branched alkenyl group having 2 to 4 carbon atoms is more preferable. Examples of the alkenyl group include a vinyl group, an allyl group, a butenyl group, and a cyclohexenyl group. The alkenyl group represented by each of $R^2$ to $R^5$ may have a substituent. The substituent is not particularly limited, and examples thereof include the groups exemplified in the above-mentioned Substituent Group T.

Among those, $R_1$ is preferably a hydrogen atom.

Specific examples of the repeating unit represented by General Formula (1) are shown below, but the present invention is not limited to these specific examples.

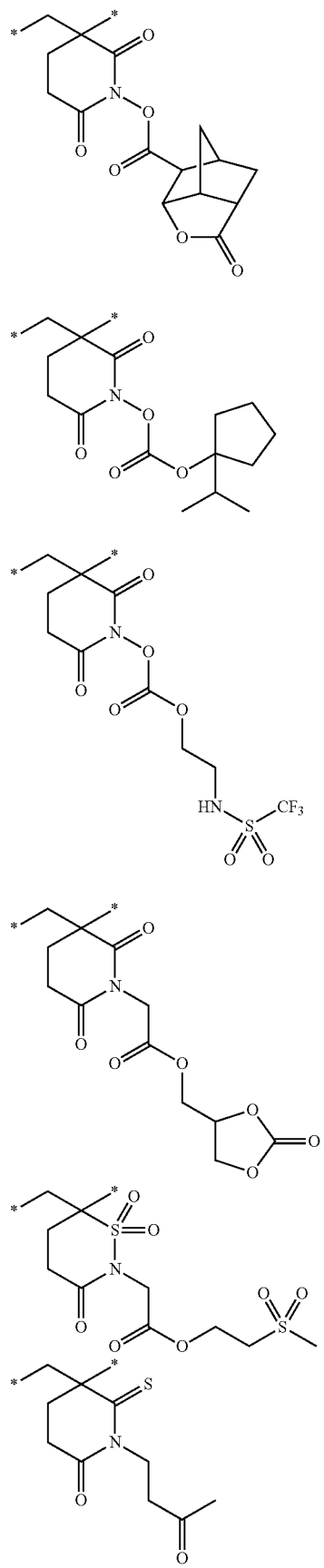

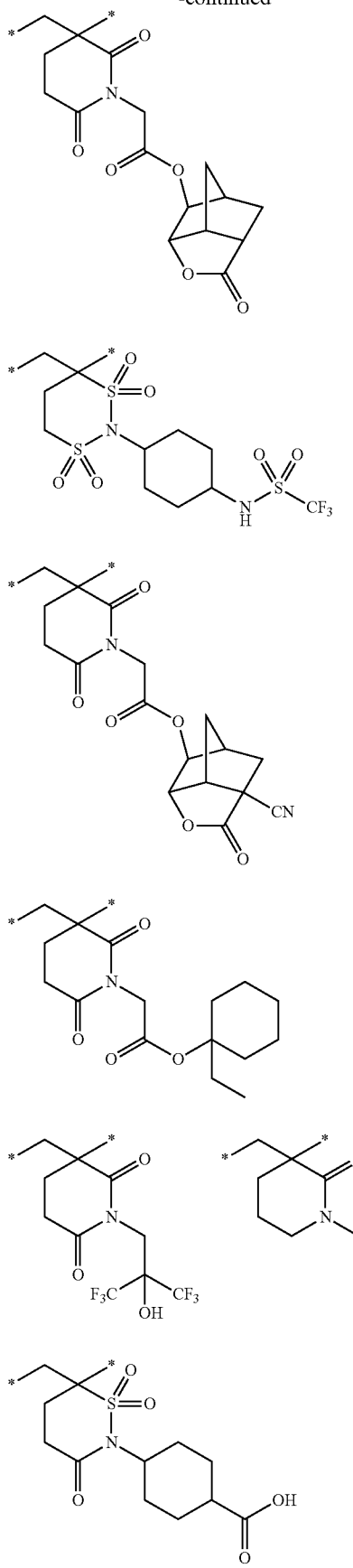
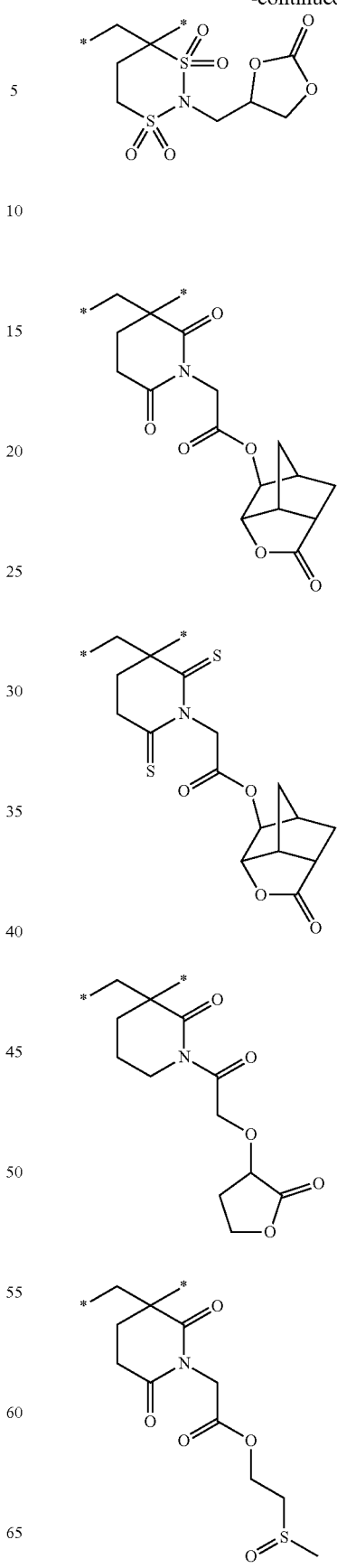

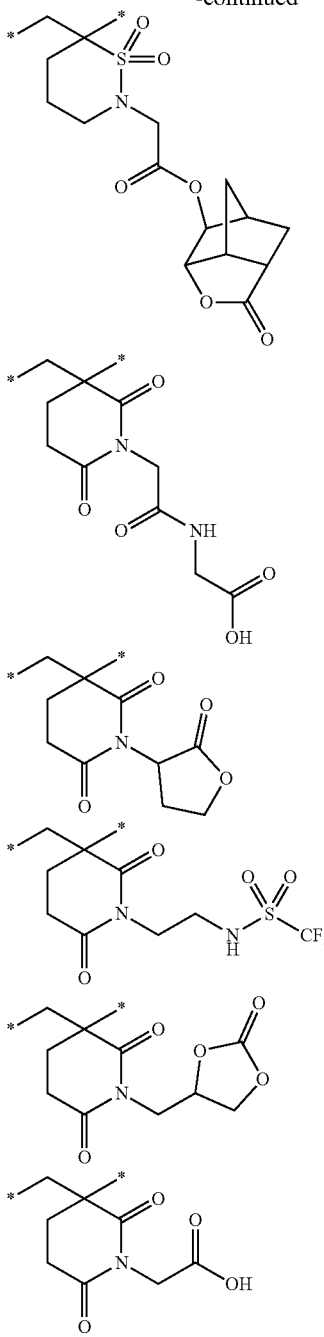

In the resin (A), the content of the repeating unit represented by General Formula (1) is, for example, 5% by mole or more, and preferably 10% by mole or more, with respect to all the repeating units in the resin (X). In addition, the upper limit value is not particularly limited, but is, for example, 100% by mole or less, preferably 70% by mole or less, and more preferably 60% by mole or less.

In the resin (A), the repeating unit represented by General Formula (1) may be an acid-decomposable repeating unit. In a case where the repeating unit represented by General Formula (1) is an acid-decomposable repeating unit, $R^1$ in the repeating unit represented by General Formula (1) represents a monovalent organic group including an acid-decomposable group (specifically a substituted or unsubstituted hydrocarbon group which includes the (3) group having a proton donating group protected by a leaving group that leaves by the action of an acid, and may include a heteroatom).

<<Other Repeating Units>>

The resin (A) may include another repeating unit, in addition to the repeating unit represented by General Formula (1). Hereinafter, such another repeating unit which can be included in the resin (A) will be described in detail.

Furthermore, from the viewpoint that the EL performance is more excellent, it is preferable that the resin (A) includes a repeating unit having a polar group as such another repeating unit.

Examples of the polar group include an alcoholic hydroxyl group, a fluorinated alcohol group (preferably, for example, a hexafluoroisopropanol group), a cyano group, and a carboxyl group.

Examples of the repeating unit having a polar group include a repeating unit having a polar group in a repeating unit C which will be described later and a repeating unit D which will be described later.

In a case where the resin (A) includes the repeating unit having a polar group, the content of the repeating unit having a polar group (in a case where the repeating units having a polar group are present in a plural number, a total content thereof) is preferably 5% to 40% by mole, more preferably 5% to 30% by mole, and still more preferably 10% to 25% by mole, with respect to all the repeating units in the resin (A).

Repeating Unit B

The resin (A) may include a repeating unit having an acid-decomposable group (hereinafter also referred to as an "acid-decomposable repeating unit" or a "repeating unit B"). Further, the repeating unit B does not include the above-mentioned repeating unit A.

The acid-decomposable group preferably has a structure having a polar group protected with a group (leaving group) that leaves upon decomposition by the action of an acid.

Examples of the polar group include an acidic group (a group which dissociates in a 2.38%-by-mass aqueous tetramethylammonium hydroxide solution) such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a hexafluoroisopropanol group) having the a-position substituted with an electron-withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, a fluorinated alcohol group (preferably a hexafluoroisopropanol group), and a sulfonic acid group.

The group which is preferable as the acid-decomposable group is a group in which a hydrogen atom is substituted with a group (leaving group) that leaves by the action of an acid of such the group.

Examples of the group that leaves by the action of an acid (leaving group) include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group represented by each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an a-pinene group, a tricyclodecanyl group, a tetracyclododecyl group, and an androstanyl group. Further, at least one carbon atom in the cycloalkyl group may be substituted with a heteroatom such as an oxygen atom.

As the aryl group represented by each of $R_{36}$ to $R_{39}$, $R_{01}$, and $R_{02}$, an aryl group having 6 to 10 carbon atoms is preferable, and examples thereof include a phenyl group, a naphthyl group, and an anthryl group.

As the aralkyl group represented by each of $R_{36}$ to $R_{39}$, $R_{01}$, and $R_{02}$, an aralkyl group having 7 to 12 carbon atoms is preferable, and examples thereof include a benzyl group, a phenethyl group, and a naphthylmethyl group.

As the alkenyl group represented by each of $R_{36}$ to $R_{39}$, $R_{01}$, and $R_{02}$, an alkenyl group having 2 to 8 carbon atoms is preferable, and examples thereof include a vinyl group, an allyl group, a butenyl group, and a cyclohexenyl group.

The ring formed by the mutual bonding of $R_{36}$ and $R_{37}$ is preferably a (monocyclic or polycyclic) cycloalkyl group. As the cycloalkyl group, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

Examples of the structure (acid-decomposable group) which is protected by a leaving group that leaves upon decomposition by the action of an acid include a cumyl ester group, an enol ester group, an acetal ester group, and a tertiary alkyl ester group, and the acetal ester group or the tertiary alkyl ester group is preferable.

As the repeating unit B, a repeating unit represented by General Formula (AI) is preferable.

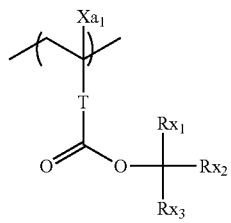

(AI)

In General Formula (AI), $Xa_1$ represents a hydrogen atom, a halogen atom, or a monovalent organic group.

T represents a single bond or a divalent linking group.

$Rx_1$ to $Rx_3$ each independently represent an alkyl group or a cycloalkyl group.

Any two of $Rx_1$, $Rx_2$, or $Rx_3$ may or may not be bonded to each other to form a ring structure.

Examples of the divalent linking group represented by T include an alkylene group, an arylene group, —COO—Rt-, and —O—Rt-. In the formulae, Rt represents an alkylene group, a cycloalkylene group, or an arylene group.

T is preferably the single bond or —COO—Rt-. Rt is preferably a chained alkylene group having 1 to 5 carbon atoms, and more preferably —$CH_2$—, —$(CH_2)_2$—, or —$(CH_2)_3$—.

T is more preferably the single bond.

$Xa_1$ is preferably a hydrogen atom or an alkyl group.

The alkyl group represented by $Xa_1$ may have a substituent, and examples of the substituent include a hydroxyl group and a halogen atom (preferably a fluorine atom).

The alkyl group represented by $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

The alkyl group represented by each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like. The alkyl group preferably has 1 to 10 carbon atoms, more preferably has 1 to 5 carbon atoms, and still more preferably has 1 to 3 carbon atoms. In the alkyl group represented by each of $Rx_1$, $Rx_2$, and $Rx_3$, a part of carbon-carbon bonds may be a double bond.

As the cycloalkyl group represented by each of $Rx_1$, $Rx_2$, and $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As a ring structure formed by the bonding of two of $Rx_1$, $Rx_2$, and $Rx_3$, a monocyclic cycloalkane ring such as a cyclopentyl ring, a cyclohexyl ring, a cycloheptyl ring, and a cyclooctane ring, or a polycyclic cycloalkyl ring such as a norbornane ring, a tetracyclodecane ring, a tetracyclododecane ring, and an adamantane ring is preferable. Among those, the cyclopentyl ring, the cyclohexyl ring, or the adamantane ring is more preferable. As the ring structure formed by the bonding of two of $Rx_1$, $Rx_2$, and $Rx_3$, the structures shown below are also preferable.

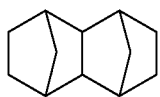

Specific examples of a monomer corresponding to the repeating unit represented by General Formula (AI) are shown below, but the present invention is not limited to these specific examples. The following specific examples correspond to the case where $Xa_1$ in General Formula (AI) is a methyl group, but $Xa_1$ can be optionally substituted with a hydrogen atom, a halogen atom, or a monovalent organic group.

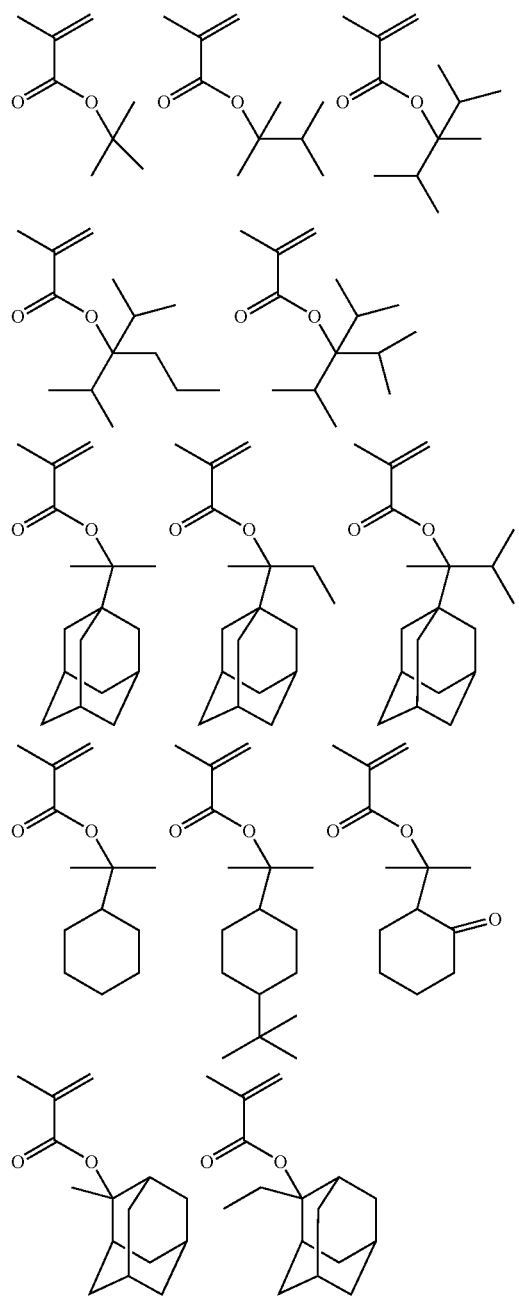

-continued

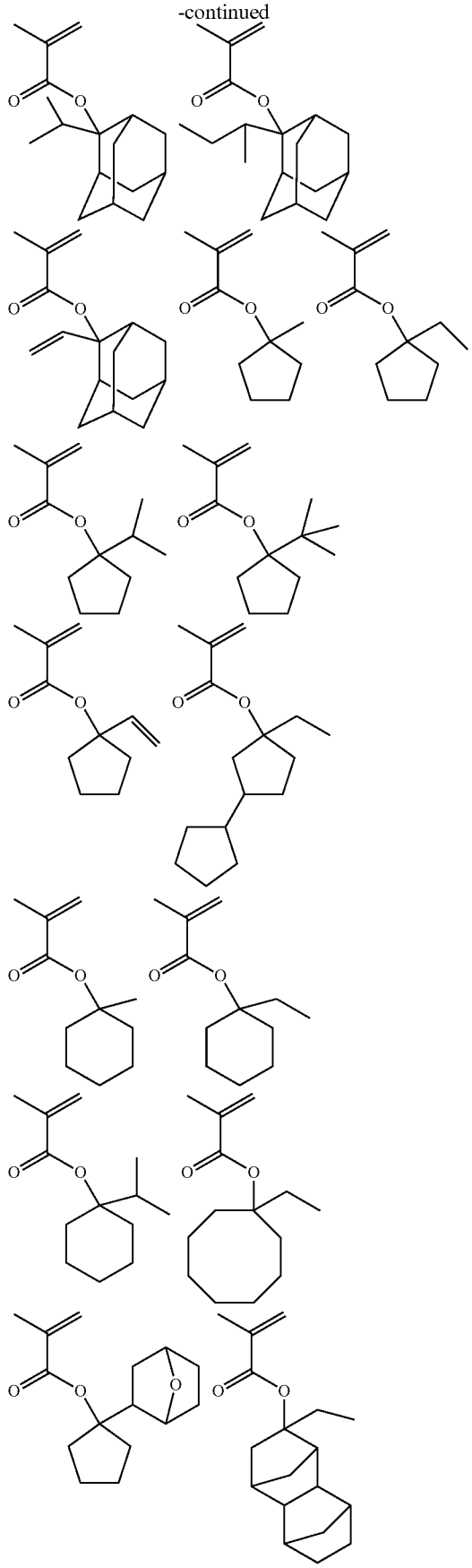

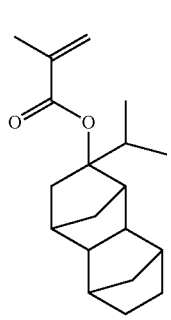 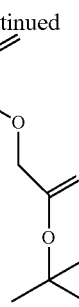 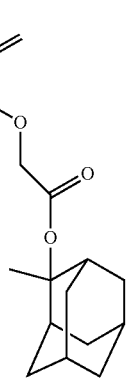

It is also preferable that the resin (A) includes the repeating units described in paragraphs <0336> to <0369> of the specification of US2016/0070167A1 as the repeating unit B.

Furthermore, the resin (A) may also include the repeating unit having a group that decomposes by the action of an acid to produce an alcoholic hydroxyl group as described in paragraphs <0363> and <0364> of the specification of US2016/0070167A1 as the repeating unit B.

The resin (A) may include the repeating unit B singly or in combination of two or more kinds thereof.

A content of the repeating unit B included in the resin (A) (in a case where the repeating units B are present in a plural number, a total content thereof) is preferably 10% to 90% by mole, more preferably 20% to 80% by mole, and still more preferably 30% to 70% by mole, with respect to all the repeating units of the resin (A).

Repeating Unit C

Furthermore, the resin (A) preferably includes a repeating unit (hereinafter also referred to as a "repeating unit C") having at least one selected from the group consisting of a lactone structure, a sultone structure, and a carbonate structure. Further, the repeating unit C does not include the above-mentioned repeating unit A and repeating unit B.

As the lactone structure or sultone structure, any structure which has a lactone structure or sultone structure may be used, but the structure is preferably a 5- to 7-membered ring lactone structure or a 5- to 7-membered ring sultone structure. Among those, the structure is more preferably a 5- to 7-membered ring lactone structure with which another ring structure is fused so as to form a bicyclo structure or a spiro structure or a 5- to 7-membered ring sultone structure with which another ring structure is fused so as to form a bicyclo structure or a spiro structure. The resin (A) still more preferably has a repeating unit having a lactone structure represented by any one of General Formulae (LC1-1) to (LC1-21) or a sultone structure represented by any one of General Formulae (SL1-1) to (SL1-3). Further, a lactone structure or sultone structure may be bonded directly to the main chain. Preferred examples of the structure include a lactone structure represented by General Formula (LC1-1), General Formula (LC1-4), General Formula (LC1-5), General Formula (LC1-8), General Formula (LC1-16), or General Formula (LC1-21), or a sultone structure represented by General Formula (SL1-1).

LC1-1
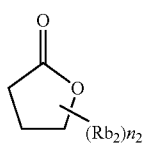

LC1-2
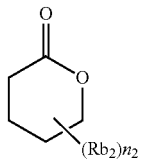

LC1-3
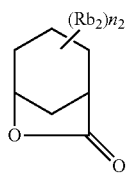

LC1-4
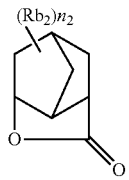

LC1-5
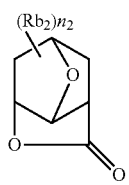

LC1-6
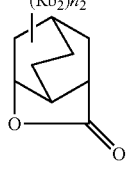

LC1-7
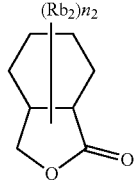

LC1-8
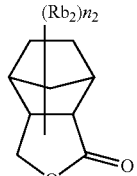

LC1-9
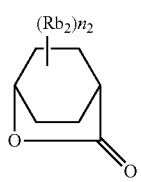

LC1-10 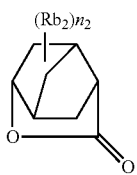

LC1-11 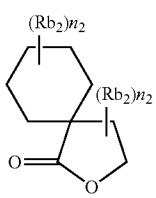

LC1-12 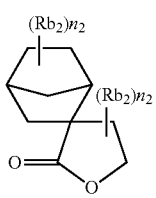

LC1-13 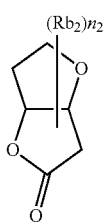

LC1-14 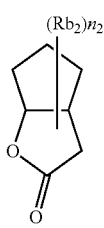

LC1-15 

LC1-16 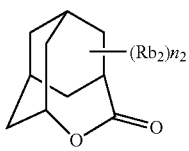

LC1-17 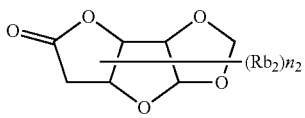

LC1-18 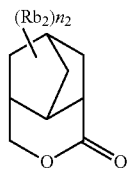

LC1-19 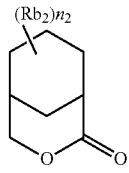

LC1-20 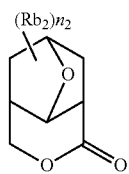

LC1-21 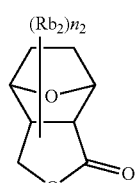

SL1-1 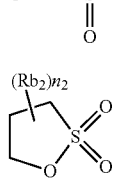

SL1-2 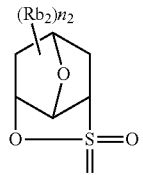

SL1-3

The lactone structural portion or the sultone structural portion may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and an alkyl group having 1 to 4 carbon atoms, the cyano group, or the acid-decomposable group is preferable. $n_2$ represents an integer of 0 to 4. In a case where $n_2$ is 2 or more, the substituents ($Rb_2$) which are present in a plural number may be the same as or different from each other. In addition, the substituents ($Rb_2$) which are present in a plural number may be bonded to each other to form a ring.

As the repeating unit having a lactone structure or sultone structure, a repeating unit represented by General Formula (III) is preferable.

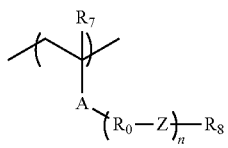

(III)

In General Formula (III),

A represents an ester bond (a group represented by —COO—) or an amide bond (a group represented by —CONH—).

n is the number of repetitions of the structure represented by —$R_0$—Z—, represents an integer of 0 to 5, and is preferably 0 or 1, and more preferably 0. In a case where n is 0, —$R_0$—Z— is not present and a single bond is formed.

$R_0$ represents an alkylene group, a cycloalkylene group, or a combination thereof. In a case where $R_0$'s are present in a plural number, $R_0$'s each independently represent an alkylene group, a cycloalkylene group, or a combination thereof.

Z represents a single bond, an ether bond, an ester bond, an amide bond, a urethane bond, or a urea bond. In a case where Z's are present in a plural number, they each independently represent a single bond, an ether bond, an ester bond, an amide bond, a urethane bond, or a urea bond.

$R_8$ represents a monovalent organic group having a lactone structure or sultone structure.

$R_7$ represents a hydrogen atom, a halogen atom, or a monovalent organic group (preferably a methyl group).

The alkylene group or the cycloalkylene group of $R_0$ may have a substituent.

As Z, an ether bond or an ester bond is preferable, and the ester bond is more preferable.

The resin (A) may have a repeating unit having a carbonate structure. The carbonate structure is preferably a cyclic carbonate structure.

The repeating unit having a cyclic carbonate structure is preferably a repeating unit represented by General Formula (A-I).

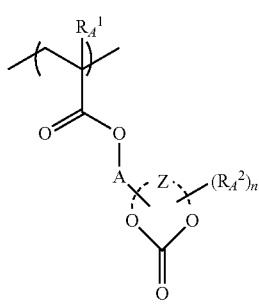

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$'s each independently represent a substituent.

A represents a single bond or a divalent linking group.

Z represents an atomic group that forms a monocyclic or polycyclic structure together with the group represented by —O—C(=O)—O— in the formula.

It is also preferable that the resin (A) includes the repeating unit described in paragraphs <0370> to <0414> of the specification of US2016/0070167A1 as the repeating unit C.

The resin (A) may have the repeating unit C singly or in combination of two or more kinds thereof.

Specific examples of a monomer corresponding to the repeating unit represented by General Formula (III) and specific examples of a monomer corresponding to the repeating unit represented by General Formula (A-1) are shown below, but the present invention is not limited to such specific examples. The following specific examples correspond to a case where $R_7$ in General Formula (III) and $R_A^1$ in General Formula (A-1) are each a methyl group, but $R_7$ and $R_A^1$ can be optionally substituted with a hydrogen atom, a halogen atom, or a monovalent organic group.

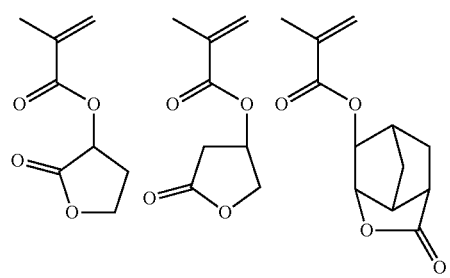

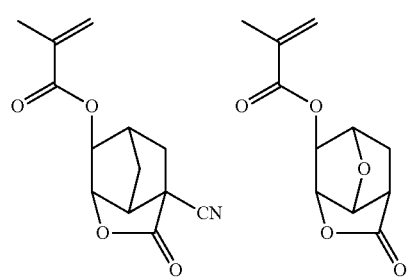

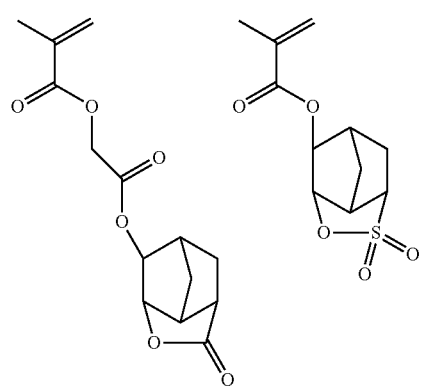

-continued

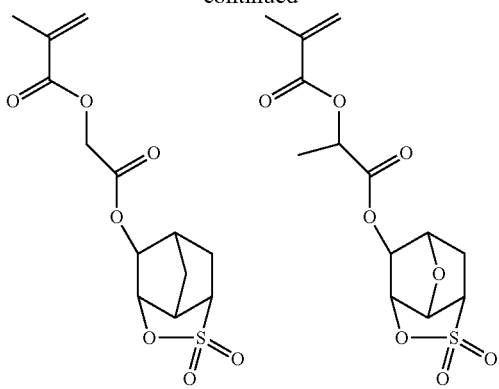

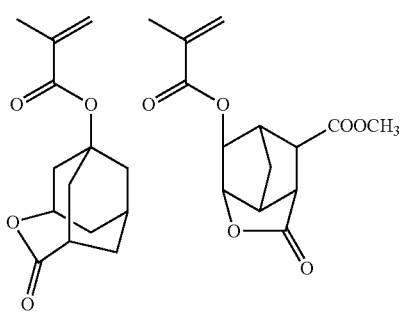

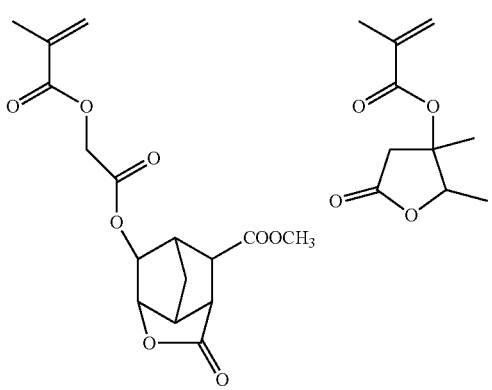

-continued

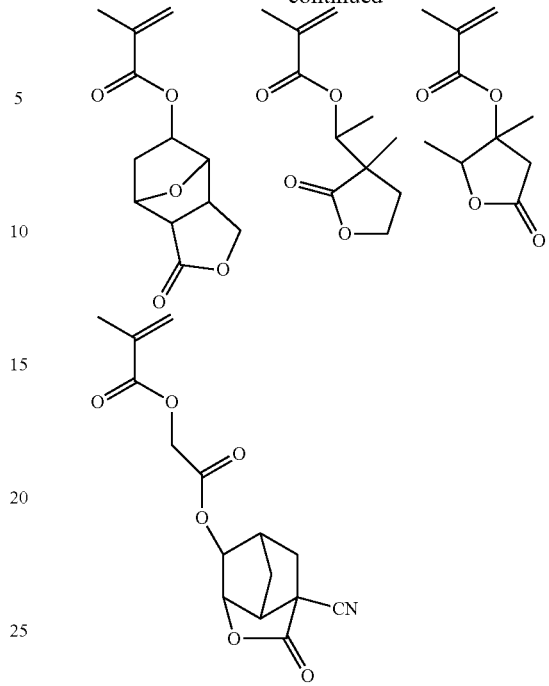

In addition to the monomers, monomers shown below are also suitably used as a raw material for the resin (A).

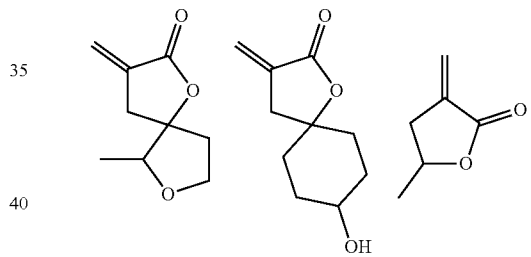

The content of the repeating unit C included in the resin (A) (in a case where the repeating units C are present in a plural number, a total content thereof) is preferably 5% to 70% by mole, more preferably 10% to 65% by mole, and still more preferably 20% to 60% by mole, with respect to all the repeating units in the resin (A).

Furthermore, in a case where the repeating unit C has a polar group, the content of the repeating unit C having a polar group (in a case where the repeating units C having a polar group are present in a plural number, a total content thereof) is preferably 5% to 40% by mole, and more preferably 5% to 35% by mole, with respect to all the repeating units in the resin (A).

Repeating Unit D

The resin (A) preferably includes a repeating unit having an alicyclic hydrocarbon structure substituted with a polar group (hereinafter also referred to as a "repeating unit D"). Further, the repeating unit D does not include the above-mentioned repeating unit A, repeating unit B, and repeating unit C.

Examples of the polar group include an alcoholic hydroxyl group, a fluorinated alcohol group (preferably, for example, a hexafluoroisopropanol group), a cyano group, and a carboxyl group.

In addition, the aliphatic hydrocarbon structure is preferably a cyclohexyl group, an adamantyl group, or a norbornane group.

Specific examples of a monomer corresponding to the repeating unit D are shown below, but the present invention is not limited to these specific examples.

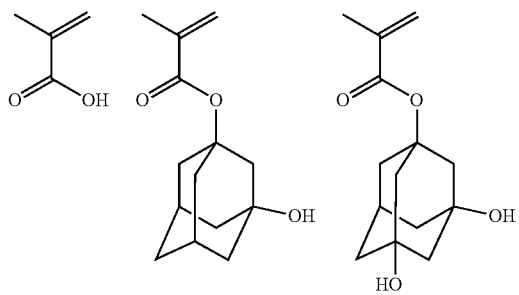
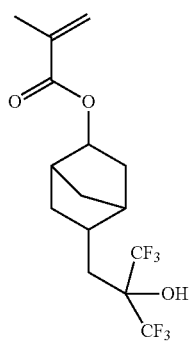
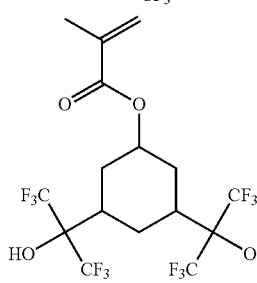
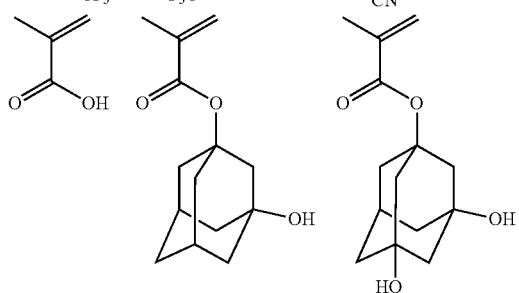
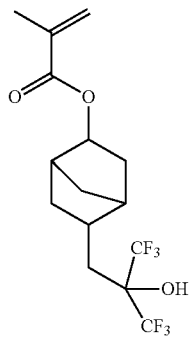

-continued

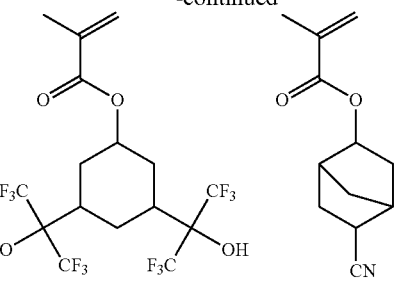

In addition to these, specific examples of the repeating unit D include the repeating units disclosed in paragraphs <0415> to <0433> of the specification of US2016/0070167A1.

The resin (A) may have the repeating unit D singly or in combination of two or more kinds thereof.

The content of the repeating unit D (in a case where the repeating units D are present in a plural number, a total content thereof) is preferably 5% to 40% by mole, more preferably 5% to 30% by mole, and still more preferably 10% to 25% by mole, with respect to all the repeating units in the resin (A).

Repeating Unit E

The resin (A) may include a repeating unit having a phenolic hydroxyl group (hereinafter also referred to as a "repeating unit E").

Examples of the repeating unit E include a repeating unit represented by General Formula (I).

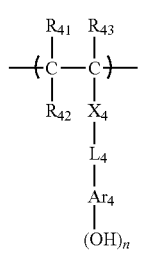

(I)

In Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or a divalent linking group.

$Ar_4$ represents an (n+1)-valent aromatic group, and in a case where $Ar_4$ is bonded to $R_{42}$ to form a ring, $Ar_4$ represents an (n+2)-valent aromatic group.

n represents an integer of 1 to 5.

For the purpose of increasing the polarity of the repeating unit represented by General Formula (I), it is preferable that n is an integer of 2 or more, or $X_4$ is —COO— or —CONR$_{64}$—.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle. A monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group represented by each of $R_{41}$, $R_{42}$, and $R_{43}$ in General Formula (1), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents an (n+1)-valent aromatic group. The divalent aromatic hydrocarbon group in a case where n is 1 may have a substituent, and for example, an arylene group having 6 to 18 carbon atoms, such as a phenylene group, a tolylene group, a naphthylene group, and an anthracenylene group, or an aromatic hydrocarbon group including a heterocycle such as thiophene, furan, pyrrole, benzothiophene, benzofuran, benzopyrrole, triazine, imidazole, benzimidazole, triazole, thiadiazole, and thiazole is preferable.

Specific suitable examples of the (n+1)-valent aromatic group in a case where n is an integer of 2 or more include groups formed by excluding any (n−1) hydrogen atoms from the above-described specific examples of the divalent aromatic group.

The (n+1)-valent aromatic group may further have a substituent.

Examples of the preferred substituent in the (n+1)-valent aromatic group include a halogen atom, and a fluorine atom or an iodine atom is preferable.

Preferred examples of the alkyl group of $R_{64}$ in —$CONR_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and the alkyl group is more preferably an alkyl group having 8 or less carbon atoms.

As $X_4$, the single bond, —COO—, or —CONH— is preferable, the single bond or —COO— is more preferable, and the single bond is still more preferable.

As the divalent linking group as $L_4$, an alkylene group is preferable, and as the alkylene group, an alkylene group having 1 to 8 carbon atoms, such as a methylene group, an ethylene group, a propylene group, a butylene group, a hexylene group, and an octylene group, each of which may have a substituent, is preferable.

Among those, $L_4$ is preferably the single bond.

As $Ar_4$, an aromatic hydrocarbon group having 6 to 18 carbon atoms, which may have a substituent, is preferable, a benzene ring group, a naphthalene ring group, or a biphenylene ring group is more preferable, and the benzene ring group is still more preferable.

n is preferably 1 or 2.

Among those, the repeating unit represented by General Formula (I) is preferably a repeating unit derived from hydroxystyrene or a hydroxystyrene derivative. That is, $Ar_4$ represents a benzene ring group, and $X_4$ and $L_4$ each preferably represent a single bond.

Specific examples of the repeating unit E are shown below, but the present invention is not limited to these specific examples. In the formulae, a represents 1 or 2.

(B-1)

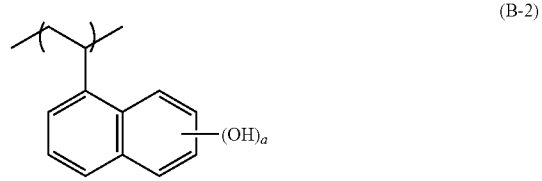

(B-2)

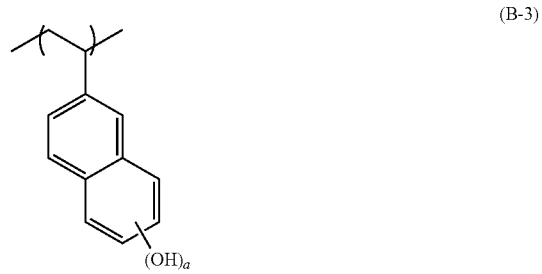

(B-3)

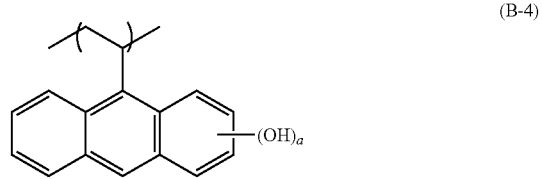

(B-4)

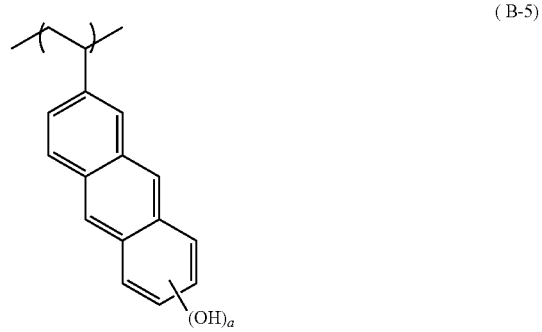

(B-5)

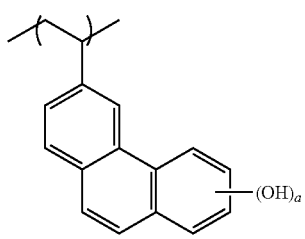
(B-6)
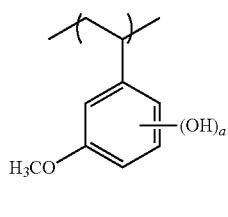
(B-13)
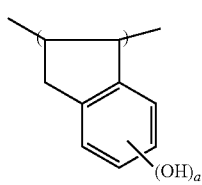
(B-7)
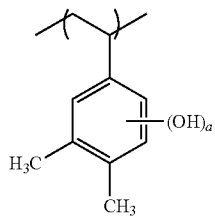
(B-14)
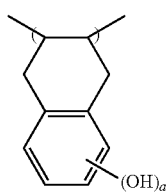
(B-8)
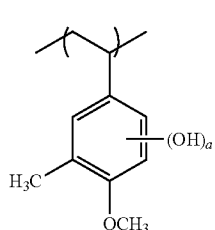
(B-15)
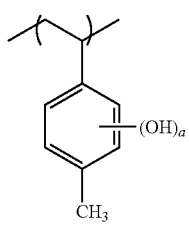
(B-9)
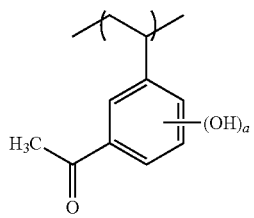
(B-16)
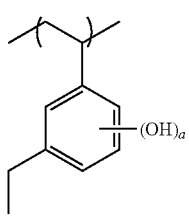
(B-10)
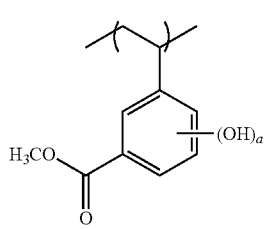
(B-17)
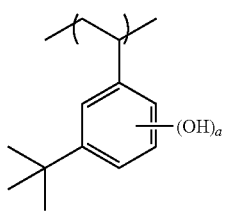
(B-11)
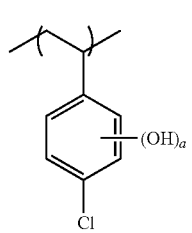
(B-18)
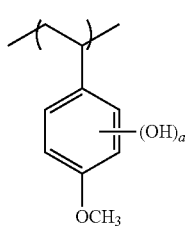
(B-12)
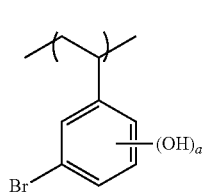
(B-19)

(B-20) 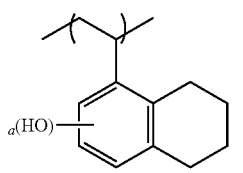
(B-21) 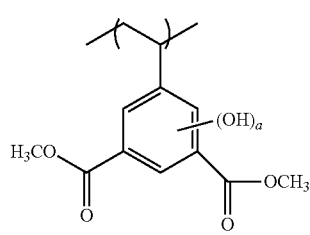
(B-22) 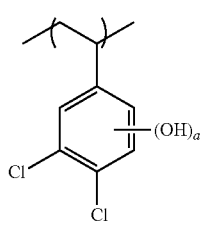
(B-23) 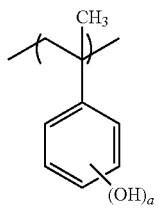
(B-24) 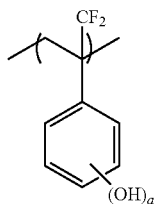
(B-25) 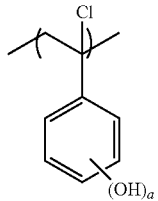
(B-26) 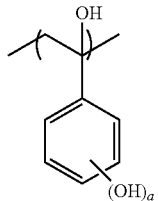
(B-27) 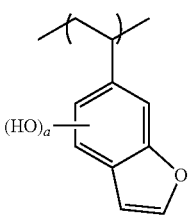
(B-28) 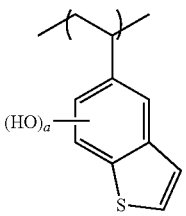
(B-29) 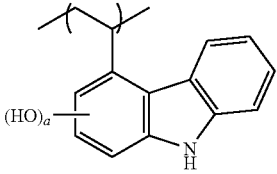
(B-30) 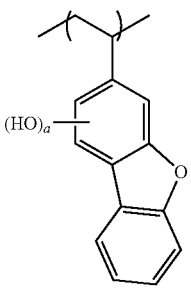
(B-31) 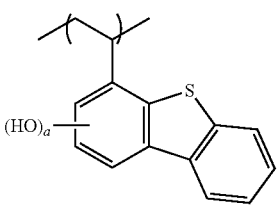
(B-32) 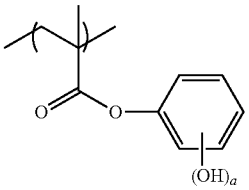
(B-33) 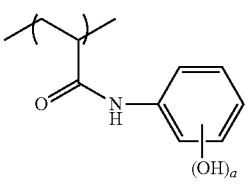

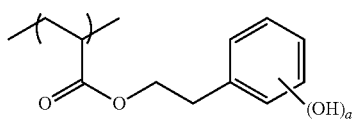
(B-34)

In a case where the resin (A) includes the repeating unit E, the content of the repeating unit E is preferably 10% to 50% by mole, and more preferably 10% to 40% by mole, with respect to all the repeating units in the resin (A).

Repeating Unit F

It is preferable that the resin (A) further includes a repeating unit (hereinafter also referred to as a "repeating unit F") having a fluorine atom or an iodine atom. Further, the repeating unit F does not include the above-mentioned repeating unit A, repeating unit B, repeating unit C, repeating unit D, and repeating unit E. Particularly, in a case of pattern formation by EUV exposure, it is preferable that the resin (A) includes the repeating unit F.

Specific examples of a monomer corresponding to the repeating unit F are shown below, but the present invention is not limited to these specific examples.

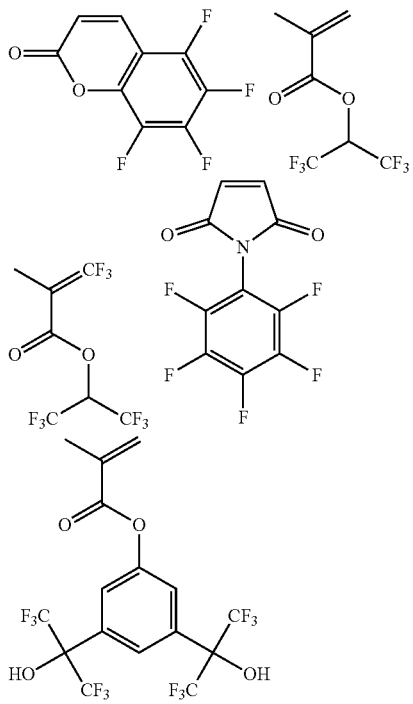

Repeating Unit G

The resin (A) may further include a repeating unit (hereinafter also referred to as a "repeating unit G") other than the above-described repeating unit A, repeating unit B, repeating unit C, repeating unit D, repeating unit E, and repeating unit F.

The repeating unit G preferably has an alicyclic hydrocarbon structure. Examples of the repeating unit G include the repeating units described in paragraphs <0236> and <0237> of the specification of US2016/0026083A1.

Preferred examples of a monomer corresponding to the repeating unit G are shown below.

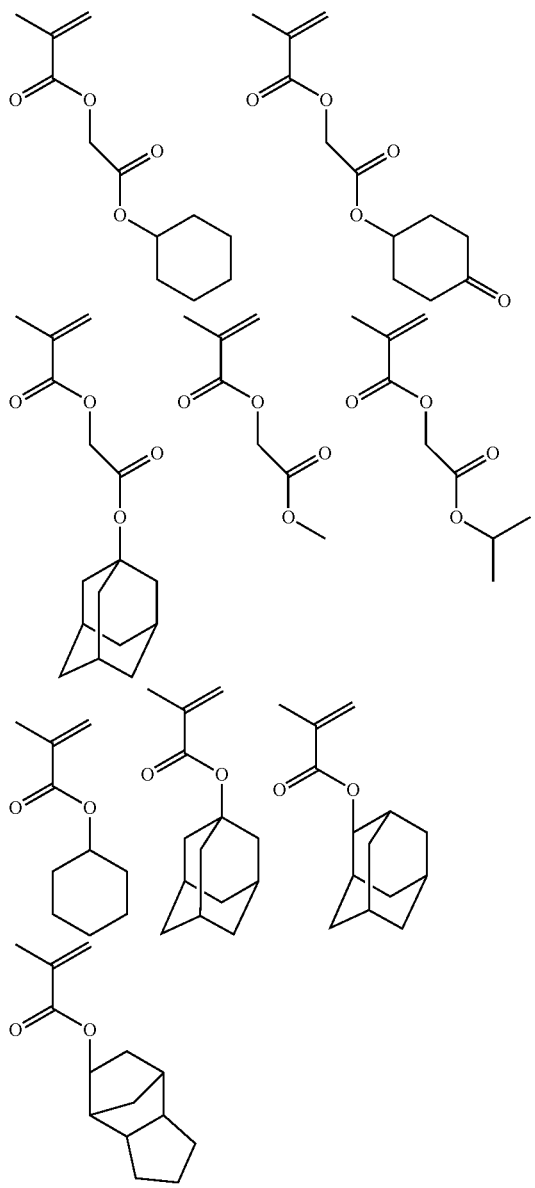

In addition to these, specific examples of the repeating unit G include the repeating unit disclosed in paragraph <0433> of the specification of US2016/0070167A1.

The resin (A) may include the repeating unit G singly or in combination of two or more kinds thereof.

The content of the repeating unit G (in a case where the repeating units G are present in a plural number, a total content thereof) is preferably 5% to 40% by mole, more preferably 5% to 30% by mole, and still more preferably 5% to 25% by mole, with respect to all the repeating units in the resin (A).

Moreover, the resin (A) may have a variety of repeating structural units, in addition to the repeating structural units, as the repeating unit G for the purpose of controlling dry etching resistance, suitability for a standard developer, adhesiveness to a substrate, and a resist profile, resolving power, heat resistance, sensitivity, and the like which are general characteristics required for a resist.

Examples of such a repeating structural unit include a repeating structural unit corresponding to a predetermined monomer, but are not limited thereto.

Examples of a predetermined monomer include a compound having one addition-polymerizable unsaturated bond, selected from acrylates, methacrylates, acrylamides, methacrylamides, allyl compounds, vinyl ethers, and vinyl esters.

In addition to these, an addition-polymerizable unsaturated compound that is copolymerizable with a monomer corresponding to the various repeating structural units may be used.

In the resin (A), a content molar ratio of each repeating structural unit is appropriately set in order to adjust various performances.

<<Other Aspects of Resin (A)>>

In a case where the composition of the embodiment of the present invention is for ArF exposure, it is preferable that the resin (A) does not substantially have an aromatic group from the viewpoint of transmittance of ArF light. More specifically, the repeating unit having an aromatic group is preferably 5% by mole or less, more preferably 3% by mole or less, and ideally still more preferably 0% by mole (in other words, the resin (A) does not include a repeating unit having an aromatic group) in the total amount of all the repeating units in the resin (A). In addition, the resin (A) preferably has a monocyclic or polycyclic alicyclic hydrocarbon structure.

In a case where the composition of the embodiment of the present invention is for ArF exposure, it is preferable that all of the repeating units of the resin (A) are constituted with (meth)acrylate-based repeating units. In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, but it is preferable that the amount of the acrylate-based repeating units is 50% by mole or less with respect to all the repeating units of the resin (A).

In a case where the composition of the embodiment of the present invention is for KrF exposure, EB exposure, or EUV exposure, the resin (A) preferably includes a repeating unit having an aromatic hydrocarbon group, and more preferably includes a repeating unit having a phenolic hydroxyl group (the above-mentioned repeating unit E).

The weight-average molecular weight of the resin (A) is preferably 1,000 to 200,000, more preferably 2,000 to 20,000, still more preferably 3,000 to 20,000, and particularly preferably 6,000 to 20,000. The dispersity (Mw/Mn) is usually 1.0 to 3.0, preferably 1.0 to 2.6, more preferably 1.0 to 2.0, and still more preferably 1.1 to 2.0.

The resin (A) may be used singly or in combination of two or more kinds thereof.

The content of the resin (A) in the composition of the embodiment of the present invention is generally 20.0% by mass or more in many cases, and is preferably 40.0% by mass or more, more preferably 60.0% by mass or more, and still more preferably 70.0% by mass or more, with respect to the total solid content. An upper limit thereof is not particularly limited, but is preferably 99.5% by mass or less, more preferably 99.0% by mass or less, and still more preferably 97.0% by mass or less.

(Resin (AX))

In a case where the composition of the embodiment of the present invention includes a crosslinking agent (F) which will be described later, it is preferable that the composition of the embodiment of the present invention includes an alkali-soluble resin (AX) having a phenolic hydroxyl group (hereinafter also referred to as a "resin (AX)"). The resin (AX) preferably contains a repeating unit having a phenolic hydroxyl group.

In this case, typically, a negative tone pattern is suitably formed.

Furthermore, the crosslinking agent (F) may be in the state of being supported on the resin (AX).

In a case where the composition of the embodiment of the present invention includes the resin (AX), a pattern thus formed is usually a negative tone pattern.

The repeating unit having a phenolic hydroxyl group contained in the resin (AX) is preferably a repeating unit represented by General Formula (II).

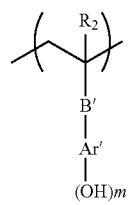

In General Formula (II), $R_2$ represents a hydrogen atom, an alkyl group (preferably a methyl group), or a halogen atom (preferably a fluorine atom).

B' represents a single bond or a divalent linking group.

Ar' represents an aromatic ring group.

m represents an integer of 1 or more.

The divalent linking group represented by B' has the same definition as T in General Formula (AI), and a suitable aspect thereof is also the same.

The aromatic ring group represented by Ar' is preferably a benzene ring.

m is not particularly limited as long as it is an integer of 1 or more, but is, for example, preferably 1 to 4, more preferably 1 to 3, and still more preferably 1 or 2.

The resin (AX) may be used singly or in combination of two or more kinds thereof.

A content of the resin (AX) in the total solid content of the composition of the embodiment of the present invention is generally 30% by mass or more in many cases, and is preferably 40% by mass or more, and more preferably 50% by mass or more. An upper limit thereof is not particularly limited, but is preferably 99% by mass or less, more preferably 90% by mass or less, and still more preferably 85% by mass or less.

Suitable examples of the resin (AX) include the resins disclosed in paragraphs <0142> to <0347> of the specification of US2016/0282720A1.

The composition of the embodiment of the present invention may include both the resin (A) and the resin (AX).

[Photoacid Generator (B)]

The composition of the embodiment of the present invention preferably includes a compound that generates an acid upon irradiation with actinic rays or radiation (hereinafter also referred to as an "acid generator (B)").

Furthermore, the photoacid generator (B) as mentioned herein corresponds to an acid generator which is usually used for causing a crosslinking reaction of a resin component since it causes a deprotection reaction of the resin component (deprotection reaction of an acid-decomposable resin).

The photoacid generator (B) is preferably a compound that generates an organic acid upon irradiation with actinic rays or radiation. Examples thereof include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

As the photoacid generator (B), known compounds that generate an acid upon irradiation with actinic rays or radiation can be appropriately selected and used singly or as a mixture thereof. For example, the known compounds disclosed in paragraphs <0125> to <0319> of the specification of US2016/0070167A1, paragraphs <0086> to <0094> of the specification of US2015/0004544A1, and paragraphs <0323> to <0402> of the specification of US2016/0237190A1 can be suitably used as the photoacid generator (B).

As the photoacid generator (B), for example, a compound represented by General Formula (ZI), General Formula (ZII), or General Formula (ZIII) is preferable.

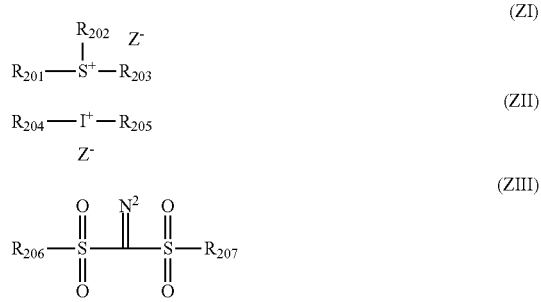

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group), and —$CH_2$—$CH_2$—O—$CH_2$—$CH_2$—.

$Z^-$ represents an anion.

Suitable aspects of the cation in General Formula (ZI) include the corresponding groups in a compound (ZI-1), a compound (ZI-2), a compound (ZI-3), and a compound (ZI-4) which will be described later.

Furthermore, the photoacid generator (B) may be a compound having a plurality of structures represented by General Formula (ZI). For example, the photoacid generator (B) may be a compound having a structure in which at least one of $R_{201}$, $R_{202}$, or $R_{203}$ of the compound represented by General Formula (ZI) and at least one of $R_{201}$, $R_{202}$, or $R_{203}$ of another compound represented by General Formula (ZI) are bonded via a single bond or a linking group.

First, the compound (ZI-1) will be described.

The compound (ZI-1) is an arylsulfonium compound in which at least one of $R_{201}$, $R_{202}$, or $R_{203}$ in General Formula (ZI) is an aryl group, that is, a compound having arylsulfonium as a cation.

In the arylsulfonium compound, all of $R_{201}$ to $R_{203}$ may be an aryl group, or some of $R_{201}$ to $R_{203}$ may be an aryl group, and the rest may be an alkyl group or a cycloalkyl group. Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group included in the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group represented by each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, the compound (ZI-2) will be described.

The compound (ZI-2) is a compound in which $R_2O_1$ to $R_{203}$ in Formula (ZI) each independently represent an organic group having no aromatic ring. Here, the aromatic ring also includes an aromatic ring including a heteroatom.

The organic group having no aromatic ring as each of $R_2O_1$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

As the alkyl group and the cycloalkyl group of each of $R_{201}$ to $R_{203}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

$R_{201}$ to $R_{203}$ may be further substituted with a halogen atom, an alkoxy group (for example, having 1 to 5 carbon atoms), a hydroxyl group, a cyano group, or a nitro group.

Next, the compound (ZI-3) will be described.

The compound (ZI-3) is a compound represented by General Formula (ZI-3) and having a phenacylsulfonium salt structure.

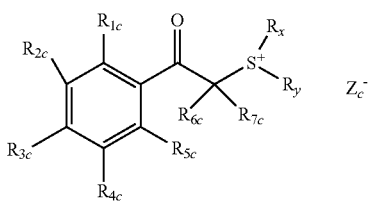

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}, \ldots,$ or $R_{5c}$, $R_{5c}$ and $R_{6c}$, $R_{6c}$ and $R_{7c}$, $R_{5c}$ and $R_x$, or $R_x$ and $R_y$ may be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}, \ldots,$ or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

$Zc^-$ represents an anion.

Next, the compound (ZI-4) will be described.

The compound (ZI-4) is represented by General Formula (ZI-4).

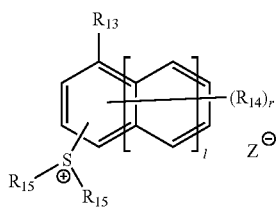

(ZI-4)

In General Formula (ZI-4), l represents an integer of 0 to 2.

r represents an integer of 0 to 8.

$R_{13}$ represents a group having a hydrogen atom, a fluorine atom, a hydroxyl group, an alkyl group, a cycloalkyl group, an alkoxy group, an alkoxycarbonyl group, or a cycloalkyl group. Such a group may have a substituent.

$R_{14}$ represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. Such a group may have a substituent. In a case where $R^{14}$'s are present in a plural number, they each independently represent the group such as a hydroxyl group.

$R_{15}$'s each independently represent an alkyl group, a cycloalkyl group, or a naphthyl group. Such a group may have a substituent. Two of $R_{15}$'s may be bonded to each other to form a ring.

In a case where two of $R_{15}$'s are bonded to each other to form a ring, the ring skeleton may include a heteroatom such as an oxygen atom and a nitrogen atom. In one aspect, it is preferable that two of $R_{15}$'s are alkylene groups and are bonded to each other to form a ring structure.

$Z^-$ represents an anion.

In General Formula (ZI-4), the alkyl groups represented by $R_{13}$, $R_{14}$, and $R_{15}$ are linear or branched. The alkyl group preferably has 1 to 10 carbon atoms. As the alkyl group, a methyl group, an ethyl group, an n-butyl group, or a t-butyl group is preferable.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group represented by each of $R_{204}$ to $R_{207}$ is preferably a phenyl group or a naphthyl group, and more preferably the phenyl group. The aryl group represented by each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group represented by each of $R_{204}$ to $R_{207}$, a linear alkyl group having 1 to 10 carbon atoms and branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group represented by each of $R_{204}$ to $R_{207}$ may each independently have a substituent. Examples of the substituent which may be contained in the aryl group, the alkyl group, and the cycloalkyl group represented by each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

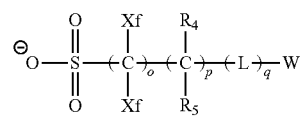

(3)

In General Formula (3), o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably a fluorine atom or a perfluoroalkyl group having 1 to 4 carbon atoms, and more preferably a fluorine atom or $CF_3$. In particular, it is more preferable that both Xf's are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are each present in a plural number, $R_4$'s and $R_5$'s may each be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same as the specific examples and the suitable aspects, respectively, of Xf in General Formula (3).

L represents a divalent linking group. In a case where L's are present in a plural number, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among these, —COO—, —OCO—, —CONH—, —NHCO—, —CO—, —O—, —SO$_2$—, —COO— alkylene group-, —OCO-alkylene group-, —CONH-alkylene group-, or —NHCO-alkylene group- is preferable, and —COO—, —OCO—, —CONH—, —SO$_2$—, —COO-alkylene group-, or —OCO-alkylene group- is more preferable.

W represents an organic group including a cyclic structure. Among these, W is preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. The polycyclic compound can further suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. Examples of the lactone ring and the sultone ring include the lactone structure and the sultone structure exemplified in the aforementioned resin. As the heterocycle in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (carbon contributing to ring formation) may be carbonyl carbon.

As the anion represented by General Formula (3), $SO_3^-$—$CF_2$—$CH_2$—OCO-(L)q'-W, $SO_3^-$—$CF_2$—CHF—$CH_2$—OCO-(L)q'-W, $SO_3^-$—$CF_2$—COO-(L)q'-W, $SO_3$—$CF_2$—$CF_2$—$CH_2$—$CH_2$-(L)q-W, or $SO_3^-$—$CF_2$—CH($CF_3$)—OCO-(L)q'-W is preferable. Here, L, q, and W are each the same as in General Formula (3). q' represents an integer of 0 to 10.

In one aspect, as $Z^-$ in General Formula (ZI), $Z^-$ in General Formula (ZII), $Zc^-$ in General Formula (ZI-3), and $Z^-$ in General Formula (ZI-4), an anion represented by General Formula (4) is also preferable.

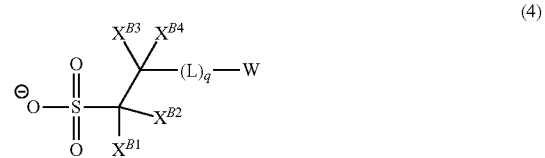

(4)

In General Formula (4), $X^{B1}$ and $X^{B2}$ each independently represent a hydrogen atom or a monovalent organic group having no fluorine atom. $X^{B1}$ and $X^{B2}$ are each preferably the hydrogen atom. $X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both $X^{B3}$ and $X^{B4}$ are fluorine atoms or monovalent organic groups having a fluorine atom. It is still more preferable that both $X^{B3}$ and $X^{B4}$ are fluorine-substituted alkyl groups.

L, q, and W are the same as in General Formula (3).

As $Z^-$ in General Formula (ZI), $Z^-$ in General Formula (ZII), $Zc^-$ in General Formula (ZI-3), and $Z^-$ in General Formula (ZI-4), an anion represented by General Formula (5) is preferable.

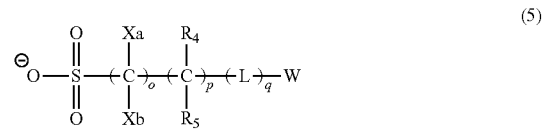

(5)

In General Formula (5), Xa's each independently represent a fluorine atom or an alkyl group substituted with at least one fluorine atom. Xb's each independently represent a hydrogen atom or an organic group having no fluorine atom. The definitions and preferred aspects of o, p, q, $R_4$, $R_5$, L, and W are each the same as those in General Formula (3).

$Z^-$ in General Formula (ZI), $Z^-$ in General Formula (ZII), $Zc^-$ in General Formula (ZI-3), and $Z^-$ in General Formula (ZI-4) may be a benzenesulfonate anion, and are each preferably a benzenesulfonate anion substituted with a branched alkyl group or a cycloalkyl group.

As $Z^-$ in General Formula (ZI), $Z^-$ in General Formula (ZII), $Zc^-$ in General Formula (ZI-3), and $Z^-$ in General Formula (ZI-4), an aromatic sulfonate anion represented by General Formula (SA1) is also preferable.

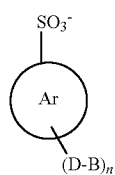
(SA1)

In Formula (SA1),

Ar represents an aryl group, and may further have a substituent other than a sulfonate anion and a -(D-B) group. Examples of the substituent which may be further contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonic ester group, an ester group, and a group formed by combination of two or more of these.

B represents a hydrocarbon group.

It is preferable that D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) are shown below.

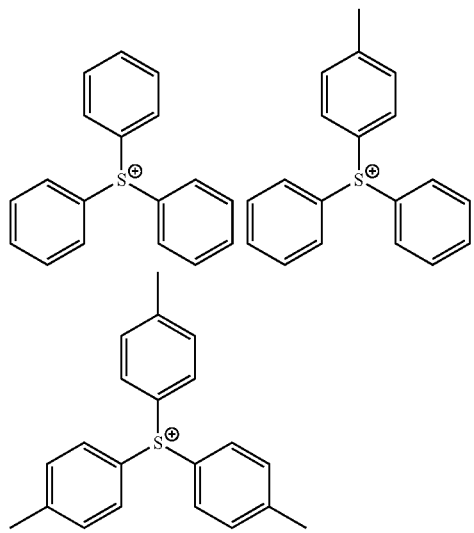

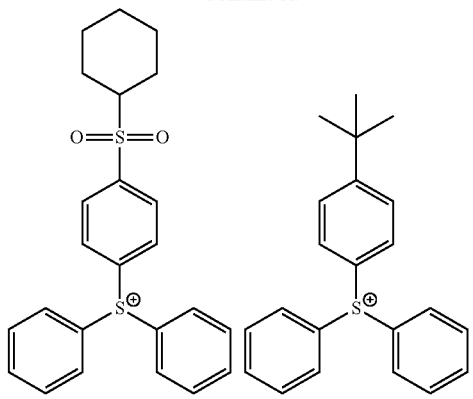

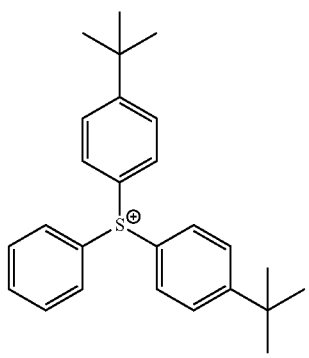

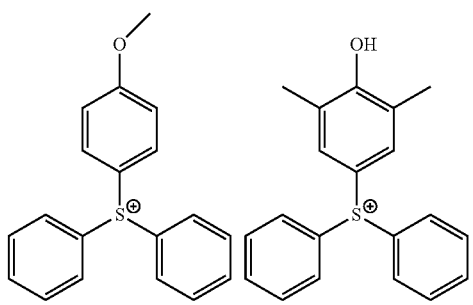

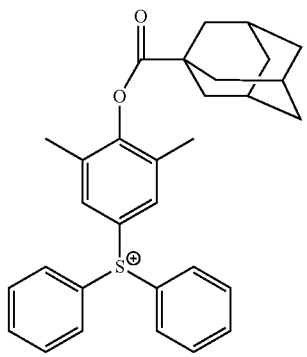

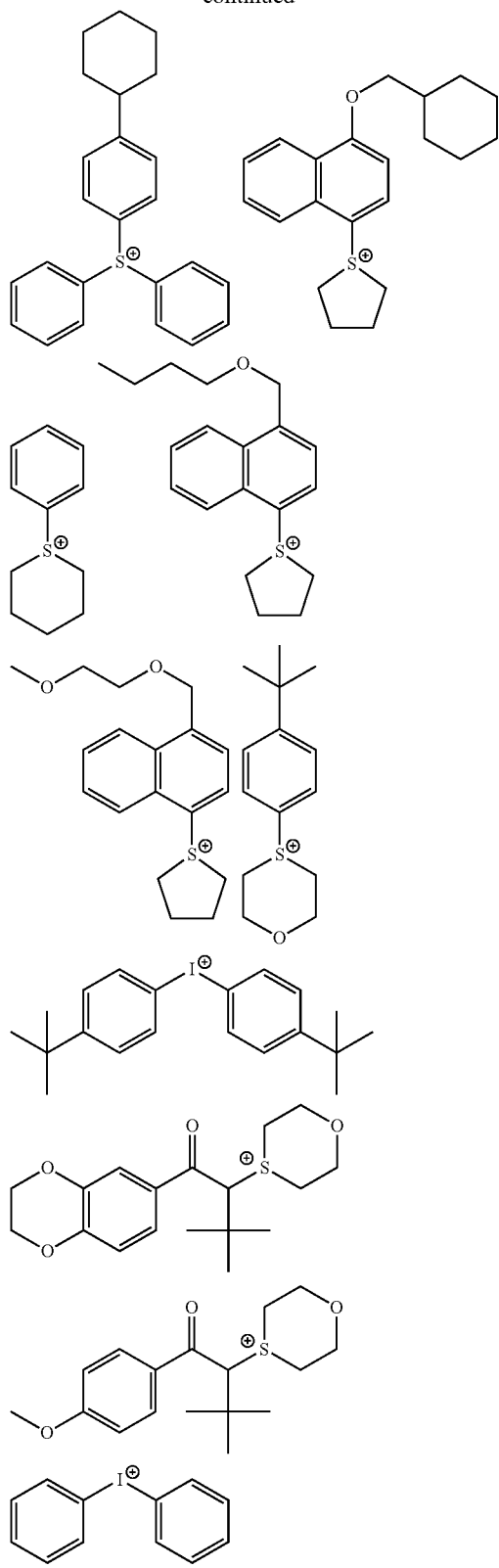
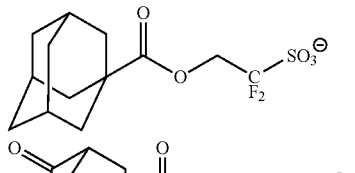
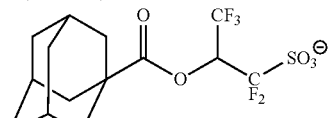
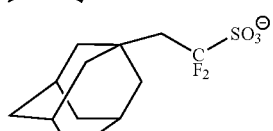
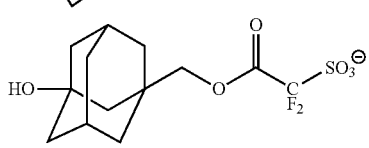
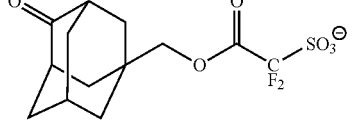
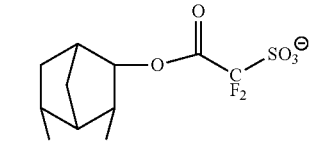
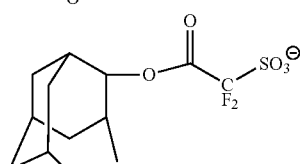
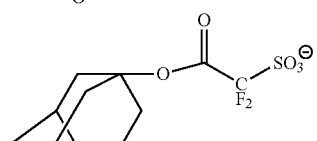
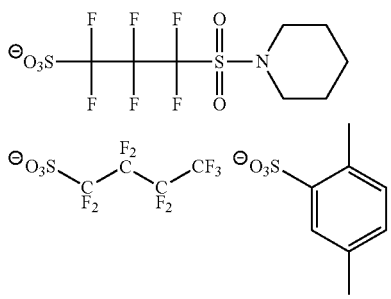
Preferred examples of the anion $Z^-$ in General Formula (ZI), the anion $Z^-$ in General Formula (ZII), $Zc^-$ in General Formula (ZI-3), and $Z^-$ in General Formula (ZI-4) are shown below.

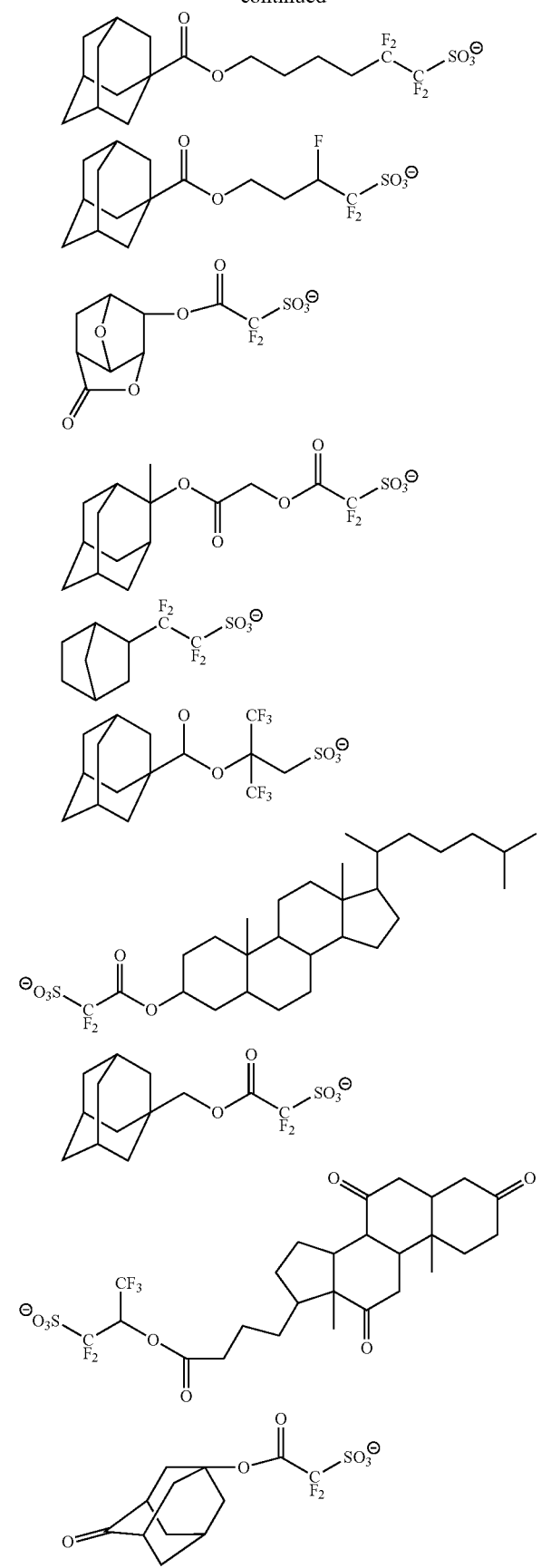
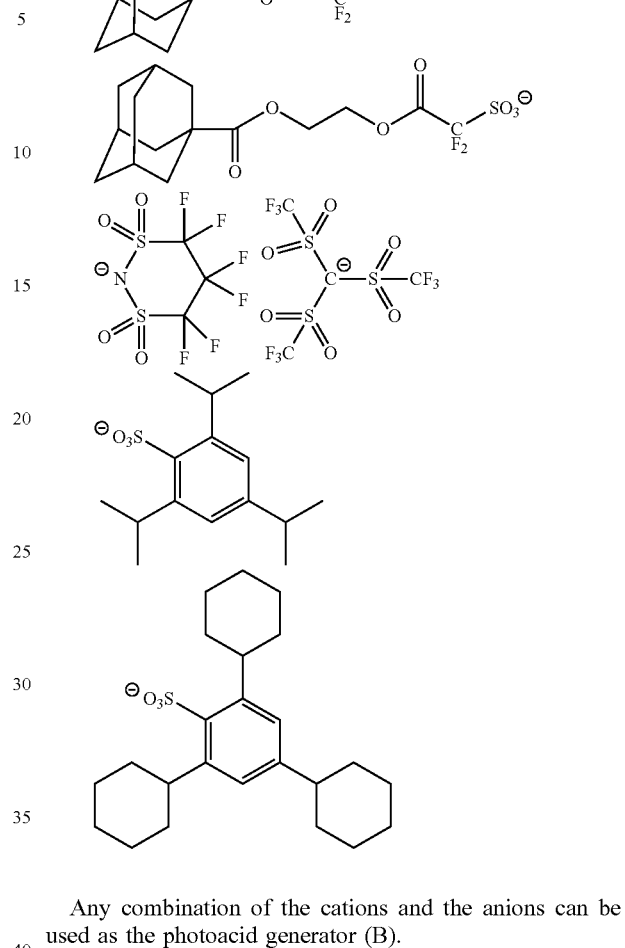

Any combination of the cations and the anions can be used as the photoacid generator (B).

The photoacid generator (B) may be in a form of a low-molecular-weight compound or a form incorporated into a part of a polymer. Further, a combination of the form of a low-molecular-weight compound and the form incorporated into a part of a polymer may also be used.

The photoacid generator (B) is preferably in the form of a low-molecular-weight compound.

In a case where the photoacid generator (B) is in the form of a low-molecular-weight compound, the molecular weight is preferably 3,000 or less, more preferably 2,000 or less, and still more preferably 1,000 or less.

In a case where the photoacid generator (B) is incorporated into a part of a polymer, it may be incorporated into a part of the resin (A) described above or into a resin other than the resin (A).

The photoacid generators (B) may be used singly or in combination of two or more kinds thereof.

A content of the photoacid generator (B) (in a case where the photoacid generators are present in a plurality of kinds, a total content thereof) in the composition is preferably 0.1% to 35.0% by mass, more preferably 0.5% to 25.0% by mass, and still more preferably 3.0% to 20.0% by mass, with respect to a total solid content of the composition.

In a case where the compound represented by General Formula (ZI-3) or (ZI-4) is included as the photoacid generator, a content of the photoacid generator included in the composition (in a case where the photoacid generators are present in a plurality of kinds, a total content thereof) is preferably 5% to 35% by mass, and more preferably 7% to 30% by mass, with respect to the total solid content of the composition.

[Acid Diffusion Control Agent (C)]

The composition of the embodiment of the present invention may include an acid diffusion control agent as long as the effect of the present invention is not impaired.

The acid diffusion control agent (C) acts as a quencher that suppresses a reaction of the acid-decomposable resin in the unexposed portion by excessive generated acids by trapping the acids generated from an acid generator and the like upon exposure. As the acid diffusion control agent (C), for example, a basic compound (CA), a basic compound (CB) having a basicity which is reduced or lost upon irradiation with actinic ray or radiation, an onium salt (CC) which is a weak acid relative to an acid generator, a low-molecular-weight compound (CD) having a nitrogen atom and a group that leaves by the action of an acid, an onium salt compound (CE) having a nitrogen atom in the cationic moiety, can be used as the acid diffusion control agent. In the composition of the embodiment of the present invention, a known acid diffusion control agent can be appropriately used. For example, the known compounds disclosed in paragraphs <0627> to <0664> of the specification of US2016/0070167A1, paragraphs <0095> to <0187> of the specification of US2015/0004544A1, paragraphs <0403> to <0423> of the specification of US2016/0237190A1, and paragraphs <0259> to <0328> of the specification of US2016/0274458A1 can be suitably used as the acid diffusion control agent (C).

As the basic compound (CA), compounds having structures represented by Formulae (A) to (E) are preferable.

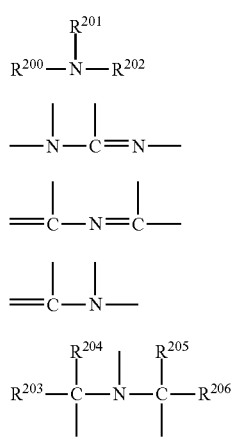

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{20}1$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (CA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (CB) having a basicity which is reduced or lost upon irradiation with actinic rays or radiation (hereinafter also referred to as a "compound (CB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to 7t-conjugation. The nitrogen atom having an unshared electron pair not contributing to n-conjugation is, for example, a nitrogen atom having a partial structure represented by the following formula.

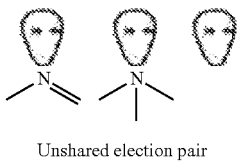

Unshared election pair

Preferred examples of the partial structure of the proton-accepting functional group include a crown ether structure, an azacrown ether structure, primary to tertiary amine structures, a pyridine structure, an imidazole structure, and a pyrazine structure.

The compound (CB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (CB) having the proton-accepting functional group and the proton.

The proton-accepting properties can be confirmed by performing pH measurement.

The acid dissociation constant pKa of the compound generated by decomposition of the compound (CB) upon irradiation with actinic rays or radiation preferably satisfies pKa <−1, more preferably satisfies −13<pKa <−1, and still more preferably satisfies −13<pKa <−3.

<<Measurement of Acid Dissociation Constant pKa>>

In the present specification, the acid dissociation constant pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.), and a lower value thereof indicates higher acid strength. Specifically, the acid dissociation constant pKa in an aqueous solution can be actually measured by using an infinite-dilution aqueous solution and measuring the acid dissociation constant at 25° C., and the acid dissociation constant pKa can also be determined using the following software package 1 by computation from a value based on a Hammett substituent constant and the database of publicly known literature values. All of the values of pKa described in the present specification represent values determined by computation using the software package.

Software Package 1: Advanced Chemistry Development (ACD/Labs) Software V 8.14 for Solaris (1994-2007 ACD/Labs)

In the composition of the embodiment of the present invention, the onium salt (CC) which is a weak acid relative to an acid generator can be used as the acid diffusion control agent.

In a case where the acid generator and the onium salt that generates an acid which is a weak acid relative to an acid generated from the acid generator are mixed and used, an acid generated from the acid generator upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

As the onium salt which is a weak acid relative to the acid generator, compounds represented by General Formulae (dl-1) to (dl-3) are preferable.

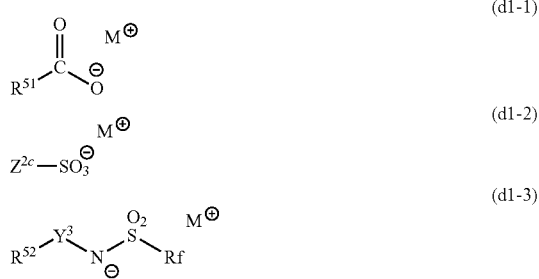

In the formula, $R^{51}$ is a hydrocarbon group which may have a substituent, $Z^{2c}$ is a hydrocarbon group having 1 to 30 carbon atoms, which may have a substituent (provided that carbon adjacent to S is not substituted with a fluorine atom), $R^{52}$ is an organic group, $Y^3$ is a linear, branched or cyclic alkylene group or an arylene group, Rf is a hydrocarbon group including a fluorine atom, and M's are each independently an ammonium cation, a sulfonium cation, or an iodonium cation.

Preferred examples of the sulfonium cation or iodonium cation represented by M* include the sulfonium cation exemplified for General Formula (ZI) and the iodonium cation exemplified for General Formula (ZII).

The onium salt (CC) which is a weak acid relative to an acid generator may be a compound having a cationic moiety and an anionic moiety in the same molecule, in which the cationic moiety and the anionic moiety are linked by a covalent bond (hereinafter also referred to as a "compound (CCA)").

The compound (CCA) is preferably a compound represented by any of General Formulae (C-1) to (C-3).

In General Formulae (C-1) to (C-3), $R_1$, $R_2$, and $R_3$ each independently represent a substituent having 1 or more carbon atoms.

$L_1$ represents a divalent linking group that links a cationic moiety with an anionic moiety, or a single bond. —$X^-$ represents an anionic moiety selected from —COO$^-$, —SO$_3^-$, —SO$_2^-$, and —N$^-$ $R_4$. $R_4$ represents a monovalent substituent having at least one of a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to each other to form a ring structure. Further, in General Formula (C-3), two of $R_1$ to $R_3$ together represent one divalent substituent, and may be bonded to an N atom through a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, the alkyl group, a cycloalkyl group, or the aryl group is preferable.

Examples of $L_1$ as a divalent linking group include a linear or branched alkylene group, a cycloalkylene group, an arylene group, a carbonyl group, an ether bond, an ester bond, an amide bond, an urethane bond, an urea bond, and a group formed by combination of two or more of these groups. $L_1$ is preferably the alkylene group, the arylene group, the ether bond, the ester bond, and the group formed by combination of two or more of these groups.

The low-molecular-weight compound (CD) having a nitrogen atom and having a group that leaves by the action of an acid (hereinafter also referred to as a "compound (CD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (CD) is preferably 100 to 1,000, more preferably 100 to 700, and still more preferably 100 to 500.

The compound (CD) may have a carbamate group having a protective group on the nitrogen atom. The protective group constituting the carbamate group is represented by General Formula (d-1).

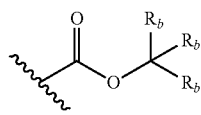

(d-1)

In General Formula (d-1),

Rb's each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). Rb's may be linked to each other to form a ring.

The alkyl group, the cycloalkyl group, the aryl group, or the aralkyl group represented by Rb may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by Rb.

As Rb, a linear or branched alkyl group, a cycloalkyl group, or an aryl group is preferable, and the linear or branched alkyl group, or the cycloalkyl group is more preferable.

Examples of the ring formed by the mutual linking of two of Rb's include an alicyclic hydrocarbon, an aromatic hydrocarbon, a heterocyclic hydrocarbon, and derivatives thereof.

Examples of the specific structure of the group represented by General Formula (d-1) include, but are not limited to, the structures disclosed in paragraph <0466> of the specification of US2012/0135348A1.

The compound (CD) preferably has a structure represented by General Formula (6).

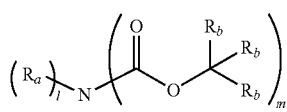

(6)

In General Formula (6), l represents an integer of 0 to 2, m represents an integer of 1 to 3, and these satisfy l+m=3.

$R^a$ represents a hydrogen atom, an alkyl group, a cycloalkyl group, an aryl group, or an aralkyl group. In a case where l is 2, two of $R^a$'s may be the same as or different from each other, and the two of $R^a$'s may be linked to each other to form a heterocycle with the nitrogen atom in the formula. This heterocycle may include a heteroatom other than the nitrogen atom in the formula.

Rb has the same definition as Rb in General Formula (d-1), and preferred examples are also the same.

In General Formula (6), the alkyl group, the cycloalkyl group, the aryl group, and the aralkyl group as $R^a$ may be each independently substituted with the same groups as the group mentioned above as a group which may be substituted in the alkyl group, the cycloalkyl group, the aryl group, and the aralkyl group as Rb.

Specific examples of the alkyl group, the cycloalkyl group, the aryl group, and the aralkyl group (such the alkyl group, the cycloalkyl group, the aryl group, and the aralkyl group may be substituted with the groups as described above) of $R^a$ include the same groups as the specific examples as described above with respect to Rb.

Specific examples of the particularly preferred compound (CD) in the present invention include, but are not limited to, the compounds disclosed in paragraph <0475> of the specification of US2012/0135348A1.

The onium salt compound (CE) having a nitrogen atom in the cationic moiety (hereinafter also referred to as a "compound (CE)") is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Specific preferred examples of the compound (CE) include, but are not limited to, the compounds disclosed in paragraph <0203> of the specification of US2015/0309408A1. Preferred examples of the acid diffusion control agent (C) are shown below.

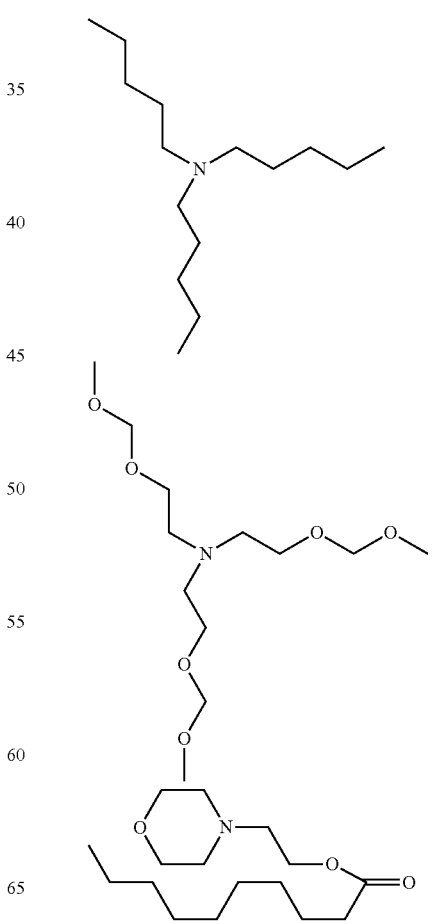

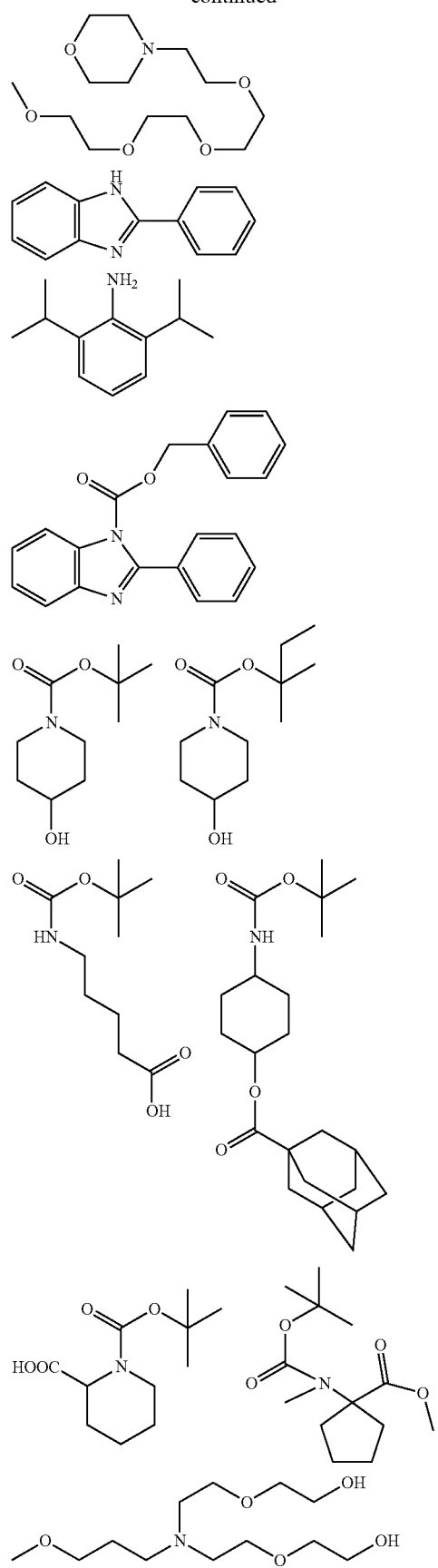
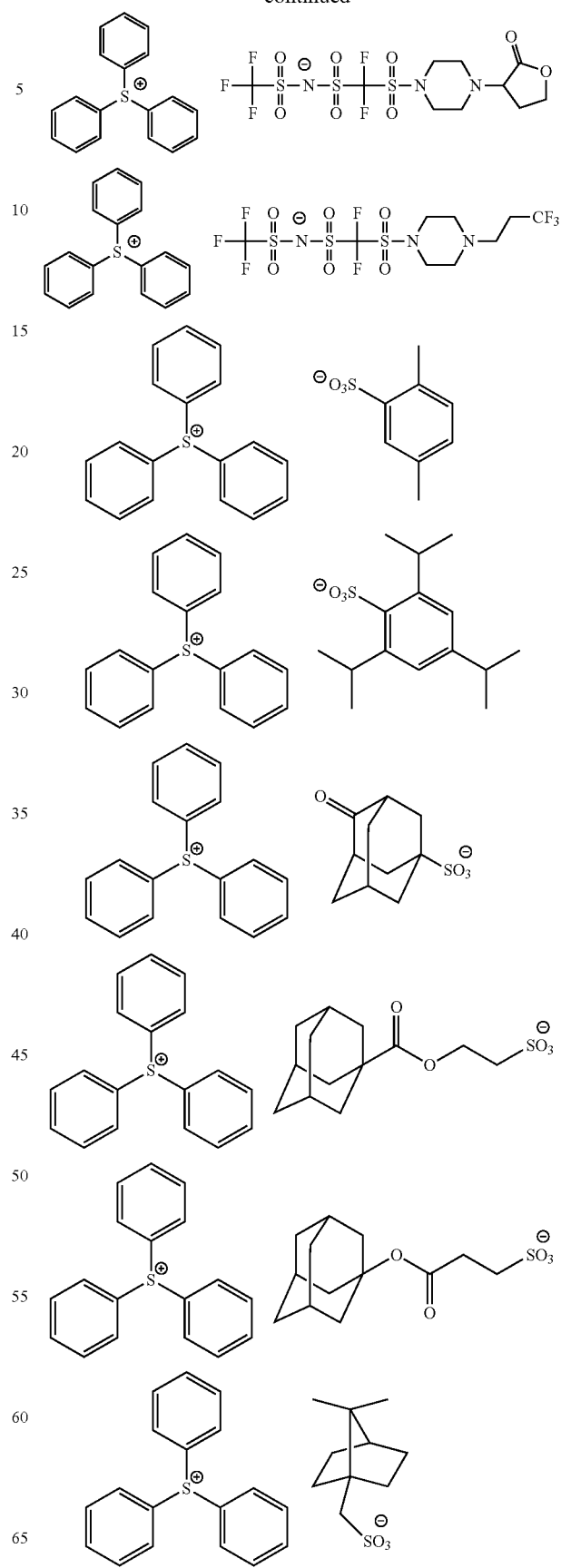

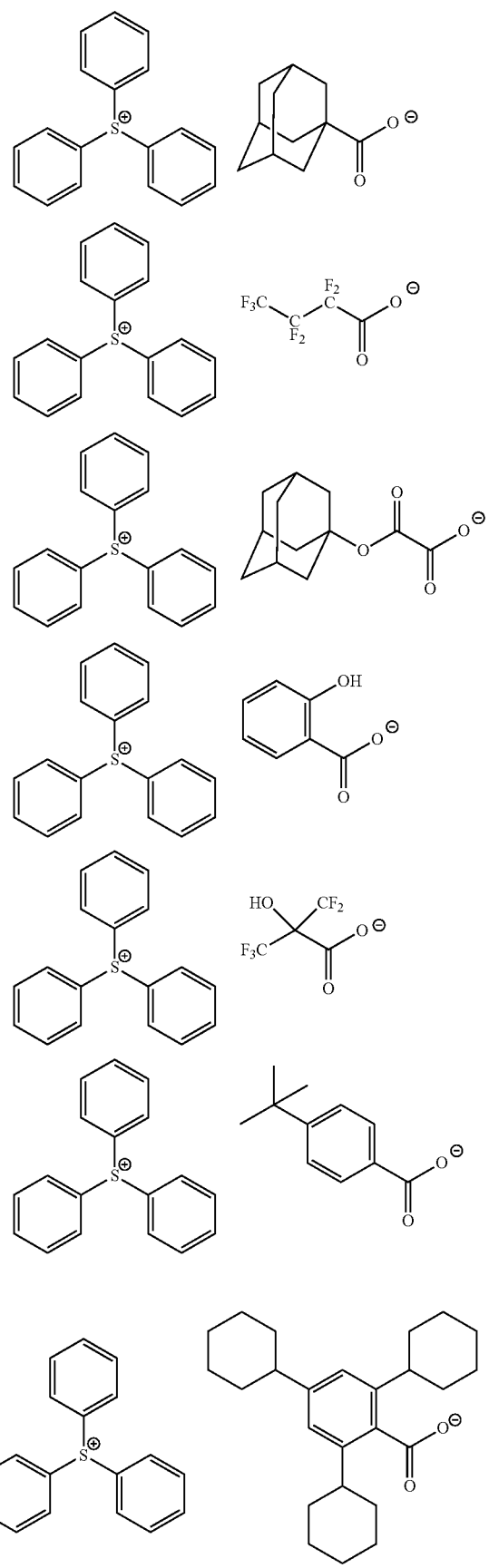
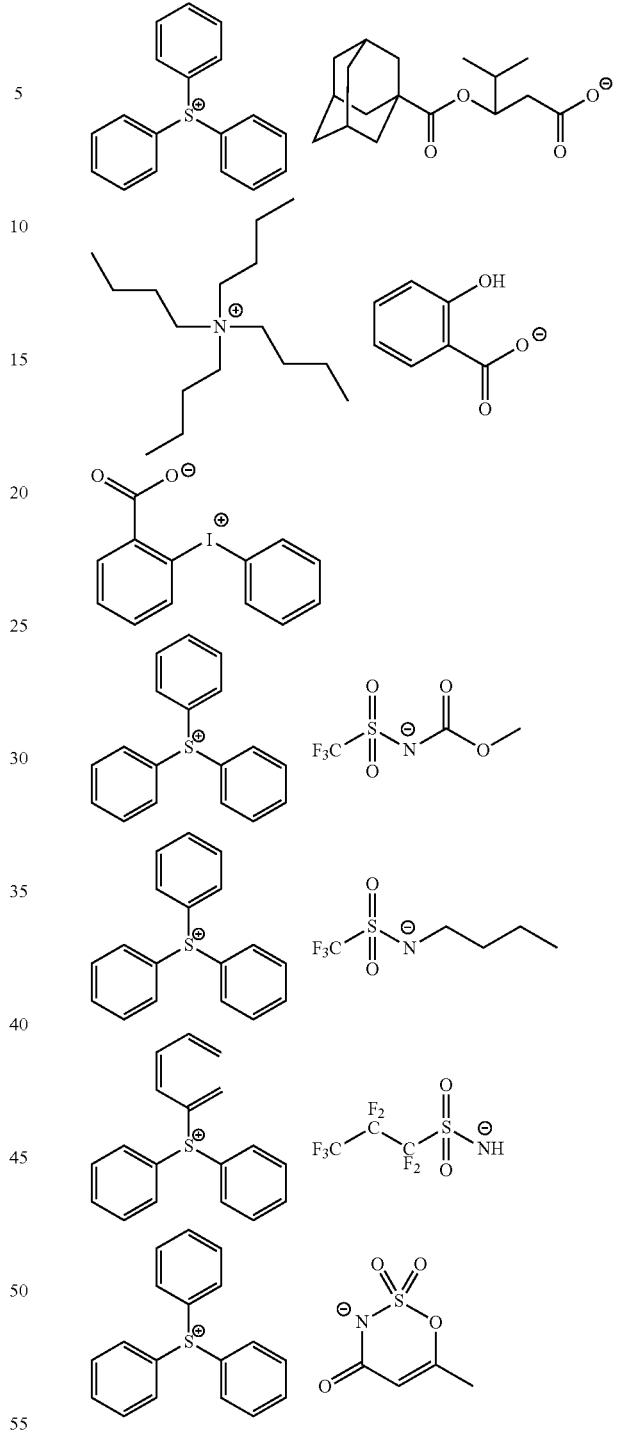

In the composition of the embodiment of the present invention, the acid diffusion control agents (C) may be used singly or in combination of two or more kinds thereof.

In a case where the composition includes the acid diffusion control agent (C), a content of the acid diffusion control agent (C) (in a case where the acid diffusion control agents (C) are present in a plural number, a total content thereof) is preferably 0.1% to 10.0% by mass, and more preferably 0.1% to 5.0% by mass, with respect to the total solid content of the composition.

[Hydrophobic Resin (D)]

The composition of the embodiment of the present invention may include a hydrophobic resin (D). Further, the hydrophobic resin (D) is preferably a resin different from the resin (A) and the resin (AX).

By incorporation of the hydrophobic resin (D) into the composition of the embodiment of the present invention, the static/dynamic contact angle on the surface of the actinic ray-sensitive or radiation-sensitive film can be controlled. Thus, it is possible to improve development characteristics, suppress generation of out gas, improve immersion liquid tracking properties upon liquid immersion exposure, and reduce liquid immersion defects, for example.

Although the hydrophobic resin (D) is preferably designed to be unevenly localized on the surface of the resist film, it does not necessarily need to have a hydrophilic group in its molecule as different from the surfactant, and may not contribute to homogeneous mixing of polar/nonpolar materials.

The hydrophobic resin (D) is preferably a resin having a repeating unit having at least one selected from the group consisting of a "fluorine atom", a "silicon atom", or a "$CH_3$ partial structure which is contained in a side chain portion of a resin" from the viewpoint of uneven distribution on the film surface layer.

In a case where the hydrophobic resin (D) includes a fluorine atom and/or a silicon atom, the fluorine atom and/or the silicon atom in the hydrophobic resin (D) may be included in the main chain or a side chain of the resin.

In a case where the hydrophobic resin (D) includes a fluorine atom, it is preferably a resin which has an alkyl group having a fluorine atom, a cycloalkyl group having a fluorine atom, or an aryl group having a fluorine atom, as a partial structure having a fluorine atom.

The hydrophobic resin (D) preferably has at least one group selected from the group of the following (x) to (z).

(x) an acid group,
(y) a group having a solubility in an alkali developer that is increased upon decomposition by the action of an alkali developer (hereinafter also referred to as a polarity conversion group), and
(z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably a hexafluoroisopropanol group), the sulfonimido group, or the bis(alkylcarbonyl)methylene group is preferable.

Examples of the group (y) having a solubility in an alkali developer that is increased upon decomposition by the action of the alkali developer include a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—), and a sulfonic ester group (—SO$_2$O—), and the lactone group or the carboxylic ester group (—COO—) is preferable.

The repeating unit including such the group is, for example, a repeating unit in which the group is directly bonded to the main chain of a resin, and examples thereof include a repeating unit with an acrylic ester or a methacrylic ester. In this repeating unit, such the group may be bonded to the main chain of the resin via a linking group. Alternatively, this repeating unit may also be incorporated into a terminal of the resin by using a polymerization initiator or a chain transfer agent having such the group during polymerization.

Examples of the repeating unit having a lactone group include those similar to the repeating unit having a lactone structure described above in the section of resin (A).

A content of the repeating unit having a group (y) having a solubility in an alkali developer that is increased upon decomposition by the action of the alkali developer is preferably 1% to 100% by mole, more preferably 3% to 98% by mole, and still more preferably 5% to 95% by mole, with respect to all the repeating units in the hydrophobic resin (D).

Examples of the repeating unit having a group (z) that decomposes by the action of an acid in the hydrophobic resin (D) include the same ones as those of the acid-decomposable repeating unit described for the resin (A). The repeating unit having a group (z) that decomposes by the action of an acid may have at least any one of a fluorine atom or a silicon atom. A content of the repeating unit having a group (z) that decomposes by the action of an acid is preferably 1% to 80% by mole, more preferably 10% to 80% by mole, and still more preferably 20% to 60% by mole, with respect to all the repeating units in the hydrophobic resin (D).

The hydrophobic resin (D) may further have a repeating unit different from the above-mentioned repeating units.

The repeating unit having a fluorine atom is preferably 10% to 100% by mole, and more preferably 30% to 100% by mole, with respect to all the repeating units in the hydrophobic resin (D). Further, the repeating unit having a silicon atom is preferably 10% to 100% by mole, and more preferably 20% to 100% by mole, with respect to all the repeating units in the hydrophobic resin (D).

On the other hand, in particular, in a case where the hydrophobic resin (D) includes a $CH_3$ partial structure in a side chain portion, a form in which the hydrophobic resin (D) does not substantially include a fluorine atom and a silicon atom is also preferable. Further, it is preferable that the hydrophobic resin (D) is constituted with substantially only a repeating unit constituted with only an atom selected from a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000, and more preferably 1,000 to 50,000.

A total content of the residual monomers and/or oligomer components included in the hydrophobic resin (D) is preferably 0.01% to 5% by mass, and more preferably 0.01% to 3% by mass. In addition, the dispersity (Mw/Mn) is preferably in the range of 1 to 5, and more preferably in the range of 1 to 3.

As the hydrophobic resin (D), a known resin can be appropriately selected and used singly or in mixture. For example, the known resins disclosed in paragraphs <0451> to <0704> of the specification of US2015/0168830A1 and paragraphs <0340> to <0356> of the specification of US2016/0274458A1 can be suitably used as the hydrophobic resin (D). In addition, the repeating units disclosed in paragraphs <0177> to <0258> of the specification of US2016/0237190A1 are also preferable as the repeating units constituting the hydrophobic resin (D).

Preferred examples of the monomer corresponding to the repeating unit constituting the hydrophobic resin (D) are shown below.
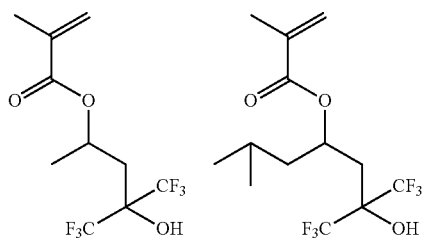
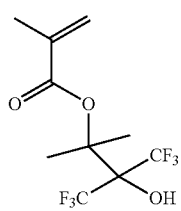
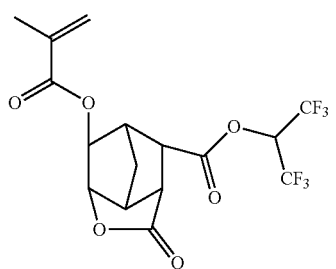
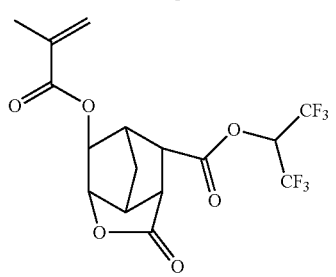
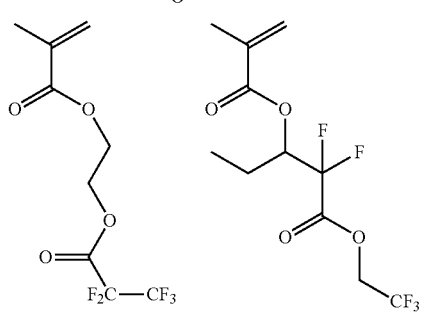
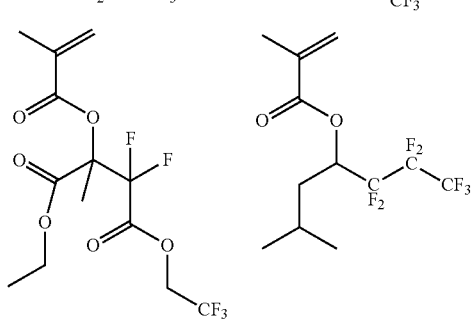
-continued
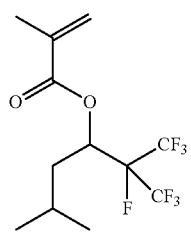
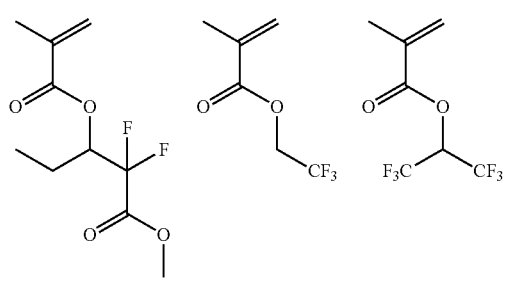
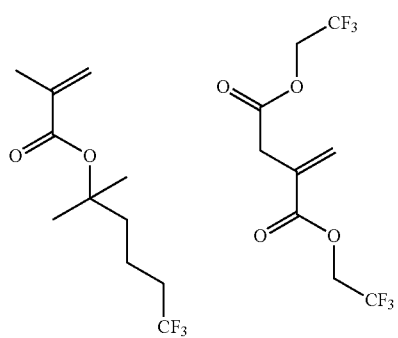
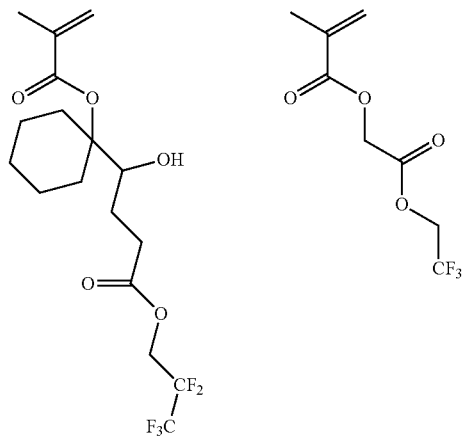
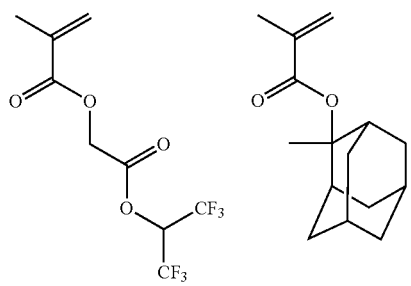

-continued

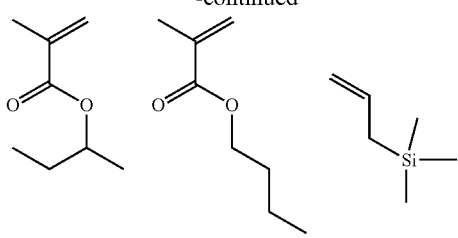

-continued

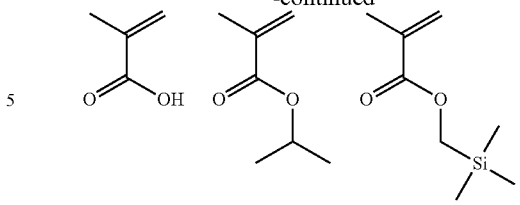

The hydrophobic resin (D) may be used singly or in combination of two or more kinds thereof.

It is preferable to use a mixture of two or more kinds of hydrophobic resins (D) having different levels of surface energy from the viewpoint of satisfying both the immersion liquid tracking properties and the development characteristics upon liquid immersion exposure.

A content of the hydrophobic resin (D) in the composition is preferably 0.01% to 10.0% by mass, and more preferably 0.05% to 8.0% by mass, with respect to the total solid content in the composition.

[Solvent (E)]

The composition of the embodiment of the present invention may include a solvent.

In the composition of the embodiment of the present invention, a known resist solvent can be appropriately used. For example, the known solvents disclosed in paragraphs <0665> to <0670> of the specification of US2016/0070167A1, paragraphs <0210> to <0235> of the specification of US2015/0004544A1, paragraphs <0424> to <0426> of the specification of US2016/0237190A1, and paragraphs <0357> to <0366> of the specification of US2016/0274458A1 can be suitably used.

Examples of the solvent which can be used in preparation of the composition include organic solvents such as alkylene glycol monoalkyl ether carboxylate, alkylene glycol monoalkyl ether, alkyl lactate, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxyl group in the structure and a solvent having no hydroxyl group may be used.

As the solvent having a hydroxyl group and the solvent having no hydroxyl group, the above-exemplified compounds can be appropriately selected, but as the solvent having a hydroxyl group, alkylene glycol monoalkyl ether or alkyl lactate is preferable, and propylene glycol monomethyl ether (PGME), propylene glycol monoethyl ether (PGEE), methyl 2-hydroxyisobutyrate, or ethyl lactate is more preferable. Further, as the solvent having no hydroxyl group, alkylene glycol monoalkyl ether acetate, alkyl alkoxypropionate, a monoketone compound which may have a ring, a cyclic lactone, alkyl acetate, or the like is preferable, and among these, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone are more preferable. As a solvent having no hydroxyl group, propylene carbonate is also preferable.

A mixing ratio (mass ratio) of the solvent having a hydroxyl group to the solvent having no hydroxyl group is 1/99 to 99/1, preferably 10/90 to 90/10, and more preferably 20/80 to 60/40. A mixed solvent including 50% by mass or more of the solvent having no hydroxyl group is preferable from the viewpoint of coating evenness.

The solvent preferably includes propylene glycol monomethyl ether acetate, and may be a single solvent of propylene glycol monomethyl ether acetate or a mixed solvent of two or more kinds including propylene glycol monomethyl ether acetate.

[Crosslinking Agent (F)]

The composition of the embodiment of the present invention may include a compound (hereinafter also referred to as a crosslinking agent (F)) which crosslinks a resin by the action of an acid. As the crosslinking agent (F), a known compound can be appropriately used. For example, the known compounds disclosed in paragraphs <0379> to <0431> of the specification of US2016/0147154A1 and paragraphs <0064> to <0141> of the specification of US2016/0282720A1 can be suitably used as the crosslinking agent (F).

The crosslinking agent (F) is a compound having a crosslinkable group capable of crosslinking a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (F) is preferably a compound (also including a resin) having two or more crosslinkable groups.

The crosslinking agent (F) is more preferably a phenol derivative having a hydroxymethyl group or an alkoxymethyl group, a urea compound (a compound having a urea structure) or a melamine compound (a compound having a melamine structure).

The crosslinking agents may be used singly or in combination of two or more kinds thereof.

A content of the crosslinking agent (F) is preferably 1.0% to 50% by mass, more preferably 3.0% to 40% by mass, and still more preferably 5.0% to 30% by mass, with respect to the total solid content of the resist composition.

[Surfactant (G)]

The composition of the embodiment of the present invention may include a surfactant. In a case where a surfactant is included, a fluorine-based and/or silicon-based surfactant (specifically a fluorine-based surfactant, a silicon-based surfactant, or a surfactant having both a fluorine atom and a silicon atom) is preferable.

By incorporating the surfactant into the composition of the embodiment of the present invention, in a case where an exposure light source of 250 nm or less, in particular, 220 nm or less is used, it is possible to obtain a pattern with good sensitivity and resolution and excellent adhesiveness and less development defects.

Examples of the fluorine-based and/or silicon-based surfactants include the surfactants described in paragraph <0276> of the specification of US2008/0248425A.

In addition, another surfactant other than the fluorine-based and/or silicon-based surfactants described in paragraph <0280> of the specification of US2008/0248425A can also be used.

These surfactants may be used singly or in combination of two or more kinds thereof.

In a case where the composition of the embodiment of the present invention includes a surfactant, a content of the surfactant is preferably 0.0001% to 2.0% by mass, and more preferably 0.0005% to 1.0% by mass, with respect to the total solid content of the composition.

On the other hand, in a case where the content of the surfactant is 10 ppm or more with respect to the total solid content of the composition, the uneven distribution of the hydrophobic resin (D) on surface is enhanced. As a result, the surface of the actinic ray-sensitive or radiation-sensitive film can be made more hydrophobic, and the water following property during liquid immersion exposure is improved.

[Other Additives]

The composition of the embodiment of the present invention may include other additives such as an acid proliferation agent, a dye, a plasticizer, a photosensitizer, a light absorber, an alkali-soluble resin, a dissolution inhibitor, and a dissolution accelerator.

[Preparation Method]

The concentration of the solid content in the composition of the embodiment of the present invention is usually preferably 1.0% to 10% by mass, more preferably 2.0% to 5.7% by mass, and still more preferably 2.0% to 5.3% by mass. The concentration of the solid content is a mass percentage of other resist components excluding the solvent with respect to the total mass of the composition.

In addition, the film thickness of an actinic ray-sensitive or radiation-sensitive film formed of the composition of the embodiment of the present invention is preferably 90 nm or less, and more preferably 85 nm or less, from the viewpoint of improving resolving power. Such a film thickness can be obtained by setting the concentration of the solid content in the composition to an appropriate range to provide the composition with a suitable viscosity and improve the coating property or the film forming property.

The composition of the embodiment of the present invention is used by dissolving the components in a predetermined organic solvent, and preferably the mixed solvent, and filtering the solution through a filter and applying it onto a predetermined support (substrate). The pore size of a filter for use in filtration through the filter is preferably pore size of 0.1 µm or less, more preferably 0.05 µm or less, and still more preferably 0.03 m or less. Further, in a case where the concentration of the solid content of the composition is high (for example, 25% by mass or more), the pore size of a filter used for filter filtration is preferably 3 µm or less, more preferably 0.5 µm or less, and still more preferably 0.3 µm or less. The filter is preferably a polytetrafluoroethylene-made, polyethylene-made, or nylon-made filter. In the filtration through a filter as shown in the specification of JP2002-062667A, circulating filtration may be performed or the filtration may be performed by connecting a plurality of kinds of filters in series or in parallel. In addition, the composition may be filtered in plural times. Furthermore, the composition may be subjected to a deaeration treatment or the like before or after filtration through a filter.

[Use]

The composition of the embodiment of the present invention relates to an actinic ray-sensitive or radiation-sensitive resin composition having properties which are changed by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, microelectromechanical systems (MEMS), or the like.

[Pattern Forming Method]

The present invention also relates to a pattern forming method using the actinic ray-sensitive or radiation-sensitive resin composition. Hereinafter, the pattern forming method of the embodiment of the present invention will be described. Further, the actinic ray-sensitive or radiation-sensitive film of the embodiment of the present invention will be described together with the description of the pattern forming method.

The pattern forming method of the embodiment of the present invention has:
(i) a step of forming a resist film (actinic ray-sensitive or radiation-sensitive film) on a support with the above-described actinic ray-sensitive or radiation-sensitive resin composition (resist film forming step),
(ii) a step of exposing the resist film (irradiating the resist film with actinic rays or radiation) (exposing step), and
(iii) a step of developing the exposed resist film with a developer (developing step).

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the film forming step (i), the exposing step (ii), and the developing step (iii) described above can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-described acid diffusion control agent.

A protective film may be formed on the upper layer of the resist film including the above-mentioned hydrophobic resin.

The support is not particularly limited, and a substrate which is generally used in a step of manufacturing a semiconductor such as an IC, and a step for manufacturing a circuit board for a liquid crystal, a thermal head, or the like, and other lithographic steps of photofabrication can be used. Specific examples of the support include an inorganic substrate such as silicon, $SiO_2$, and SiN.

For any of the prebaking step (iv) and the post-exposure baking step (v), the baking temperature is preferably 70° C. to 130° C., and more preferably 80° C. to 120° C.

For any of the prebaking step (iv) and the post-exposure baking step (v), the baking time is preferably 30 to 300 seconds, more preferably 30 to 180 seconds, and still more preferably 30 to 90 seconds.

The baking may be performed using a unit included in an exposure apparatus and a development device, or may also be performed using a hot plate or the like.

A light source wavelength used in the exposing step is not limited, and examples thereof include infrared rays, visible light, ultraviolet rays, far ultraviolet rays, extreme ultraviolet rays (EUV), X-rays, and electron beams. Among those, far ultraviolet rays are preferable, and a wavelength thereof is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, the KrF excimer laser, the ArF excimer laser, EUV, or the electron beams are preferable.

In the developing step (iii), the developer may be either an alkali developer or a developer including an organic solvent (hereinafter also referred to as an organic developer).

As the alkali developer, a quaternary ammonium salt typified by tetramethylammonium hydroxide is usually used, but in addition to this, an aqueous alkali solution such as an inorganic alkali, primary to tertiary amines, an alcoholamine, and a cyclic amine can also be used.

Furthermore, the alkali developer may include an appropriate amount of alcohols and/or a surfactant. The alkali concentration of the alkali developer is usually 0.1% to 20% by mass. The pH of the alkali developer is usually 10 to 15.

A time period for performing development the using the alkali developer is usually 10 to 300 seconds.

The alkali concentration, the pH, and the development time using the alkali developer can be appropriately adjusted depending on a pattern formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, still more preferably less than 10% by mass, and even still more preferably 0% to less than 5% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-described acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

The moisture content in the rinsing liquid is preferably 10% by mass or less, more preferably 5% by mass or less, and still more preferably 3% by mass or less. By setting the moisture content to 10% by mass or less, good development characteristics are obtained.

The rinsing liquid may include an appropriate amount of a surfactant.

In the rinsing step, the substrate that has been subjected to development using an organic developer is subjected to a washing treatment using a rinsing liquid including an organic solvent. A method for the washing treatment is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (postbaking). The developer and the rinsing liquid remaining between and inside the patterns are removed by the baking step. In the baking step after the rinsing step, the baking temperature is usually 40° C. to 160° C., and preferably 70° C. to 95° C., and the baking time is typically 10 seconds to 3 minutes, and preferably 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention include no impurities such as metal components, isomers, and residual monomers. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filtration using a filter, a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. It is also preferable to perform a glass lining treatment in all steps of the manufacturing facility for synthesizing various materials (a resin, a photoacid generator, and the like) of the resist component in order to reduce impurities such as metals to a ppt order. Preferred conditions in the filtering using a filter to be performed on the raw material constituting the various materials are the same as the above-described conditions.

In order to prevent impurities from being incorporated, it is preferable that various materials are stored in the container described in US2015/0227049A, JP2015-123351A, JP2017-013804A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in the Examples below may be modified as appropriate as long as the modifications do not depart from the spirit of the present invention. Therefore, the scope of the present invention should not be construed as being limited to the Examples shown below.

[Various Components]

Hereinafter, first, various components constituting the composition of the embodiment of the present invention will be shown.

[Resins]

<Resin A-1 to A-12, and Resin B-1>

Resins A-1 to A-12 and Resin B-1 for Comparative Example shown in Table 3 are shown below.

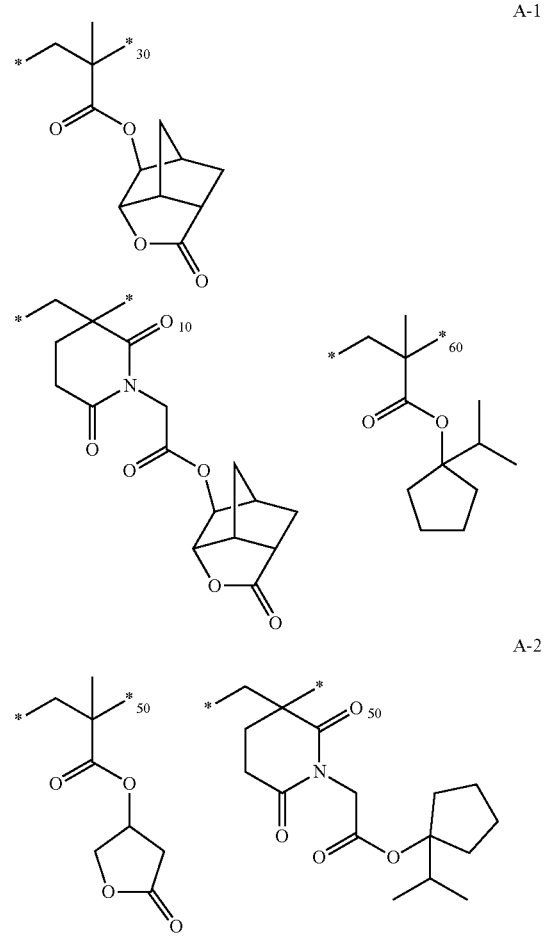

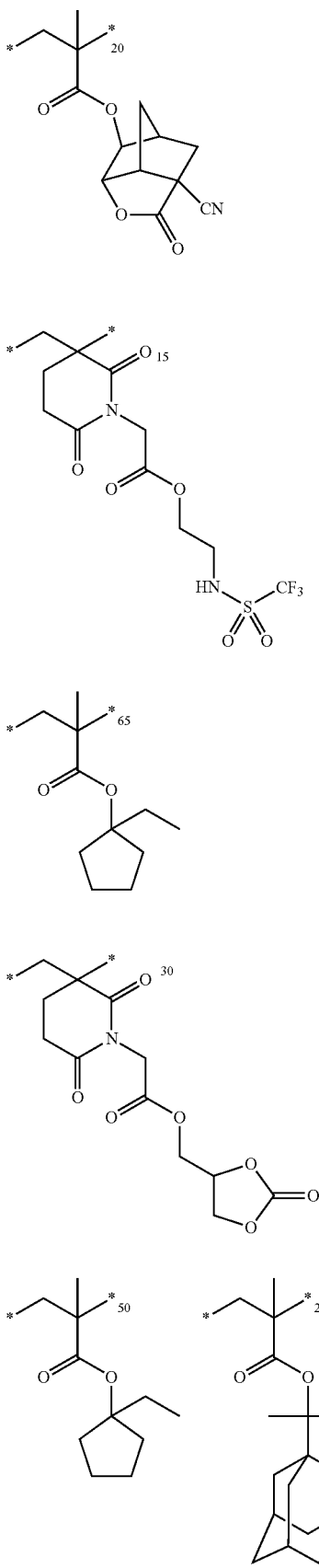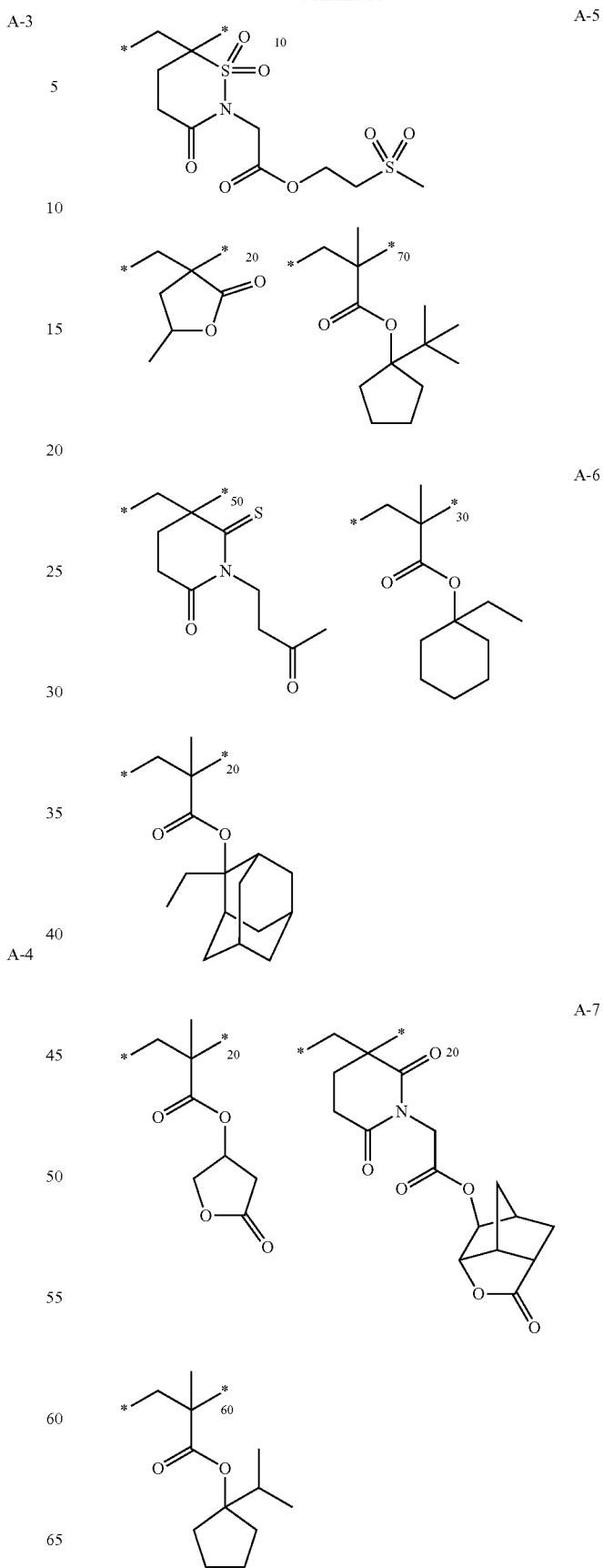

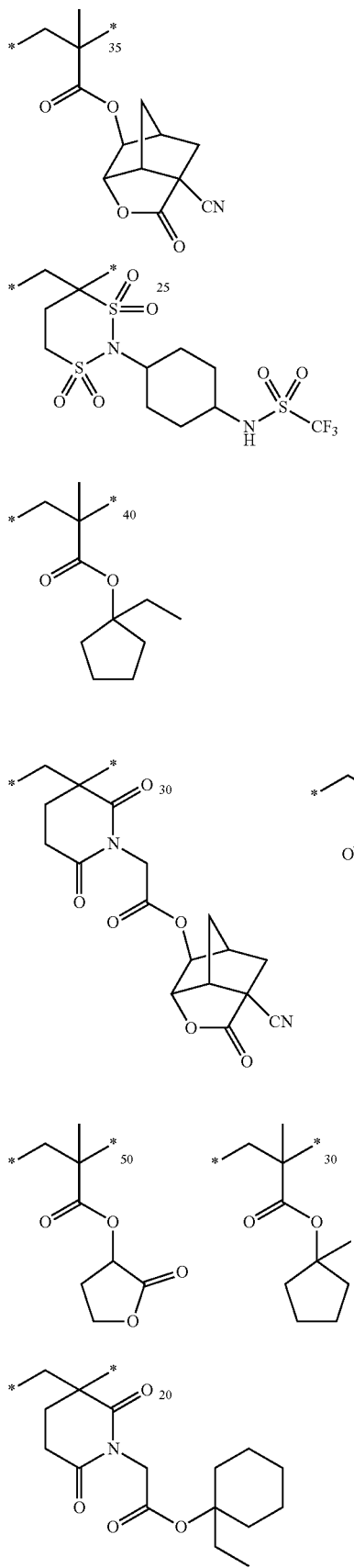
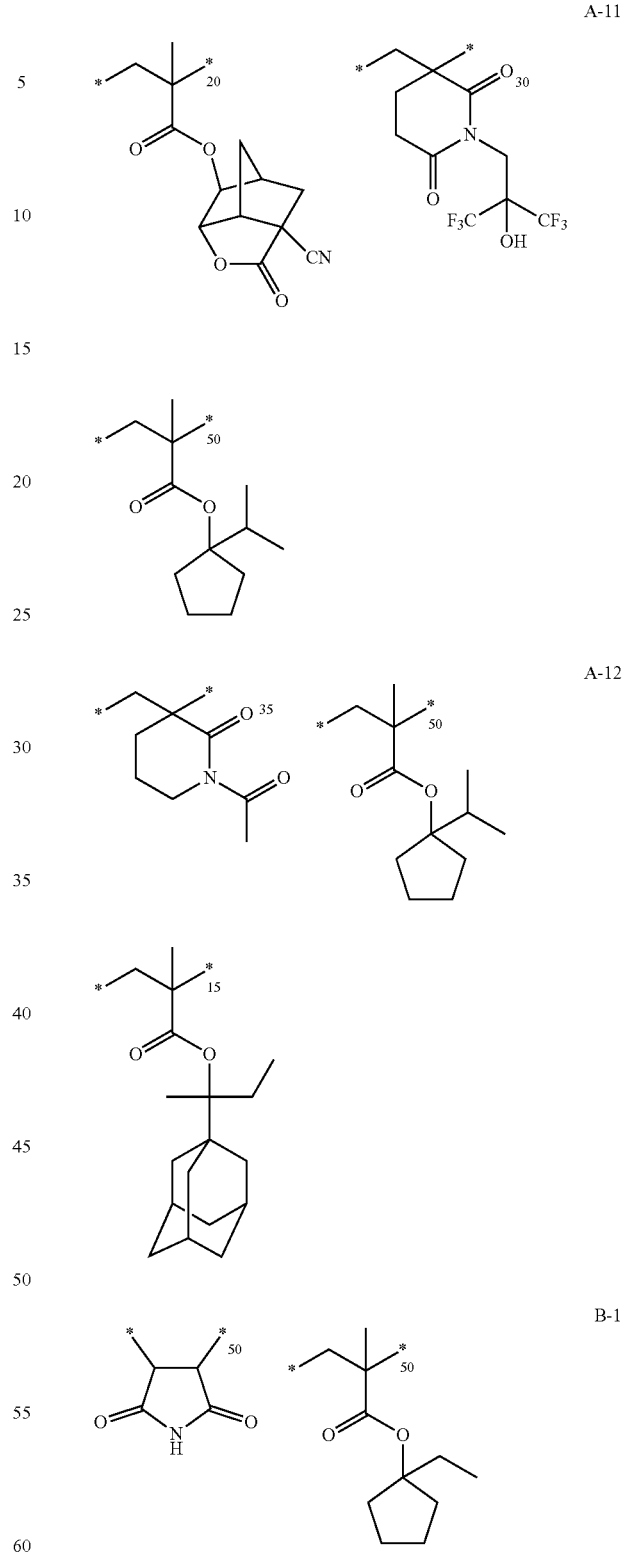
(Synthesis Examples of Raw Material Monomers)
The monomers (raw material monomers X1 to X12) which are the raw materials for the repeating units represented by General Formula (1) in the resins A-1 to A-12 shown in Table 3 are shown below.

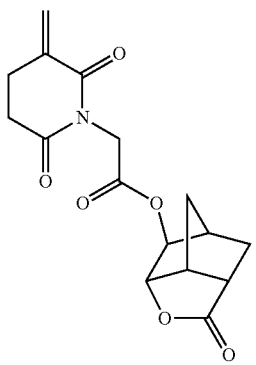
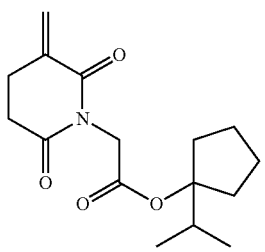
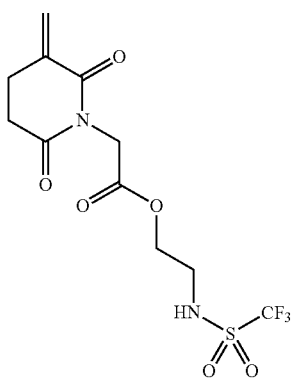
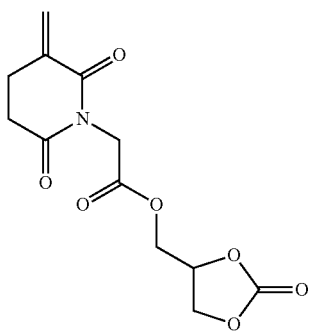
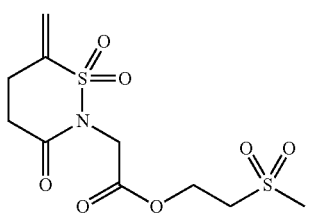
X1
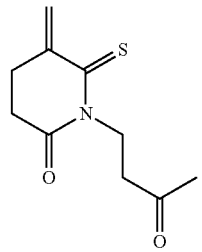
X2
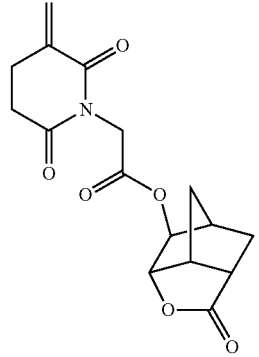
X3
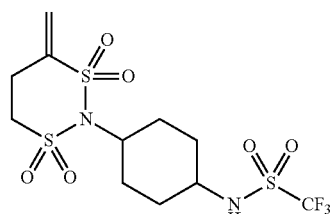
X4
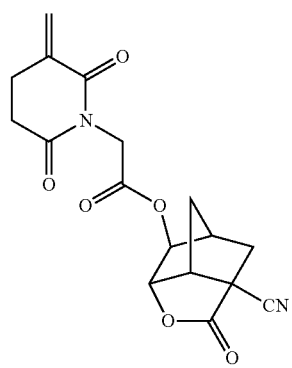
X5
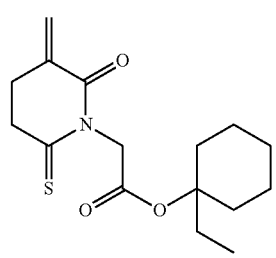
X6
X7
X8
X9
X10

X11

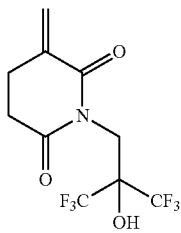

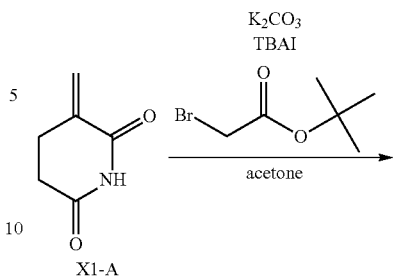

X1-A

X12

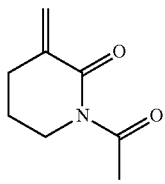

Synthesis examples of raw material monomers are shown below.

Synthesis Example: Synthesis of Raw Material Monomer X1

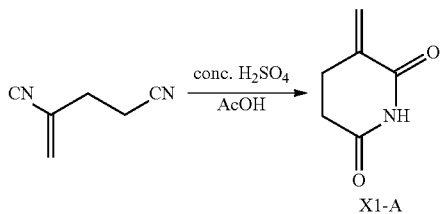

Concentrated sulfuric acid (344.0 g), acetic acid (1,200 mL), water (64 mL), and di-tert-butylhydroxytoluene (1.5 g) were stirred at 85° C. Then, a mixed solution of 2-methyl-eneglutaronitrile (296.0 g) and acetic acid (240 mL) was added dropwise to the obtained solution. After the dropwise addition, the mixture was stirred at 85° C. for 4 hours. Thereafter, the air-cooled reaction solution was added to an aqueous sodium hydroxide solution (1,000 g of sodium hydroxide/2,000 mL of water). The obtained aqueous solution was extracted twice with chloroform, and the combined organic layer was separated and washed with water. Then, the organic layer was dried over sodium sulfate and filtered, and the filtrate was concentrated to obtain a solid crude product.

Next, acetone was added to the crude product and the solid was dissolved by stirring at 50° C. Further, diisopropyl ether was added to the obtained solution and stirred at 0° C. to precipitate a white solid. The precipitated white solid was collected by filtration to obtain 72.5 g of X1-A (yield: 21%).

$^1$H-NMR, 400 MHz, δ ((CDCl$_3$) ppm: 2.66-2.77 (4H, m), 5.68 (1H, s), 6.37 (1H, s), 8.09 (1H, s)

X1-A (67.0 g), potassium carbonate (148.0 g), and tetra-butylammonium iodide (TBAI, 40.0 g) were added to acetone (1,200 g), and the mixture was stirred at room temperature. Tertiary butyl bromoacetate (104.0 g) was added to the obtained solution and the mixture was stirred at room temperature for 18 hours. Then, the reaction solution was filtered and the filtrate was concentrated. Ethyl acetate and hexane were added to the obtained crude product, and the mixture was separated and washed with an aqueous ammonium chloride solution and ion exchange water. The obtained organic layer was dried over sodium sulfate and filtered, and the filtrate was concentrated to obtain 124.5 g of X1-B (yield: 97%).

$^1$H-NMR, 400 MHz, δ ((CDCl$_3$) ppm: 1.46 (9H, s), 2.71-2.79 (4H, m), 4.47 (2H, s), 5.64 (1H, s), 6.35 (1H, s)

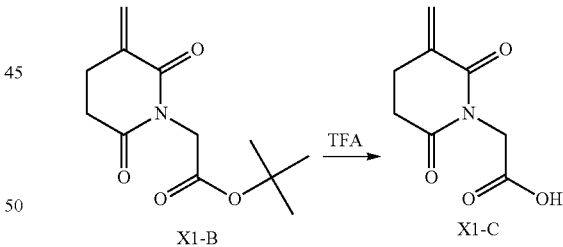

Di-tert-butylhydroxytoluene (0.01 g) was added to trifluoroacetic acid (TFA) (220.0 g), and the obtained solution was cooled to 0° C. and stirred. X1-B (109.0 g) was added to the obtained reaction solution, the temperature was raised to 40° C., and the mixture was stirred for 3 hours. Then, trifluoroacetic acid was evaporated from the reaction solution to obtain a crude product. The crude product obtained was added to a mixture of hexane and ethyl acetate, the mixture was stirred for 15 minutes, and then the obtained solid was collected by filtration to obtain 72.2 g of X1-C (yield: 87%).

$^1$H-NMR, 400 MHz, δ ((CDCl$_3$) ppm: 2.72-2.81 (4H, m), 4.62 (2H, s), 5.67 (1H, s), 6.37 (1H, s), 6.94 (1H, brs)

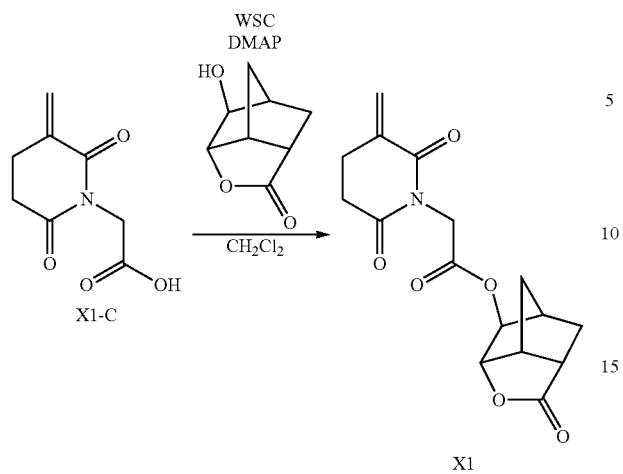

To dichloromethane (150.0 g) were added X1-C(13.7 g), 5-hydroxynorbornane 2,6-lactone (10.9 g) and DMAP (dimethylaminopyridine) (1.8 g), and the mixture was stirred at 0° C. Then, water-soluble carbodiimide (WSC) (specifically 1-(3-dimethylaminopropyl)-3-ethylcarbodiimide hydrochloride) (17.3 g) was added to the obtained solution. Next, the obtained solution was heated to room temperature and stirred for 3 hours. Then, an aqueous ammonium chloride solution was added to the obtained reaction solution and the mixture was extracted twice with methylene chloride. The combined organic layer was subjected to liquid-separation purification in the order of an aqueous ammonium chloride solution, an aqueous sodium hydrogen carbonate solution, and ion exchange water. The purified solution was dried over sodium sulfate and filtered, and the filtrate was concentrated to obtain 14.4 g of a monomer X1 (yield: 63.7%).

$^1$H-NMR, 400 MHz, δ ((CDCl$_3$) ppm: 1.69 (2H, dd), 1.98-2.08 (2H, m), 2.54-2.58 (2H, m), 2.74-2.80 (4H, m), 3.21 (1H, t), 4.55-4.62 (4H, m), 5.68 (1H, s), 6.36 (1H, s)

Synthesis Example: Synthesis of Raw Material Monomers X2 to X12

Raw material monomers X2 to X12 were synthesized according to the above-mentioned method for the raw material monomer XL.

Synthesis Examples of Resins

Synthesis Example: Synthesis of Resin A-1

Under a nitrogen stream, 42.91 parts by mass of cyclohexanone was heated to 80° C. While stirring this liquid, a mixed solution of 6.67 parts by mass of a monomer represented by Structural Formula D-1, 3.19 parts by mass of a monomer represented by Structural Formula D-2, 11.78 parts by mass of a monomer represented by Structural Formula E-1, 79.70 parts by mass of cyclohexanone, and 1.73 parts by mass of dimethyl 2,2'-azobisisobutyrate [V-601, manufactured by FUJIFILM Wako Pure Chemical Corporation] was added dropwise thereto over 4 hours. After the completion of dropwise addition, the mixture was further stirred at 80° C. for 2 hours. The reaction solution after stirring was left to be cooled, then reprecipitated with a large amount of methanol/water (mass ratio: 9:1), and filtered, and the obtained solid was vacuum-dried to obtain 16.68 parts by mass of a resin A-1 which is an acid-decomposable resin.

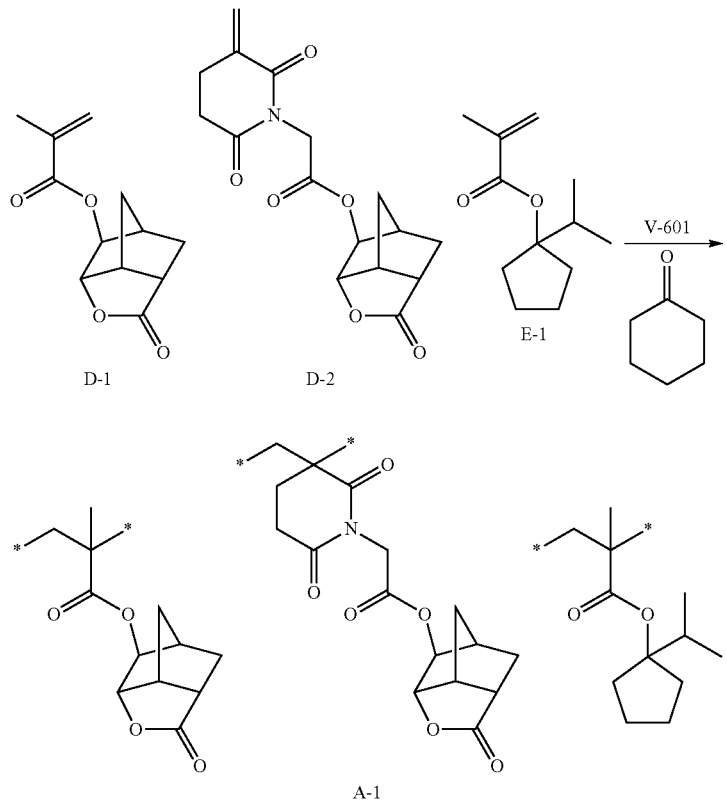

The weight-average molecular weight (Mw: in terms of polystyrene) and the dispersity, determined from GPC (developing solvent: tetrahydrofuran) of the obtained resin A-1, were Mw=9,000 and Mw/Mn=1.62, respectively. The compositional ratio (molar ratio; corresponding in order from the left) measured by a $^{13}$C-nuclear magnetic resonance method (NMR) was 30/10/60.

Synthesis Example: Synthesis of Resin A-2 to Resin A-12 and Resin B-1 for Comparative Example By performing the same operation as for the resin A-I, resins A-2 to A-12, which are acid-decomposable resins, and a resin B-1 for Comparative Example were synthesized. Furthermore, the weight-average molecular weight and the dispersity of the resins A-2 to A-12 and the resin B-1 for Comparative Example were measured by the same method as for the resin A-1.

The compositional ratios (molar ratios), the weight-average molecular weights (Mw), and the dispersities (Mw/Mn) of the respective resins are shown in Table 1. The compositional ratios correspond to the respective repeating units in order from the left.

TABLE 1

| Resin No. | Compositional ratio (% by mole) | Weight-average molecular weight | Dispersity |
|---|---|---|---|
| A-1 | 30/10/60 | 9,000 | 1.62 |
| A-2 | 50/50 | 9,500 | 1.61 |
| A-3 | 20/15/65 | 8,500 | 1.61 |
| A-4 | 30/50/20 | 10,000 | 1.63 |
| A-5 | 10/20/70 | 20,000 | 1.67 |
| A-6 | 50/30/20 | 8,000 | 1.64 |
| A-7 | 20/20/60 | 9,500 | 1.62 |
| A-8 | 35/25/40 | 15,000 | 1.66 |
| A-9 | 30/70 | 9,000 | 1.65 |
| A-10 | 50/30/20 | 10,000 | 1.62 |
| A-11 | 20/30/50 | 15,000 | 1.65 |
| A-12 | 35/50/15 | 9,000 | 1.72 |
| B-1 | 50/50 | 9,000 | 1.63 |

<Resin A-21 to A-25 and B-11>

The resins A-21 to A-25 and the resin B-11 for Comparative Example shown in Table 4 are shown below.

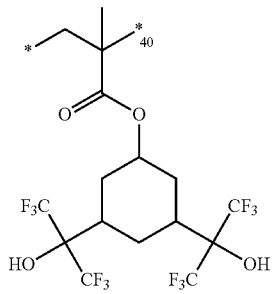

A-21

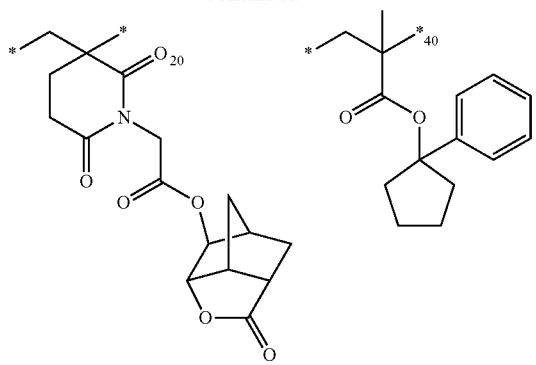

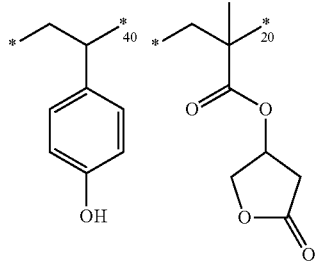

A-22

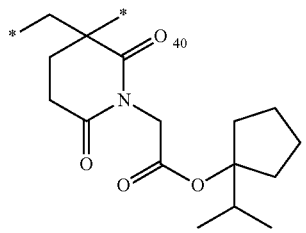

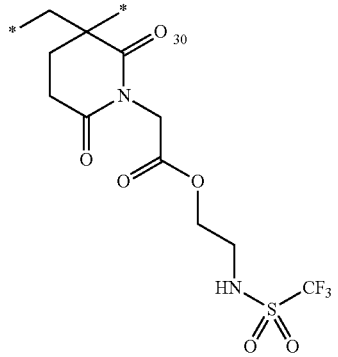

A-23

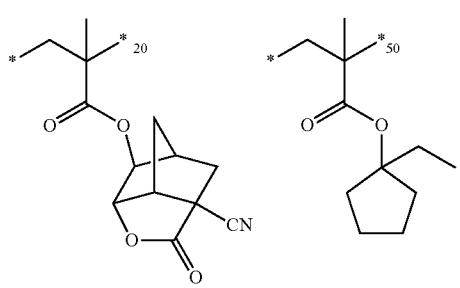

-continued

A-24
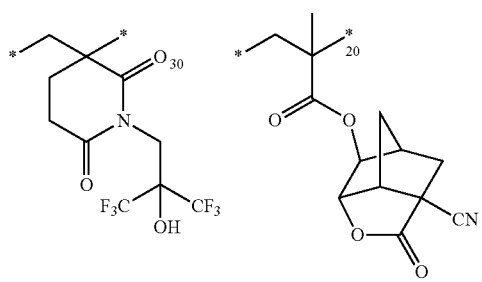

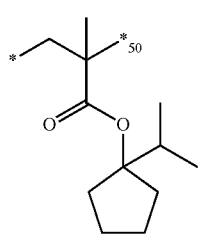

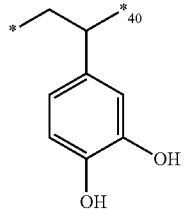

A-25
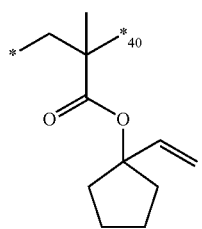

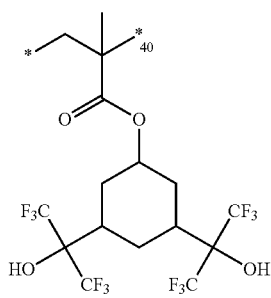

-continued

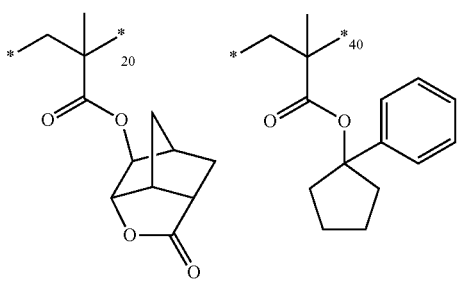

Synthesis Example: Synthesis of Resins A-21 to A-25 and Resin B-11 for Comparative Example By performing the same operation as for the resin A-1, resins A-21 to A-25, which are acid-decomposable resins, and a resin B-11 for Comparative Example were synthesized. Further, the weight-average molecular weights and the dispersities of the resin A-21 to A-25 and the resin B-11 for Comparative Example were measured in the same manner as for the resin A-1.

The compositional ratios (molar ratios), the weight-average molecular weights (Mw), and the dispersities (Mw/Mn) of the respective resins are shown in Table 2. The compositional ratios correspond to the respective repeating units in order from the left.

TABLE 2

| Resin No. | Compositional ratio (% by mole) | Weight-average molecular weight | Dispersity |
|---|---|---|---|
| A-21 | 40/20/40 | 8,000 | 1.55 |
| A-22 | 40/20/40 | 10,000 | 1.62 |
| A-23 | 30/20/50 | 9,000 | 1.61 |
| A-24 | 30/20/50 | 15,000 | 1.66 |
| A-25 | 40/20/40 | 8,500 | 1.59 |
| B-11 | 40/20/40 | 8,000 | 1.58 |

[Photoacid Generator]

The photoacid generators shown in Table 3 and Table 4 are shown below.

B-11

PAG-1
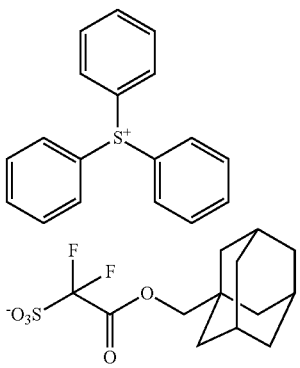

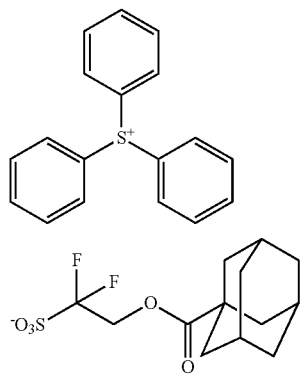
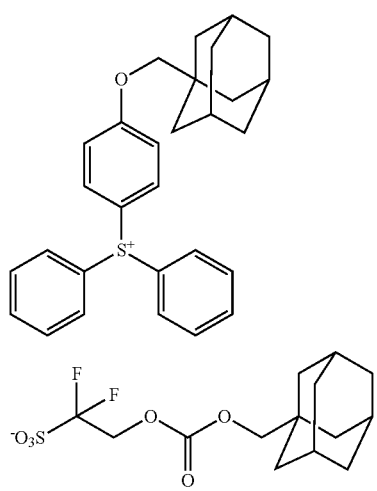
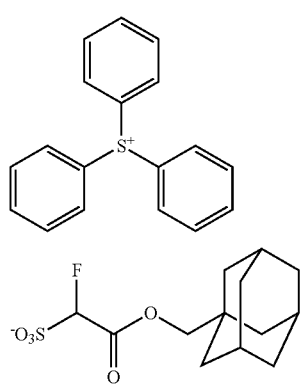
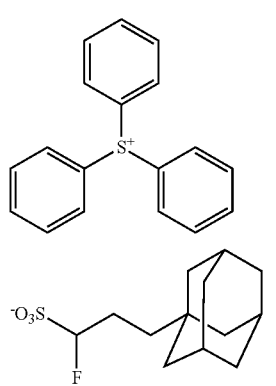
PAG-2
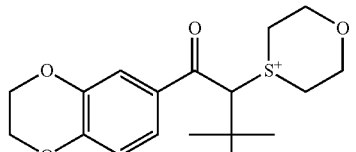
PAG-3
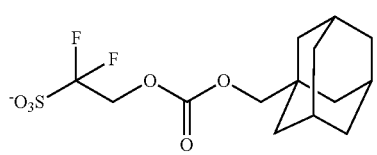
PAG-4
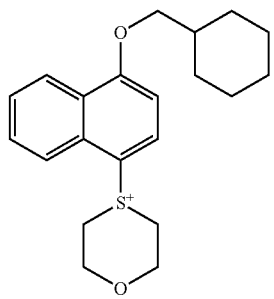
PAG-5
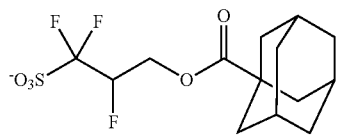
PAG-6
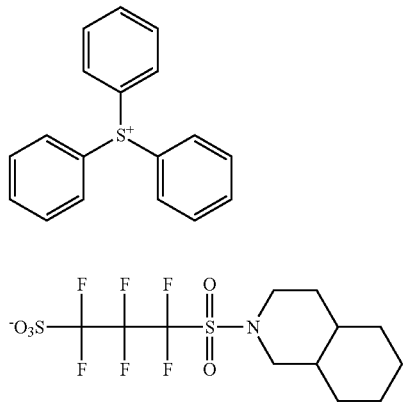
PAG-7
PAG-8
PAG-9
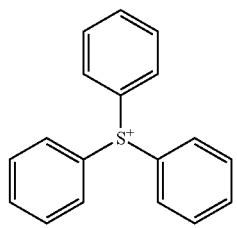

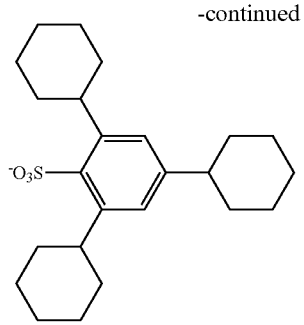
[Acid Diffusion Control Agent (Basic Compound)]
The acid diffusion control agents (basic compounds) shown in Table 3 and Table 4 are shown below.
N-1
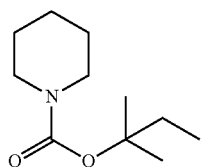
N-2
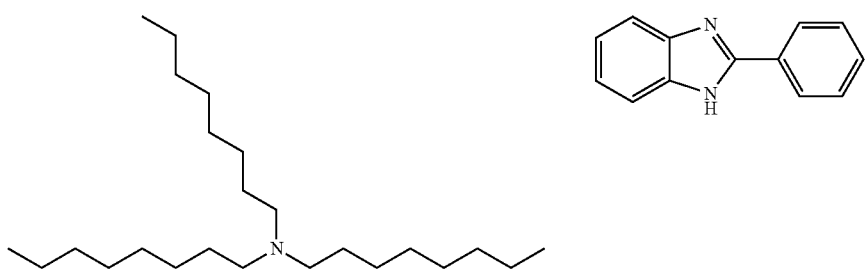
N-3
N-4
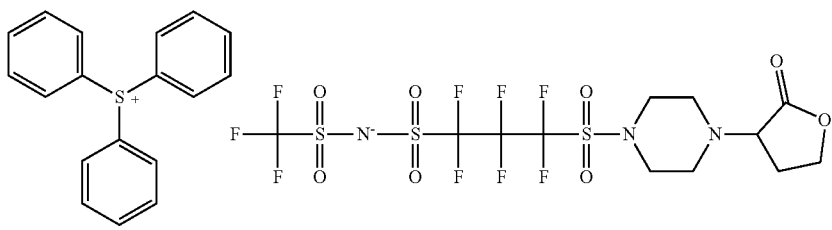
N-5
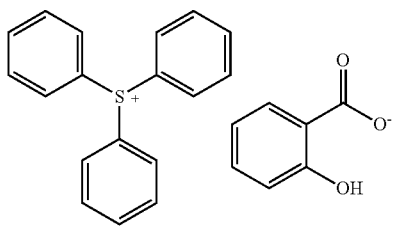
N-6

[Hydrophobic Resin]

The hydrophobic resins shown in Table 3 and Table 4 are shown below. In addition, the numerical values in the following formulae represent % by mole of the respective repeating units.

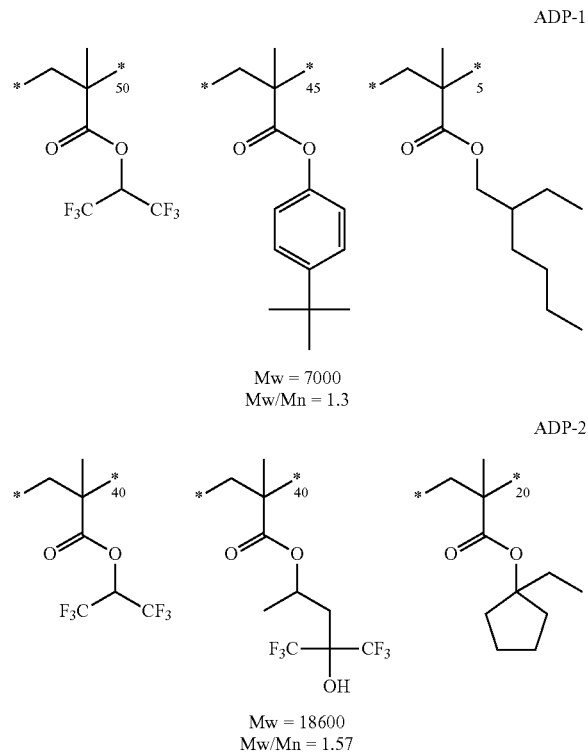

Mw = 7000
Mw/Mn = 1.3

Mw = 18600
Mw/Mn = 1.57

[Solvent]

The solvents shown in Table 3 and Table 4 are shown below.

SL-1: Propylene glycol monomethyl ether acetate (PGMEA)

SL-2: Propylene glycol monomethyl ether (PGME)

SL-3: Cyclohexanone

SL-4: γ-Butyrolactone

[Surfactant]

The surfactants shown in Table 3 and Table 4 are shown below.

W-1: PolyFox PF-6320 (manufactured by OMNOVA Solutions Inc.; fluorine-based)

[Pattern Formation and Evaluation (ArF Exposure)]
[Preparation of Resist Composition]

The respective components shown in Table 3 were dissolved in a solvent such that the composition shown in Table 3 was obtained, thereby preparing a solution having a concentration of solid contents of 3.8% by mass. Then, the obtained solution was filtered through a polyethylene filter having a pore size of 0.1 μm to prepare an actinic ray-sensitive or radiation-sensitive resin composition (hereinafter also referred to as a "resist composition"). In addition, in the resist composition, the solid content means all the components excluding the solvent. The obtained resist composition was used in Examples and Comparative Examples.

In addition, in Table 3, in the "Photoacid generator" column and the "Acid diffusion control agent" column, numerical values in parentheses mean blending amounts (g).

[Resist Pattern Forming Method]

A composition for forming an organic antireflection film ARC29SR (manufactured by Nissan Chemical Industries, Ltd.) was applied onto a silicon wafer and baked at 205° C. for 60 seconds to form an antireflection film having a film thickness of 95 nm. A resist composition was applied onto the obtained antireflection film and baked (PB: prebaking) at 100° C. for 60 seconds to form a resist film having a film thickness of 85 nm.

The obtained wafer was exposed through a 6% halftone mask having a 1:1 line-and-space pattern with a line width of 44 nm by using an ArF excimer laser liquid immersion scanner (XT1700i, manufactured by ASML, NA 1.20, C-Quad, outer sigma: 0.900, inner sigma: 0.812, XY deflection). Ultrapure water was used as the immersion liquid. Then, the wafer was baked at 105° C. for 60 seconds (PEB: post-exposure baking). Thereafter, the wafer was developed by puddling with a negative tone developer (butyl acetate) or a positive tone developer (aqueous tetramethylammonium hydroxide (TMAH) solution, 2.38% by mass) for 30 seconds, and the wafer was rotated at a rotation speed of 4,000 rpm for 30 seconds to form a 1:1 line-and-space pattern with a line width of 44 nm.

[Evaluation of Exposure Latitude (EL)]

An exposure dose for reproducing a 1:1 line-and-space mask pattern having a line width of 44 nm was determined, and this was defined as an optimum exposure dose Eopt.

Next, an exposure dose at which the line width of the line was ±10% of the target value of 44 nm (that is, 39.6 nm and 48.4 nm) was determined.

An exposure latitude (EL) defined by the following equation was calculated using the obtained exposure dose value.

EL (%)=[[(Exposure dose at which line width of line is 48.4 nm)−(Exposure dose at which line width of line is 39.6 nm)]/Eopt]×100

The larger the EL value, the smaller the change in the line width due to a change in the exposure dose, and the better the EL performance of the resist film.

The results are shown in Table 3.

TABLE 3

| | | | Formulation of resist composition | | | | | |
|---|---|---|---|---|---|---|---|---|
| | Resin (10 g) | Photoacid generator (g) | Acid diffusion control agent (g) | Hydrophobic resin (0.05 g) | Solvent (mass ratio) | Surfactant (0.03 g) | Developer | EL (%) |
| Example 1 | A-1 | PAG-1 (2.0) | N-4 (0.95) | ADP-1 | SL-1/SL-2 (70/30) | — | Butyl acetate | 16.5 |
| Example 2 | A-2 | PAG-2 (2.3) | N-6 (0.80) | ADP-1 | SL-1/SL-2 (80/20) | — | Butyl acetate | 15.4 |
| Example 3 | A-3 | PAG-5 (2.5) | N-2 (0.29) | ADP-1 | SL-1/SL-2 (80/20) | — | Butyl acetate | 16.7 |

TABLE 3-continued

| | | | Formulation of resist composition | | | | | |
|---|---|---|---|---|---|---|---|---|
| | Resin (10 g) | Photoacid generator (g) | Acid diffusion control agent (g) | Hydrophobic resin (0.05 g) | Solvent (mass ratio) | Surfactant (0.03 g) | Developer | EL (%) |
| Example 4 | A-4 | PAG-3 (2.4) | N-2 (0.29) | ADP-2 | SL-1/SL-2 (70/30) | — | Butyl acetate | 16.6 |
| Example 5 | A-5 | PAG-7 (2.3) | N-1 (0.54) | ADP-1 | SL-1/SL-2 (90/10) | — | Butyl acetate | 12.8 |
| Example 6 | A-6 | PAG-6 (2.1) | N-3 (0.30) | ADP-1 | SL-1/SL-3 (80/20) | — | Butyl acetate | 12.5 |
| Example 7 | A-1/A-3 (5 g/5 g) | PAG-4 (2.3) | N-4 (1.10) | ADP-1 | SL-1/SL-2 (80/20) | — | Butyl acetate | 16.5 |
| Example 8 | A-7 | PAG-8 (2.3) | N-5 (0.60) | ADP-2 | SL-1/SL-4 (80/20) | — | TMAH | 17.3 |
| Example 9 | A-8 | PAG-7 (2.3) | N-4 (0.35) | ADP-1 | SL-1/SL-2 (70/30) | W-1 | TMAH | 13.1 |
| Example 10 | A-9 | PAG-3 (2.4) | N-2 (0.29) | ADP-1 | SL-1 | — | TMAH | 17.2 |
| Example 11 | A-10 | PAG-4 (2.3) | N-4 (0.89) | ADP-1 | SL-1/SL-2 (70/30) | — | TMAH | 17.6 |
| Example 12 | A-11 | PAG-6 (2.1) | N-3 (0.30) | ADP-1 | SL-1/SL-2 (70/30) | — | TMAH | 16.9 |
| Example 13 | A-12 | PAG-2/PAG-3 (1.0/1.0) | N-6 (0.67) | ADP-1 | SL-1/SL-2/SL-4 (80/10/10) | — | TMAH | 12.6 |
| Example 14 | A-7/A-9 (7 g/3 g) | PAG-5 (2.0) | N-2 (0.29) | ADP-1 | SL-1/SL-2 (80/20) | — | TMAH | 17.4 |
| Comparative Example 1 | B-1 | PAG-1 (2.0) | N-4 (0.95) | ADP-1 | SL-1/SL-2 (70/30) | — | Butyl acetate | 8.9 |
| Comparative Example 2 | B-1 | PAG-1 (2.0) | N-4 (0.95) | ADP-1 | SL-1/SL-2 (70/30) | — | TMAH | 9.2 |

From the results in Table 3, it is clear that the resist compositions of Examples have excellent EL performance.

Furthermore, from the results of Examples 1 to 14, it is clear that the EL performance is more excellent in a case where $R^1$ in the repeating unit represented by General Formula (1) of the resin (A) included in the resist composition represents a substituted or unsubstituted hydrocarbon group which includes (1) a cyclic structure including a heteroatom (corresponding to the resin A-1, the resin A-4, the resin A-7, and the resin A-9) and may include a heteroatom; a substituted or unsubstituted hydrocarbon group which includes (2) a proton donating group (corresponding to the resin A-3, and the resins A-8 and A-11) and may include a heteroatom; or a substituted or unsubstituted hydrocarbon group which includes (3) a group having a proton donating group protected by a leaving group that leaves by the action of an acid (corresponding to the resin A-2 and the resin A-10), and may include a heteroatom.

Furthermore, from the comparison of Example 3, Example 9, and Example 12, it was confirmed that the EL performance is more excellent in a case where $R^1$ in the repeating unit represented by General Formula (1) of the resin (A) included in the resist composition was a substituted or unsubstituted, linear or branched hydrocarbon group which includes a proton donating group and may include a heteroatom.

On the other hand, any of the resist compositions of Comparative Examples did not satisfy desired requirements.

[Pattern Formation and Evaluation (EUV Exposure)]
[Preparation of Resist Composition]

The respective components shown in Table 4 were dissolved in a solvent such that the composition shown in Table 4 was obtained, thereby preparing a solution having a concentration of solid contents of 1.6% by mass. Then, the obtained solution was filtered through a polyethylene filter having a pore size of 0.03 m to prepare a resist composition.

In addition, in the resist composition, the solid content means all the components excluding the solvent. The obtained resist composition was used in Examples and Comparative Examples.

In addition, in Table 4, in the "Photoacid generator" column and the "Acid diffusion control agent" column, numerical values in parentheses mean blending amounts (g).

[Resist Pattern Forming Method]

The resist composition was applied onto a silicon wafer on which AL412 (manufactured by Brewer Science, Inc.) had been formed as an underlayer film, and baked (PB: prebaking) at 100° C. for 60 seconds to form a resist film having a film thickness of 30 nm.

The silicon wafer having the obtained resist film was subjected to pattern irradiation using an EUV exposure apparatus (manufactured by Exitech Ltd., Micro Exposure Tool, NA 0.3, Quadrupole, outer sigma: 0.68, and inner sigma: 0.36). In addition, a mask having a line size=20 nm and a line: space=1:1 was used as the reticle.

Then, the wafer was baked at 105° C. for 60 seconds (PEB: post-exposure baking). Then, a negative tone developer (butyl acetate) or a positive tone developer (tetramethylammonium hydroxide (TMAH) aqueous solution, 2.38% by mass) was puddle-developed for 30 seconds, and rinsed with a negative tone rinsing liquid (FIRM Extreme 10 (manufactured by AZEM)) or a positive tone rinsing liquid (pure water). Thereafter, the wafer was rotated at a rotation speed of 4,000 rpm for 30 seconds to form a 1:1 line-and-space pattern having a line width of 20 nm.

[Evaluation of Exposure Latitude (EL)]

An exposure dose for reproducing a 1:1 line-and-space mask pattern having a line width of 20 nm was determined, and this was defined as an optimum exposure dose Eopt.

Next, an exposure dose at which the line width of the line was ±10% of the target value of 20 nm (that is, 18 nm and 22 nm) was determined.

An exposure latitude (EL) defined by the following equation was calculated using the obtained exposure dose value.

EL (%)=[[(Exposure dose at which line width of line is 22 nm)−(Exposure dose at which line width of line is 18 nm)]/Eopt] x 100

The larger the EL value, the smaller the change in the line width due to a change in the exposure dose, and the better the EL performance of the resist film.

The results are shown in Table 4.

TABLE 4

| | | | Formulation of resist composition | | | | | |
|---|---|---|---|---|---|---|---|---|
| | Resin (10 g) | Photoacid generator (g) | Acid diffusion control agent (g) | Hydrophobic resin (0.05 g) | Solvent (mass ratio) | Surfactant (0.03 g) | Developer | EL (%) |
| Example 15 | A-21 | PAG-1 (2.0) | N-4 (0.95) | — | SL-1/SL-2 (70/30) | — | TMAH | 15.4 |
| Example 16 | A-22 | PAG-2 (2.3) | N-6 (0.80) | — | SL-1/SL-2/SL-4 (60/30/10) | — | TMAH | 16.5 |
| Example 17 | A-23 | PAG-5 (2.5) | N-2 (0.29) | — | SL-1/SL-2 (80/20) | W-1 | TMAH | 16.7 |
| Example 18 | A-24 | PAG-1/PAG-9 (1.2/1.2) | N-2 (0.29) | ADP-1 | SL-1/SL-2/SL-4 (60/30/10) | — | TMAH | 16.6 |
| Example 19 | A-25 | PAG-7 (2.3) | N-1 (0.54) | — | SL-1/SL-2/SL-3 (60/30/10) | — | Butyl acetate | 16.2 |
| Example 20 | A-21/A-23 (5 g/5 g) | PAG-4 (2.3) | N-4 (1.10) | — | SL-1/SL-2/SL-4 (60/30/10) | — | TMAH | 16.5 |
| Comparative Example 3 | B-11 | PAG-1 (2.0) | N-4 (0.95) | — | SL-1/SL-2 (70/30) | — | TMAH | 9.3 |

From the results in Table 4, it is clear that the resist compositions of Examples have excellent EL performance.

On the other hand, any of the resist compositions of Comparative Examples did not satisfy desired requirements.

What is claimed is:

1. An actinic ray-sensitive or radiation-sensitive resin composition comprising a resin including a repeating unit represented by General Formula (1) and capable of increasing a polarity by an action of an acid,

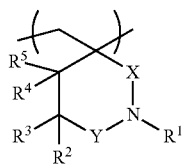

(1)

in General Formula (1), X represents —SO$_2$—, —SO—, or —CS—, Y represents a divalent linking group, R$^1$ represents a monovalent organic group, and R$^2$ to R$^5$ each independently represent a hydrogen atom or a monovalent organic group.

2. The actinic ray-sensitive or radiation-sensitive resin composition according to claim 1,
wherein the resin is a resin including the repeating unit represented by General Formula (1) and a repeating unit having an acid-decomposable group, or
a resin including the repeating unit represented by General Formula (1) where R$^1$ represents a monovalent organic group including an acid-decomposable group.

3. The actinic ray-sensitive or radiation-sensitive resin composition according to claim 1,
wherein Y represents a substituted or unsubstituted alkylene group, —CO—, —SO$_2$—, —SO—, or —CS—.

4. The actinic ray-sensitive or radiation-sensitive resin composition according to claim 1,
wherein R$^1$ represents a substituted or unsubstituted hydrocarbon group including a heteroatom.

5. The actinic ray-sensitive or radiation-sensitive resin composition according to claim 1,
wherein R$^1$ represents a substituted or unsubstituted hydrocarbon group which includes a cyclic structure including a heteroatom and may include a heteroatom,
a substituted or unsubstituted hydrocarbon group which includes a proton donating group and may include a heteroatom, or
a substituted or unsubstituted hydrocarbon group which includes a group having a proton donating group protected by a leaving group that leaves by an action of an acid, and may include a heteroatom.

6. The actinic ray-sensitive or radiation-sensitive resin composition according to claim 5,
wherein the cyclic structure including a heteroatom represents a substituted or unsubstituted lactone structure, a substituted or unsubstituted sultone structure, or a substituted or unsubstituted cyclic carbonate structure, and
the proton donating group represents a sulfonamido group, a carboxyl group, or a hydroxyl group.

7. The actinic ray-sensitive or radiation-sensitive resin composition according to claim 5,
wherein the substituted or unsubstituted hydrocarbon group which includes a proton donating group and may include a heteroatom represents a linear or branched, substituted or unsubstituted hydrocarbon group which includes a proton donating group and may include a heteroatom.

8. The actinic ray-sensitive or radiation-sensitive resin composition according to claim 1,
wherein the resin further includes a repeating unit having a polar group.

9. The actinic ray-sensitive or radiation-sensitive resin composition according to claim 1, further comprising a photoacid generator.

10. A resist film formed using the actinic ray-sensitive or radiation-sensitive resin composition according to claim 1.

11. A pattern forming method comprising:
forming a resist film using the actinic ray-sensitive or radiation-sensitive resin composition according to claim 1;
exposing the resist film; and
developing the exposed resist film using a developer.

12. A method for manufacturing an electronic device, comprising the pattern forming method according to claim 11.

13. A resin including a repeating unit represented by General Formula (1) and capable of increasing a polarity by an action of an acid,

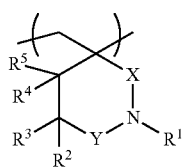

(1)

in General Formula (1), X represents —SO$_2$—, —SO—, or —CS—, Y represents a divalent linking group, R$^1$ represents a monovalent organic group, and R$^2$ to R$^5$ each independently represent a hydrogen atom or a monovalent organic group.

14. The resin according to claim 13,
wherein the resin is a resin including the repeating unit represented by General Formula (1) and a repeating unit having an acid-decomposable group, or
a resin including the repeating unit represented by General Formula (1) where R$^1$ represents a monovalent organic group including an acid-decomposable group.

15. The resin according to claim 13,
wherein
Y represents a substituted or unsubstituted alkylene group, —CO—, —SO$_2$—, —SO—, or —CS—.

16. The resin according to claim 13,
wherein R$^1$ represents a substituted or unsubstituted hydrocarbon group including a heteroatom.

17. The resin according to claim 13,
wherein R$^1$ represents a substituted or unsubstituted hydrocarbon group which includes a cyclic structure including a heteroatom and may include a heteroatom,
a substituted or unsubstituted hydrocarbon group which includes a proton donating group and may include a heteroatom, or
a substituted or unsubstituted hydrocarbon group which includes a group having a proton donating group protected by a leaving group that leaves by an action of an acid, and may include a heteroatom.

18. The resin according to claim 17,
wherein the cyclic structure including a heteroatom represents a substituted or unsubstituted lactone structure, a substituted or unsubstituted sultone structure, or a substituted or unsubstituted cyclic carbonate structure, and
the proton donating group represents a sulfonamido group, a carboxyl group, or a hydroxyl group.

19. The resin according to claim 17,
wherein the substituted or unsubstituted hydrocarbon group which includes a proton donating group and may include a heteroatom represents a linear or branched, substituted or unsubstituted hydrocarbon group which includes a proton donating group and may include a heteroatom.

20. The resin according to claim 13, further comprising a repeating unit having a polar group.

* * * * *